US010050408B2

(12) United States Patent
Suzuki et al.

(10) Patent No.: US 10,050,408 B2
(45) Date of Patent: Aug. 14, 2018

(54) LASER SYSTEM

(71) Applicant: Gigaphoton Inc., Tochigi (JP)

(72) Inventors: Akiyoshi Suzuki, Oyama (JP); Osamu Wakabayashi, Oyama (JP); Masaki Arakawa, Oyama (JP); Koji Ashikawa, Oyama (JP); Yasuhiro Kamba, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/379,192

(22) Filed: Dec. 14, 2016

(65) Prior Publication Data

US 2017/0093119 A1 Mar. 30, 2017

Related U.S. Application Data

(63) Continuation of application No. PCT/JP2014/068581, filed on Jul. 11, 2014.

(51) Int. Cl.
*H01S 3/23* (2006.01)
*H01S 3/081* (2006.01)
*H01S 3/00* (2006.01)
*G02B 27/12* (2006.01)
*G02B 27/10* (2006.01)
*H01L 21/67* (2006.01)
(Continued)

(52) U.S. Cl.
CPC ............ *H01S 3/23* (2013.01); *B23K 26/0066* (2013.01); *G02B 27/106* (2013.01); *G02B 27/123* (2013.01); *G02B 27/126* (2013.01); *H01L 21/02532* (2013.01); *H01L 21/02592* (2013.01); *H01L 21/02686* (2013.01); *H01L 21/67115* (2013.01); *H01L 27/1285* (2013.01); *H01S 3/0071* (2013.01); *H01S 3/081* (2013.01)

(58) Field of Classification Search
CPC ....... H01S 3/23; H01S 3/0071; G02B 27/106; H01L 21/02686; H01L 21/02592; H01L 21/02532
See application file for complete search history.

(56) References Cited

U.S. PATENT DOCUMENTS 6,099,521 A * 8/2000 Shadduck ........... A61F 9/00802
606/4
7,061,959 B2 6/2006 Partlo et al.
(Continued)

FOREIGN PATENT DOCUMENTS

JP 2005-294493 A 10/2005
JP 2012-227353 A 11/2012

OTHER PUBLICATIONS

International Search Report issued in PCT/JP2014/068581; dated Oct. 21, 2014.

*Primary Examiner* — Dung Nguyen
(74) *Attorney, Agent, or Firm* — Studebaker & Brackett PC

(57) ABSTRACT

A laser system may include a plurality of laser apparatuses, a beam delivery device configured to bundle pulse laser beams emitted from respective laser apparatuses of the plurality of laser apparatuses to emit a bundled laser beam, and a controller configured to control operated laser apparatuses of the plurality of laser apparatuses such that, at a change in a number representing how many laser apparatuses are operated, a beam parameter of the bundled laser beam emitted from the beam delivery device approaches a beam parameter of the bundled laser beam emitted before the change.

21 Claims, 39 Drawing Sheets

(51) Int. Cl.
  *H01L 21/02*  (2006.01)
  *H01L 27/12*  (2006.01)
  *B23K 26/00*  (2014.01)

(56) References Cited

U.S. PATENT DOCUMENTS

| | | |
|---|---|---|
| 8,416,500 B2 | 4/2013 | Mitra et al. |
| 2009/0285076 A1 | 11/2009 | Rothenberg |
| 2012/0269217 A1 | 10/2012 | Senda |

* cited by examiner

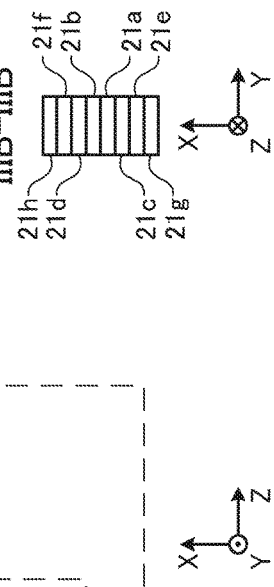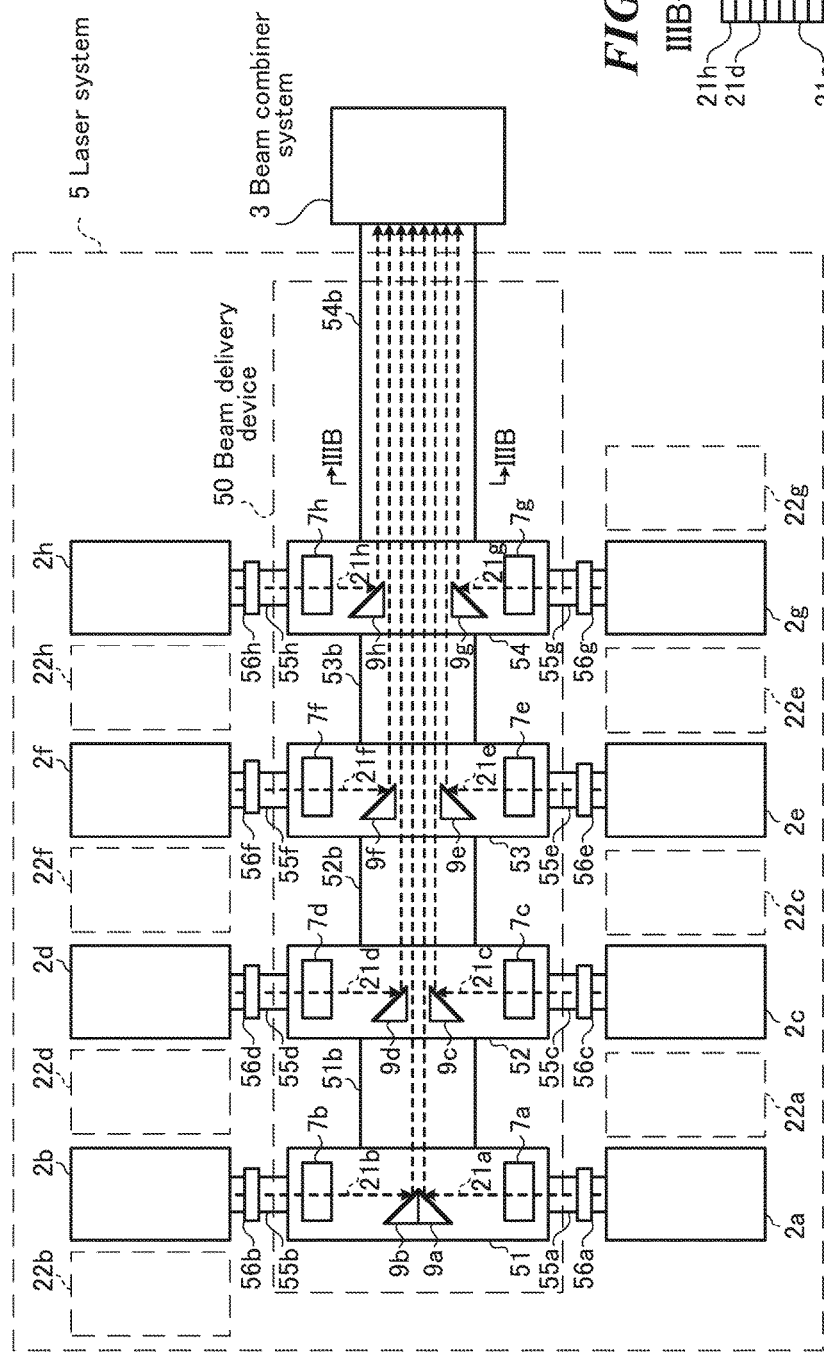

LASER SYSTEM

TECHNICAL FIELD

The present disclosure relates to a laser system.

BACKGROUND ART

A laser annealing apparatus may apply a pulse laser beam on an amorphous silicon film formed on a substrate. The pulse laser beam may be emitted from a laser system such as an excimer laser system. The pulse laser beam may have a wavelength of ultraviolet light region. Such pulse laser beam may reform the amorphous silicon film to a poly-silicon film. The poly-silicon film can be used to form thin film transistors (TFTs). The TFTs may be used in large-sized liquid crystal displays.

SUMMARY

A laser system according to one aspect of the present disclosure may include a plurality of laser apparatuses, a beam delivery device configured to bundle pulse laser beams emitted from respective laser apparatuses of the plurality of laser apparatuses to emit a bundled laser beam, and a controller configured to control operated laser apparatuses of the plurality of laser apparatuses such that, at a change in a number representing how many laser apparatuses are operated, a beam parameter of the bundled laser beam emitted from the beam delivery device approaches a beam parameter of the bundled laser beam emitted before the change.

A laser system according to another aspect of the present disclosure may include a plurality of laser apparatuses, a beam delivery device configured to bundle pulse laser beams emitted from respective laser apparatuses of the plurality of laser apparatuses, and a controller configured to control operated laser apparatuses of the plurality of laser apparatuses such that, at a decrease in a number representing how many laser apparatuses are operated, energy of the pulse laser beam emitted from each of the operated laser apparatuses increases.

A laser system according to another aspect of the present disclosure may include a plurality of laser apparatuses, a beam delivery device configured to bundle pulse laser beams emitted from respective laser apparatuses of the plurality of laser apparatuses to emit a bundled laser beam, and a controller configured to control operated laser apparatuses of the plurality of laser apparatuses such that, at a decrease in a number representing how many laser apparatuses are operated, a time interval between the pulse laser beams emitted from respective operated laser apparatuses increase from a first time interval to a second time interval longer than the first time interval.

A laser system according to another aspect of the present disclosure may include a plurality of laser apparatuses including first, second, and third laser apparatuses configured to emit first, second, and third pulse laser beams, respectively, a beam delivery device configured to bundle the first, second, and third pulse laser beams, to emit a bundled laser beam in which an optical path of the second pulse laser beam is between an optical path of the first pulse laser beam and an optical path of the third pulse laser beam, and a controller configured to control the first, second, and third laser apparatuses and to control the beam delivery device such that, at suspending operation of the second laser apparatus, at least one of the optical path of the first pulse laser beam and the optical path of the third pulse laser beam emitted from the beam delivery device approaches the other one.

A laser system according to another aspect of the present disclosure may include a plurality of laser apparatuses including first and second laser apparatuses configured to emit first and second pulse laser beams, respectively, a beam delivery device including first and second mirrors, the first mirror being configured to reflect the first pulse laser beam to a first direction, the second mirror being provided in vicinity of an optical path of the first pulse laser beam reflected by the first mirror, the second mirror being configured to reflect the second pulse laser beam to a direction substantially parallel to the first direction, the first and second mirrors thus being configured to bundle the first and second pulse laser beams to emit a bundled laser beam, and a controller configured to control the first and second laser apparatuses and to control the beam delivery device such that, at suspending operation of the second laser apparatus, the second mirror moves away from the optical path of the first pulse laser beam reflected by the first mirror.

A laser system according to another aspect of the present disclosure may include a plurality of laser apparatuses, a beam delivery device configured to bundle pulse laser beams emitted from respective laser apparatuses of the plurality of laser apparatuses to emit a bundled laser beam, and a controller configured to receive input of a target beam parameter, determine a number representing how many laser apparatuses of the plurality of laser apparatuses are to be operated based on the target beam parameter, and control the laser apparatuses to be operated.

BRIEF DESCRIPTION OF DRAWINGS

Exemplary embodiments of the present disclosure will be described below with reference to the appended drawings.

FIG. 2A schematically shows a configuration of a laser system used in an embodiment of the present disclosure.

FIG. 2B shows a cross section of first to sixth pulse laser beams 21a to 21f at a line IIB-IIB in FIG. 2A.

FIG. 3A schematically shows a configuration of a laser system according to a first embodiment of the present disclosure.

FIG. 3B shows a cross section of the first to eighth pulse laser beams 21a to 21h at a line IIIB-IIIB in FIG. 3A.

DESCRIPTION OF EMBODIMENTS

Figure 1:
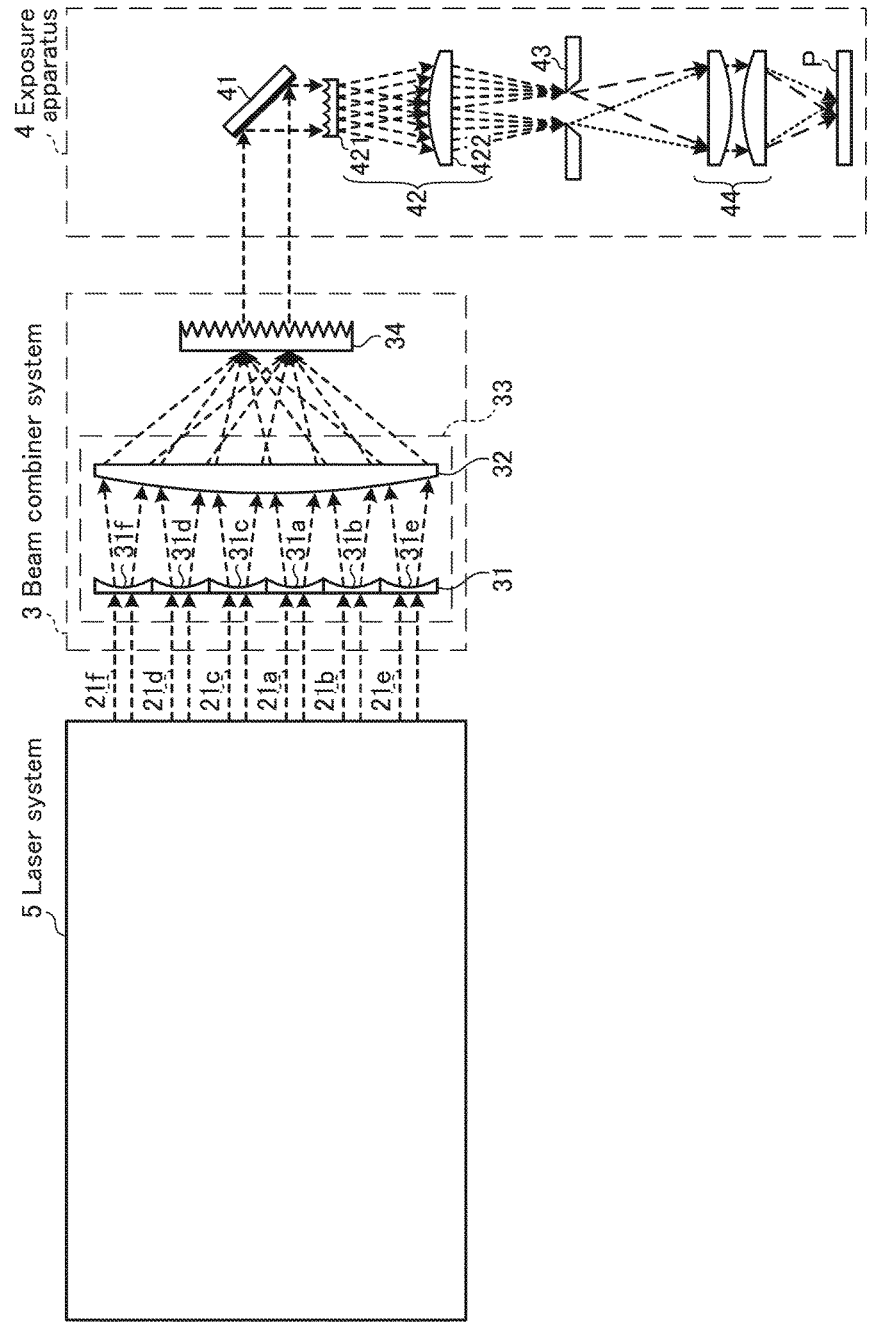
FIG. 1 schematically shows a configuration of a laser annealing apparatus 1 including an exemplary laser system 5.

Contents
1. Outline
2. Overall Description of Laser Annealing Apparatus
   2.1 Laser System
   2.2 Beam Combiner System
   2.3 Exposure Apparatus
3. Laser System
   3.1 Plurality of Laser Apparatuses
   3.2 Beam Delivery Device
4. First Embodiment
   4.1 Configuration
   4.2 Controlling Operation
   4.3 Setting Target Pulse Energy and Oscillation Trigger Timing
5. Second Embodiment
   5.1 Controlling Operation
   5.2 Setting Target Pulse Energy and Oscillation Trigger Timing 6. Third Embodiment
    6.1 Overall Configuration
    6.2 Beam Parameter Measuring Device
    6.3 Mirror-Moving Mechanism
    6.4 Controlling Operation
    6.5 Setting Target Pulse Energy
    6.6 Setting Oscillation Trigger Timing
    6.7 Setting Beam Position
7. Fourth Embodiment
    7.1 Overall Configuration
    7.2 Controlling Operation
    7.3 Setting Target Pulse Energy and Oscillation Trigger Timing
8. Fifth Embodiment
    8.1 Overall Configuration
    8.2 Controlling Operation.
    8.3 Setting Target Pulse Energy, Oscillation Trigger Timing, and Beam Position
9. Sixth Embodiment
10. Seventh Embodiment
11. Laser Apparatus
12. Optical Path Length Adjuster
13. Beam Divergence Adjuster
14. Beam Combiner Including Fly Eye Lens
15. Configuration of Controller Embodiments of the present disclosure will be described below in detail with reference to the drawings. The embodiments described below may represent several examples of the present disclosure, and may not intend to limit the content of the present disclosure. Not all of the configurations and operations described in the embodiments are indispensable in the present disclosure. Identical reference symbols may be assigned to identical elements and redundant descriptions may be omitted.

1. Outline

A laser annealing apparatus may perform laser annealing by irradiating an amorphous silicon film on a glass substrate with a pulse laser beam. The pulse laser beam may be demanded to increase its energy per one pulse for enlarging irradiation area at predetermined energy density to manufacture larger and larger liquid crystal displays as in recent years. Increasing energy per one pulse may be achieved by bundling pulse laser beams emitted from respective laser apparatuses in a laser system to form a bundled laser beam. The bundled laser beam may be applied to the amorphous silicon film.

However, one of the laser apparatuses may happen to suspend its operation due to trouble or maintenance. In the case where the bundled laser beam is made by the pulse laser beams emitted from the respective laser apparatuses, suspending operation of one of the laser apparatuses may cause the laser system to stop as a whole.

According one aspect of the present disclosure, when the number of operated laser apparatuses changes, the operated laser apparatuses may be controlled such that beam parameters of the bundled laser beam approaches beam parameters of the bundled laser beam emitted before changing the number of the operated laser apparatuses. This may allow emitting a desirable pulse laser beam even when the number of the operated laser apparatuses changes. Also, time lost by stopping the laser system as a whole may be reduced.

2. Overall Description of Laser Annealing Apparatus

FIG. 1 schematically shows a configuration of a laser annealing apparatus 1 including an exemplary laser system 5. The laser annealing apparatus 1 may include the laser system 5, a beam combiner system 3, and an exposure apparatus 4.

2.1 Laser System

The laser system 5 may bundle pulse laser beams emitted from respective laser apparatuses explained below and emit the bundled laser beam including first to sixth pulse laser beams 21a to 21f. The first to sixth pulse laser beams 21a to 21f emitted from the laser system 5 may have optical path axes substantially parallel to each other. The "optical path axis" of the pulse laser beam may be a central axis of the optical path of the pulse laser beam.

2.2 Beam Combiner System

The beam combiner system 3 may include incident optics 33 and a beam combiner 34.

The incident optics 33 may include secondary light source optics 31 and condenser optics 32, being designed to constitute a Koehler illumination.

The secondary light source optics 31 may include first to sixth concave lenses 31a to 31f.

The first concave lens 31a may be provided between the laser system 5 and the condenser optics 32 in the optical path of the first pulse laser beam 21a. The first concave lens 31a may transmit the first pulse laser beam 21a toward the condenser optics 32. The first concave lens 31a may expand beam width of the first pulse laser beam 21a.

The first to sixth concave lenses 31a to 31f may have substantially the same configurations with each other.

The second concave lens 31b may be provided in the optical path of the second pulse laser beam 21b.

The third concave lens 31c may be provided in the optical path of the third pulse laser beam 21c.

The fourth concave lens 31d may be provided in the optical path of the fourth pulse laser beam 21d.

The fifth concave lens 31e may be provided in the optical path of the fifth pulse laser beam 21e.

The sixth concave lens 31f may be provided in the optical path of the sixth pulse laser beam 21f.

The first to sixth pulse laser beams 21a to 21f entering the first to sixth concave lenses 31a to 31f, respectively, may have substantially the same beam sizes and substantially the same beam divergences with each other.

The optical path axes of the first to sixth pulse laser beams 21a to 21f transmitted by the first to sixth concave lenses 31a to 31f, respectively, may be substantially parallel to each other.

The condenser optics 32 may be arranged such that, as explained below, the first to sixth pulse laser beams 21a to 21f may be made incident on substantially the same portion of a light-receiving surface of the beam combiner 34 at respective predetermined incident angles.

The condenser optics 32 may extend over the cross sections of the optical paths of the first to sixth pulse laser beams 21a to 21f at a position between the secondary light source optics 31 and the beam combiner 34. The condenser optics 32 may transmit the first to sixth pulse laser beams 21a to 21f toward the beam combiner 34. The condenser optics 32 may change respective directions of the optical path axes of the first to sixth pulse laser beams 21a to 21f to respective predetermined directions.

The condenser optics 32 may be provided such that a front-side focal plane of the condenser optics 32 substantially coincides with respective focal positions of the first to sixth concave lenses 31a to 31f. The condenser optics 32 may thus collimate each of the first to sixth pulse laser beams 21a to 21f transmitted by the first to sixth concave lenses 31a to 31f, respectively, such that each of the beams has substantially parallel rays.

The condenser optics 32 may be provided such that a rear-side focal plane of the condenser optics 32 substantially coincides with the light-receiving surface of the beam combiner 34. Thus, the condenser optics 32 may make the first to sixth pulse laser beams 21a to 21f be incident on substantially the same portion of the beam combiner 34 at respective predetermined incident angles.

FIG. 1 shows that the condenser optics 32 may include a single convex lens. However, the condenser optics 32 may include a combination of the convex lens and another convex or concave lens (not shown), or include a concave mirror (not shown).

The beam combiner 34 may include a diffractive optical element (DOE). The diffractive optical element may be constituted by an ultraviolet-transmitting substrate, such as a synthetic quartz substrate or a calcium fluoride substrate, on which multiple grooves each having a predetermined shape are formed at a predetermined interval.

The first to sixth pulse laser beams 21a to 21f, which were changed their directions of the optical path axes by the condenser optics 32 to the respective predetermined directions, may enter the beam combiner 34. The first to sixth pulse laser beams 21a to 21f, which entered the beam combiner 34, may be emitted from the beam combiner 34 to directions substantially the same with each other. The above-mentioned respective predetermined directions may be designed such that the first to sixth pulse laser beams 21a to 21f are combined by the beam combiner 34. Such beam combiner 34 may be a diffractive optical element, for example, disclosed in U.S. Patent Application Publication No. 2009/0285076.

The first to sixth pulse laser beams 21a to 21f emitted from the beam combiner 34 may travel through substantially the same optical paths to enter the exposure apparatus 4.

The first to sixth pulse laser beams 21a to 21f may thus be combined by the beam combiner system 3. In the following description, a pulse laser beam formed by combining pulse laser beams may be referred to as a "combined laser beam". The combined laser beam may include the first to sixth pulse laser beams 21a to 21f. The total pulse energy of the combined laser beam may be approximately six times of the pulse energy of the pulse laser beam emitted from a single laser apparatus. "Combining" pulse laser beams may include making first and second pulse laser beams share a common optical path.

2.3 Exposure Apparatus

The exposure apparatus 4 may include a high-reflective mirror 41, illumination optics 42, a mask 43, and transfer optics 44. The exposure apparatus 4 may apply the combined laser beam, which is emitted from the beam combiner system 3, to an irradiation object P according to a predetermined mask pattern.

The high-reflective mirror 41 may be provided in an optical path of the pulse laser beam emitted from the laser system 5. The high-reflective mirror 41 may reflect the combined laser beam emitted from the beam combiner system 3 to make the combined laser beam enter the illumination optics 42. The combined laser beam entering the illumination optics 42 may have substantially parallel rays.

The illumination optics 42 may be provided between the high-reflective mirror 41 and the mask 43 in the optical path of the combined laser beam emitted from the beam combiner system 3. The illumination optics 42 may include a fly eye lens 421 and condenser optics 422, being designed to constitute a Koehler illumination.

The fly eye lens 421 may be provided between the high-reflective mirror 41 and the condenser optics 422 in the optical path of the combined laser beam emitted from the beam combiner system 3. The fly eye lens 421 may include a plurality of lenses arranged in a cross section of the combined laser beam. The lenses may transmit respective parts of the combined laser beam toward the condenser optics 422 to expand beam widths of the respective parts.

The condenser optics 422 may be provided between the fly eye lens 421 and the mask 43 in the optical path of the combined laser beam emitted from the beam combiner system 3. The condenser optics 422 may irradiate the mask 43 with the combined laser beam emitted from the fly eye lens 421.

The condenser optics 422 may be provided such that a rear-side focal plane of the condenser optics 422 substantially coincides with a position of the mask 43. The condenser optics 422 may thus irradiate substantially the same portion of the mask 43 with the respective parts of the combined laser beam transmitted by the respective lenses of the fly eye lens 421.

FIG. 1 shows that the condenser optics 422 may include a single convex lens. However, the condenser optics 422 may include a combination of the convex lens and another convex or concave lens (not shown), or include a concave mirror (not shown).

According to the above-mentioned configuration, the illumination optics 42 may reduce variation in light intensity in a cross section of the combined laser beam, with which the mask 43 is irradiated.

The mask 43 may have a rectangular slit. The shape of the slit may form the mask pattern of the mask 43. The mask pattern of the mask 43 may not be limited to have the rectangular shape. The mask pattern may have any desired shape.

The transfer optics 44 may be provided between the mask 43 and the irradiation object P in the optical path of the combined laser beam emitted from the beam combiner system 3. The transfer optics 44 may be provided such that an image of the mask 43 is transferred by the transfer optics 44 at a position substantially coinciding with a position where the irradiation object P shall be irradiated with the combined laser beam. The transfer optics 44 may thus transfer the mask pattern of the mask 43, irradiated with the combined laser beam, to the irradiation object P.

The transfer optics 44 may include at least one convex lens. In another example, the transfer optics 44 may include a combination of a convex lens and a concave lens, or include a concave mirror. In still another example, the transfer optics 44 may include a cylindrical lens that transfers a lateral component of an image of the rectangular mask pattern to the irradiation object P.

The laser system 5 may thus emit, through the beam combiner system 3, the combined laser beam having higher pulse energy than the pulse energy of the pulse laser beam emitted from the single laser apparatus. Consequently, the laser annealing apparatus 1 may irradiate a large irradiation area of the large-sized irradiation object P with the combined laser beam at a predetermined pulse energy density required for annealing. Thus, large-sized liquid crystal displays may be efficiently manufactured.

In the above disclosure, the substantially parallel pulse laser beams 21a to 21f emitted from the laser system 5 are combined by the beam combiner system 3 and then made enter the illumination optics 42 of the exposure apparatus 4. However, the present disclosure is not limited to this. Without the beam combiner system 3, the substantially parallel pulse laser beams 21a to 21f emitted from the laser system 5 may enter the illumination optics 42 of the exposure apparatus 4.

3. Laser System

Figures 2A, 2B:
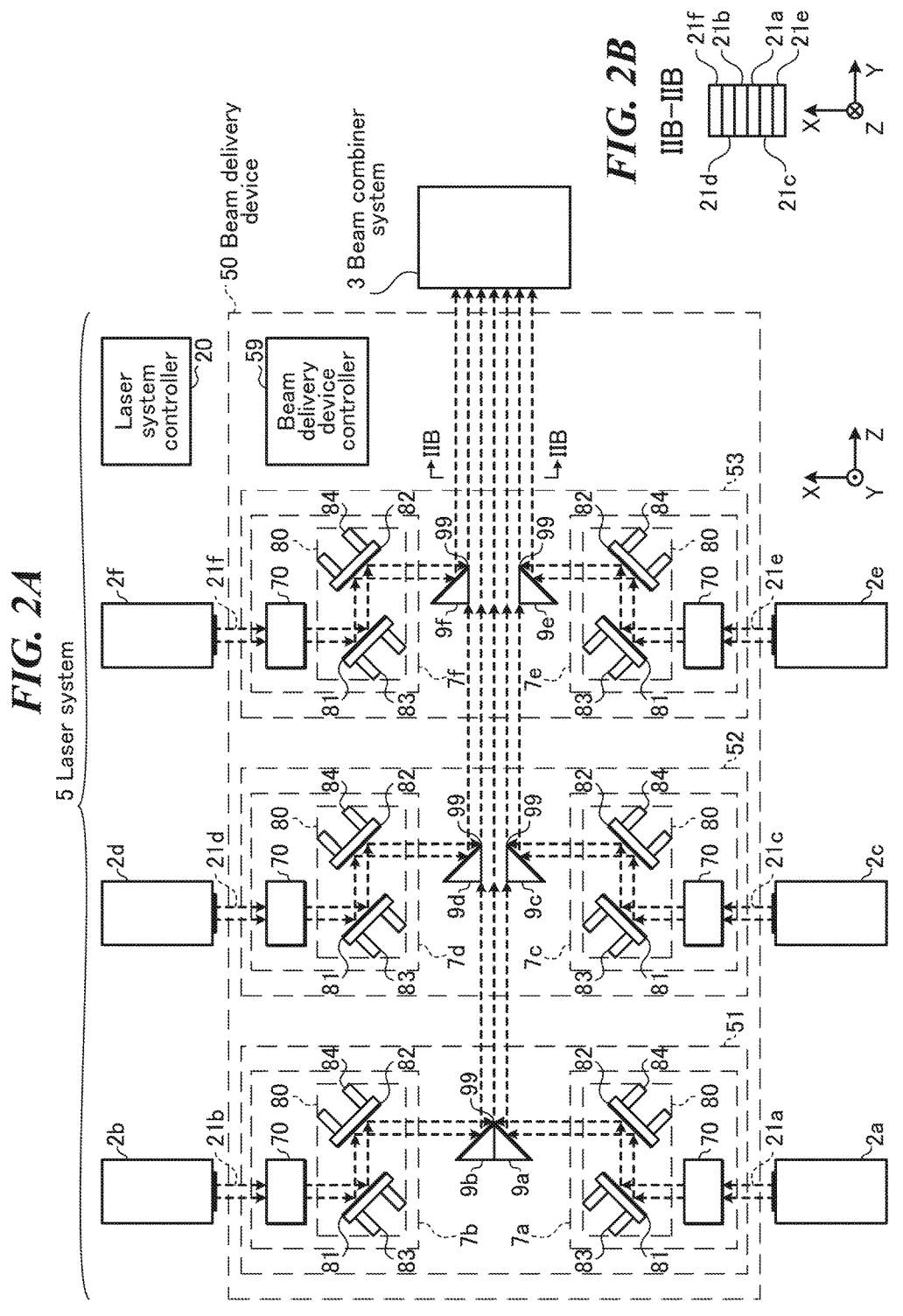

FIG. 2A schematically shows a configuration of the laser system used in an embodiment of the present disclosure. The laser system 5 may include laser apparatuses 2a to 2f, a beam delivery device 50, and a laser system controller 20.

3.1 Plurality of Laser Apparatuses

The laser apparatuses 2a to 2f may include a first laser apparatus 2a, a second laser apparatus 2b, a third laser apparatus 2c, a fourth laser apparatus 2d, a fifth laser apparatus 2e, and a sixth laser apparatus 2f. FIG. 2A shows the six laser apparatuses 2a to 2f; however, the number of the laser apparatuses may not be limited but may be an integer equal to or more than two.

Each of the first to sixth laser apparatuses 2a to 2f may be an excimer laser apparatus using laser medium such as XeF, XeCl, KrF, or ArF. The first to sixth laser apparatuses 2a to 2f may have substantially the same configurations with each other. The first to sixth laser apparatuses 2a to 2f may receive respective oscillation trigger signals from the laser system controller 20, and emit the first to sixth pulse laser beams 21a to 21f, respectively. Each of the first to sixth pulse laser beams 21a to 21f may have a wavelength of an ultraviolet region.

The first laser apparatus 2a may be provided so as to emit the first pulse laser beam 21a to the beam delivery device 50 in a first direction. The first direction may correspond to the X direction in FIG. 2A.

The third and fifth laser apparatuses 2c and 2e may be provided to emit the third and fifth pulse laser beams 21c and 21e, respectively, to the beam delivery device 50 in directions substantially parallel to the first direction. The first, third, and fifth laser apparatuses 2a, 2c, and 2e may be oriented in directions substantially the same with each other.

The second laser apparatus 2b may be provided so as to emit the second pulse laser beam 21b to the beam delivery device 50 in a second direction different from the first direction. The second direction may correspond to a −X direction in FIG. 2A.

The fourth and sixth laser apparatuses 2d and 2f may be provided to emit the fourth and sixth pulse laser beams 21d and 21f, respectively, to the beam delivery device 50 in directions substantially parallel to the second direction. The second, fourth, and sixth laser apparatuses 2b, 2d, and 2f may be oriented in directions substantially the same with each other.

The first and second laser apparatuses 2a and 2b may be provided opposite to each other, with the beam delivery device 50 between them.

The third and fourth laser apparatuses 2c and 2d may be provided opposite to each other, with the beam delivery device 50 between them.

The fifth and sixth laser apparatuses 2e and 2f may be provided opposite to each other, with the beam delivery device 50 between them.

3.2 Beam Delivery Device

The beam delivery device 50 may include a plurality of beam adjusters 7a to 7f, a plurality of mirrors 9a to 9f, and a beam delivery device controller 59.

The number of the beam adjusters 7a to 7f may correspond to the number of the laser apparatuses 2a to 2f. The number of the mirrors 9a to 9f may correspond to the number of the laser apparatuses 2a to 2f.

The first to sixth beam adjusters 7a to 7f may be provided in the optical paths of the first to sixth pulse laser beams 21a to 21f, respectively. The first to sixth pulse laser beams 21a to 21f emitted from the first to sixth beam adjusters 7a to 7f, respectively, may be incident on the first to sixth mirrors 9a to 9f, respectively.

The first beam adjuster 7a may include a beam adjusting unit 70 and a beam steering unit 80. The beam adjusting unit 70 included in the first beam adjuster 7a may adjust optical path length or beam divergence of the first pulse laser beam 21a.

The beam steering unit 80 included in the first beam adjuster 7a may adjust an optical path axis of the first pulse laser beam 21a. The beam steering unit 80 may include a first high-reflective mirror 81, a second high-reflective mirror 82, and actuators 83 and 84.

The first high-reflective mirror 81 may be provided in the optical path of the first pulse laser beam 21a emitted from the beam adjusting unit 70. The actuator 83 may change the posture of the first high-reflective mirror 81 according to a driving signal outputted by the beam delivery device controller 59. The first high-reflective mirror 81 may reflect the first pulse laser beam 21a to a direction according to the posture adjusted by the actuator 83. For example, the actuator 83 may be capable of changing posture angle of the first high-reflective mirror 81 in two directions perpendicular to each other.

The second high-reflective mirror 82 may be provided in the optical path of the first pulse laser beam 21a reflected by the first high-reflective mirror 81. The actuator 84 may change the posture of the second high-reflective mirror 82 according to a driving signal outputted by the beam delivery device controller 59. The second high-reflective mirror 82 may reflect the first pulse laser beam 21a to a direction according to the posture adjusted by the actuator 84. For example, the actuator 84 may be capable of changing posture angle of the second high-reflective mirror 82 in two directions perpendicular to each other.

The optical path axis of the first pulse laser beam 21a reflected by the second high-reflective mirror 82 may be substantially parallel to the first direction. The first pulse laser beam 21a reflected by the second high-reflective mirror 82 may be incident on the first mirror 9a.

The beam steering unit 80 may thus control a travelling direction of the pulse laser beam and a position of the pulse laser beam.

Descriptions for the first beam adjuster 7a were made in the above. The first to sixth beam adjusters 7a to 7f may have substantially the same configurations with each other.

The first to sixth mirrors 9a to 9f may be provided in the optical paths of the first to sixth pulse laser beams 21a to 21f, respectively, emitted from the first to sixth beam adjusters 7a to 7f, respectively. Each of the first to sixth mirrors 9a to 9f may have a triangular prism shape whose base surface has a nearly right-angled isosceles triangular shape. Each of these mirrors may be a prism mirror having a high-reflective film coated on one side surface of the triangular prism. Each of the first to sixth mirrors 9a to 9f may have a knife edge 99 that is the nearest from the beam combiner system 3 among three vertical edges. The knife edge 99 may be formed by two side surfaces contacting at an angle of 45 degrees or less. Each of the first to sixth mirrors 9a to 9f is not limited to a prism mirror. Each mirror may be formed by a substrate having a knife edge 99 and coated with a high-reflective film (see FIGS. 15A to 15C).

Reflective surfaces of the first, third, and fifth mirrors 9a, 9c, and 9e, each coated with the high-reflective film, may be substantially parallel to each other. Reflective surfaces of the second, fourth, and sixth mirrors 9b, 9d, and 9f, each coated with the high-reflective film, may be substantially parallel to each other.

The first to sixth pulse laser beams 21a to 21f may be incident on the respective reflective surfaces of the first to sixth mirrors 9a to 9f, at the respective portions adjacent to the knife edges 99. The first to sixth pulse laser beams 21a to 21f may be reflected by the first to sixth mirrors 9a to 9f, respectively, to the beam delivery direction. The beam delivery direction may correspond to the Z direction in FIG. 2A. The optical path axes of the first to sixth pulse laser beams 21a to 21f reflected by the first to sixth mirrors 9a to 9f, respectively, may be substantially parallel to each other.

The first and second mirrors 9a and 9b may be provided adjacent to each other. The knife edges 99 of the first and second mirrors 9a and 9b may be in contact with each other. The first and second mirrors 9a and 9b and the first and second beam adjusters 7a and 7b may constitute a first unit 51 of the beam delivery device 50.

The third and fourth mirrors 9c and 9d may have a first predetermined gap between them. The third and fourth mirrors 9c and 9d and the third and fourth beam adjusters 7c and 7d may constitute a second unit 52 of the beam delivery device 50.

The first and second pulse laser beams 21a and 21b reflected by the first and second mirrors 9a and 9b, respectively, may pass through the gap between the third and fourth mirrors 9c and 9d.

The fifth and sixth mirrors 9e and 9f may have a second predetermined gap between them. The fifth and sixth mirrors 9e and 9f and the fifth and sixth beam adjusters 7e and 7f may constitute a third unit 53 of the beam delivery device 50.

The first and second pulse laser beams 21a and 21b reflected by the first and second mirrors 9a and 9b, respectively, may pass through the gap between the fifth and sixth mirrors 9e and 9f. The third and fourth pulse laser beams 21c and 21d reflected by the third and fourth mirrors 9c and 9d, respectively, may also pass through the gap between the fifth and sixth mirrors 9e and 9f.

As described above, the beam delivery device 50 may bundle the first to sixth pulse laser beams 21a to 21f. In the following description, a plurality of pulse laser beams bundled by the beam delivery device 50 may be referred to as "a bundled laser beam". "Bundling" pulse laser beams may include emitting both a first pulse laser beam incident in a first direction and a second pulse laser beam incident in a second direction, to a third direction. The first direction and the second direction may be substantially the same directions or different directions. The third direction may be a different direction from both of the first and second directions. The first and second pulse laser beams emitted to the third direction may be adjacent to each other. The third direction may be perpendicular to both the first and second directions.

FIG. 2B shows a cross section of the first to sixth pulse laser beams 21a to 21f at a line IIB-IIB in FIG. 2A. Cross sectional shapes of the first to sixth pulse laser beams 21a to 21f may be substantially the same with each other. The optical path axes of the first to sixth pulse laser beams 21a to 21f reflected by the first to sixth mirrors 9a to 9f, respectively, may be positioned in a single plane substantially parallel to the beam delivery direction. The optical paths of the first and second pulse laser beams 21a and 21b may be positioned between the optical paths of the third and fourth pulse laser beams 21c and 21d. The optical paths of the third and fourth pulse laser beams 21c and 21d may be positioned between the optical paths of the fifth and sixth pulse laser beams 21e and 21f. Any two pulse laser beams of the first to sixth pulse laser beams 21a to 21f next to each other may be adjacent to each other.

4. First Embodiment

4.1 Configuration

Figure 4A:
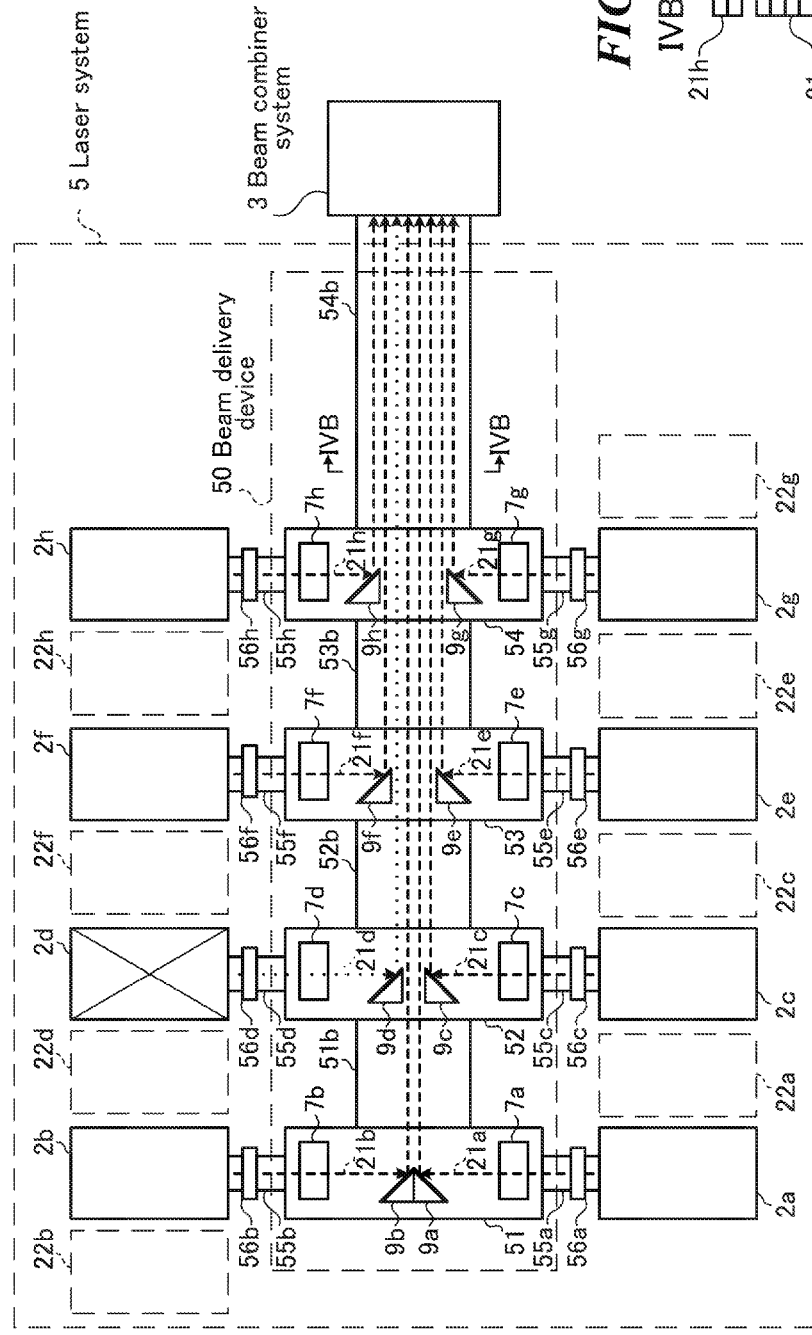
FIG. 4A schematically shows a configuration of the laser system according to the first embodiment of the present disclosure.

FIGS. 3A and 4A schematically show a configuration of a laser system according to a first embodiment of the present disclosure. The laser system 5 in FIGS. 3A and 4A may include the first to sixth laser apparatuses 2a to 2f and seventh and eighth laser apparatuses 2g and 2h. Further, the laser system 5 may include the first to sixth beam adjusters 7a to 7f and seventh and eighth beam adjusters 7g and 7h. Further, the laser system 5 may include the first to sixth mirrors 9a to 9f and seventh and eighth mirrors 9g and 9h. The seventh and eighth mirrors 9g and 9h and the seventh and eighth beam adjusters 7g and 7h may constitute a fourth unit 54 of the beam delivery device 50.

The seventh and eighth mirrors 9g and 9h may have a third predetermined gap between them. The first to sixth pulse laser beams 21a to 21f reflected by the first to sixth mirrors 9a to 9f, respectively, may pass through the gap between the seventh and eighth mirrors 9g and 9h.

FIG. 3B shows a cross section of the first to eighth pulse laser beams 21a to 21h at a line IIIB-IIIB in FIG. 3A. Cross sectional shapes of the first to eighth pulse laser beams 21a to 21h may be substantially the same with each other. The optical path axes of the first to eighth pulse laser beams 21a to 21h reflected by the first to eighth mirrors 9a to 9h, respectively, may be positioned in a single plane substantially parallel to the beam delivery direction. The optical paths of the first to sixth pulse laser beams 21a to 21f may be positioned between the optical paths of the seventh and eighth pulse laser beams 21g and 21h. Any two pulse laser beams of the first to eighth pulse laser beams 21a to 21h next to each other may be adjacent to each other.

The first to eighth laser apparatuses 2a to 2h may require maintenance areas 22a to 22h, respectively, each on a right side with respect to the emitting direction of the pulse laser beam. Each of the maintenance areas 22a to 22h may serve as a working space for retrieving or exchanging various components of each laser apparatus.

The first to fourth units 51 to 54 may be stored in respective housings. The first laser apparatus 2a and the first unit 51 may be connected by a beam path tube 55a. The second laser apparatus 2b and the first unit 51 may be connected by another beam path tube 55b. The third laser apparatus 2c and the second unit 52 may be connected by a beam path tube 55c. The fourth laser apparatus 2d and the second unit 52 may be connected by another beam path tube 55d. The fifth laser apparatus 2e and the third unit 53 may be connected by a beam path tube 55e. The sixth laser apparatus 2f and the third unit 53 may be connected by another beam path tube 55f. The seventh laser apparatus 2g and the fourth unit 54 may be connected by a beam path tube 55g. The eighth laser apparatus 2h and the fourth unit 54 may be connected by another beam path tube 55h. The first unit 51 and the second unit 52, the second unit 52 and the third unit 53, the third unit 53 and the fourth unit 54, and the fourth unit 54 and the beam combiner system 3 may be connected by beam path tubes 51b, 52b, 53b, and 54b, respectively. Interior of each of the beam path tubes may be purged with an inert gas. For example, the inert gas may include high purity nitrogen gas, helium gas, or argon gas.

The beam path tubes 55a to 55h may have first to eighth valves 56a to 56h, respectively. The first to eighth valves 56a to 56h may close the corresponding beam path tube when one of the first to eighth laser apparatuses 2a to 2h suspends its operation.

As shown in FIG. 4, one laser apparatus of the plurality of laser apparatuses 2a to 2h such as the fourth laser apparatus 2d may suspend its operation for some reason. Suspending operation of the fourth laser apparatus 2d may cause suspending emission of the fourth pulse laser beam 21d. At this situation, as explained below, the laser system controller 20 may control the laser apparatuses other than the suspending laser apparatus so as to suppress decreasing pulse energy of the bundled laser beam to be emitted from the laser system 5.

Figure 5:
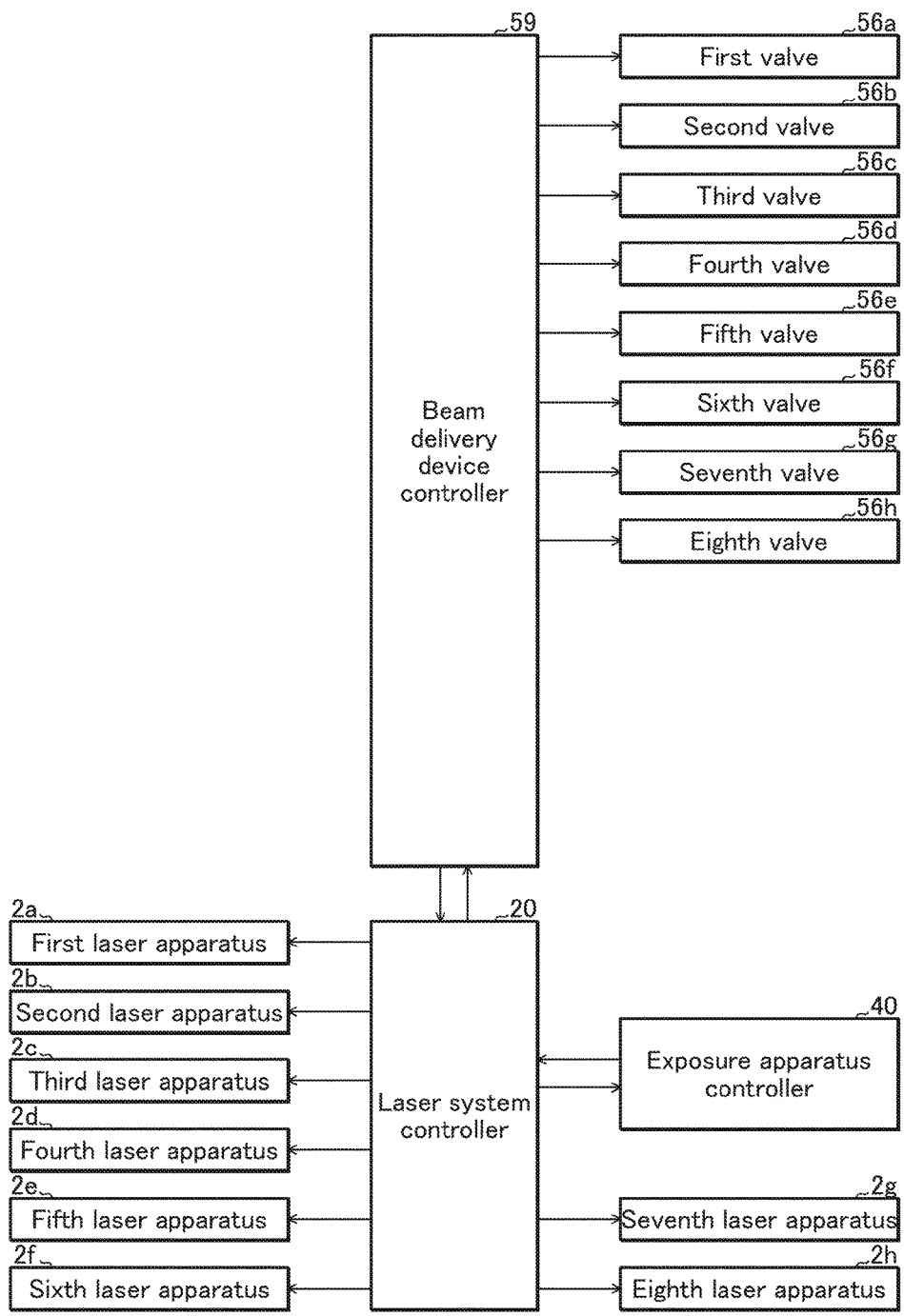
FIG. 5 is a block diagram of a laser system controller 20, a beam delivery device controller 59, and their peripheries in the first embodiment of the present disclosure.

FIG. 5 is a block diagram of the laser system controller 20, the beam delivery device controller 59, and their peripheries in the first embodiment of the present disclosure.

An exposure apparatus controller 40 included in the exposure apparatus 4 may perform moving a stage (not shown), which holds the irradiation object P, exchanging the irradiation object P, or exchanging the mask 43. The exposure apparatus controller 40 may output a trigger signal to the laser system controller 20.

The laser system controller 20 may receive the trigger signal from the exposure apparatus controller 40 in the exposure apparatus 4 and send oscillation trigger signals to the laser apparatuses 2a to 2h. The laser apparatuses 2a to 2h may emit the pulse laser beams based on the respective oscillation trigger signals received from the laser system controller 20.

The beam delivery device controller 59 may drive, according to a control signal outputted by the laser system controller 20, actuators (not shown) of the first to eighth valves 56a to 56h to open and close the corresponding beam path tube.

4.2 Controlling Operation

FIG. 5 is a flowchart illustrating an operation of the laser system controller 20 shown in FIG. 5. In the following description, J is the number of the laser apparatuses included in the laser system 5. When one laser apparatus j of the first to Jth laser apparatuses suspends its operation, the laser system controller 20 may control the laser apparatuses other than the one laser apparatus j in the following processing. The laser system controller 20 may thus reduce downtime of the laser system 5.

First, at S100, the laser system controller 20 may read target data from the exposure apparatus controller 40 of the exposure apparatus 4. The target data may include target pulse energy Et of the bundled laser beam emitted from the laser system 5.

Next, at S110, the laser system controller 20 may output a signal to prohibit exposure to the exposure apparatus controller 40 of the exposure apparatus 4.

Next, at S120, the laser system controller 20 may set target pulse energy of each of the first to Jth laser apparatuses and oscillation trigger timing of each of the first to Jth laser apparatuses. The target pulse energy of each of the first to Jth laser apparatuses may be calculated based on the target pulse energy Et of the bundled laser beam. Details of the process in S120 will be described below with reference to FIG. 7.

Next, at S130, the laser system controller 20 may output a signal to allow exposure to the exposure apparatus controller 40 of the exposure apparatus 4.

Next, at S140, the laser system controller 20 may determine whether one laser apparatus of the first to Jth laser apparatuses is going to suspend its operation. Whether the one laser apparatus is going to suspend its operation is determined based on stability of the pulse laser beam emitted from each laser apparatus, charging voltage of each laser apparatus, the number of laser pulses (described below) emitted from the chamber of each laser apparatus, and the like.

If no laser apparatus is going to suspend its operation (S140; NO), the laser system controller 20 may, without proceeding to the next step, repeat the process of S140 until deciding that one laser apparatus is going to suspend its operation. Thus, the first to Jth laser apparatuses may continue to generate respective pulse laser beams.

If one laser apparatus is going to suspend its operation, the laser system controller 20 may determine that a jth laser apparatus is going to suspend its operation. If the jth laser apparatus is going to suspend its operation (S140; YES), the laser system controller 20 may proceed to S150.

At S150, the laser system controller 20 may output a signal to prohibit exposure to the exposure apparatus controller 40 of the exposure apparatus 4.

Next, at S160, the laser system controller 20 may prohibit inputting an oscillation trigger signal to the jth laser apparatus.

Next, at S170, the laser system controller 20 may send a control signal to the beam delivery device controller 59 to close the valve in the beam path tube connected to the suspending jth laser apparatus.

Next, at S180, the laser system controller 20 may update the target pulse energy of each of the laser apparatuses other than the jth laser apparatus. For example, the target pulse energy of each of the laser apparatuses other than the jth laser apparatus may be increased so as to compensate decrease in pulse energy of the bundled laser beam due to suspending operation of the jth laser apparatus. Details of the process in S180 will be described below with reference to FIG. 8.

Next, at S200, the laser system controller 20 may output a signal to allow exposure to the exposure apparatus controller 40 of the exposure apparatus 4.

Next, at S210, the laser system controller 20 may determine whether the jth laser apparatus is currently suspending its operation.

If the jth laser apparatus is currently suspending its operation (S210; YES), the laser system controller 20 may proceed to S230. At S230, the laser system controller 20 may determine whether the laser apparatuses other than the jth laser apparatus may fulfill requirements. For example, if the laser apparatuses other than the jth laser apparatus can not achieve the target data required by the exposure apparatus 4, the laser system controller 20 may determine that the laser apparatuses other than the jth laser apparatus do not fulfill requirements. Further, if another one of the laser apparatuses other than the jth laser apparatus is going to suspend its operation, the laser system controller 20 may determine that the laser apparatuses other than the jth laser apparatus do not fulfill requirements.

If the laser apparatuses other than the jth laser apparatus may fulfill requirements (S230; YES), the laser system controller 20 may return to the above S210.

If the laser apparatuses other than the jth laser apparatus may not fulfill requirements (S230; NO), the laser system controller 20 may output a signal to prevent exposure at S240 to the exposure apparatus controller 40 of the exposure apparatus 4. The laser system controller 20 may suspend operation of all laser apparatuses included in the laser system 5.

After S240, the laser system controller 20 may terminate the processing of this flowchart.

At the above S210, if the jth laser apparatus is capable of resuming its operation by, for example, completing the maintenance, the laser system controller 20 may determine that the jth laser apparatus is not currently suspending its operation. If the jth laser apparatus is not currently suspending its operation (S210; NO), the laser system controller 20 may proceed to S220.

At S220, the laser system controller 20 may send a control signal to the beam delivery device controller 59 to open the valve in the beam path tube connected to the jth laser apparatus.

After S220, the laser system controller 20 may return to the above S110. Thus, the laser system controller 20 may control the first to Jth laser apparatuses to emit the pulse laser beams from the respective first to Jth laser apparatuses including the jth laser apparatus.

4.3 Setting Target Pulse Energy and Oscillation Trigger Timing

Figure 6:
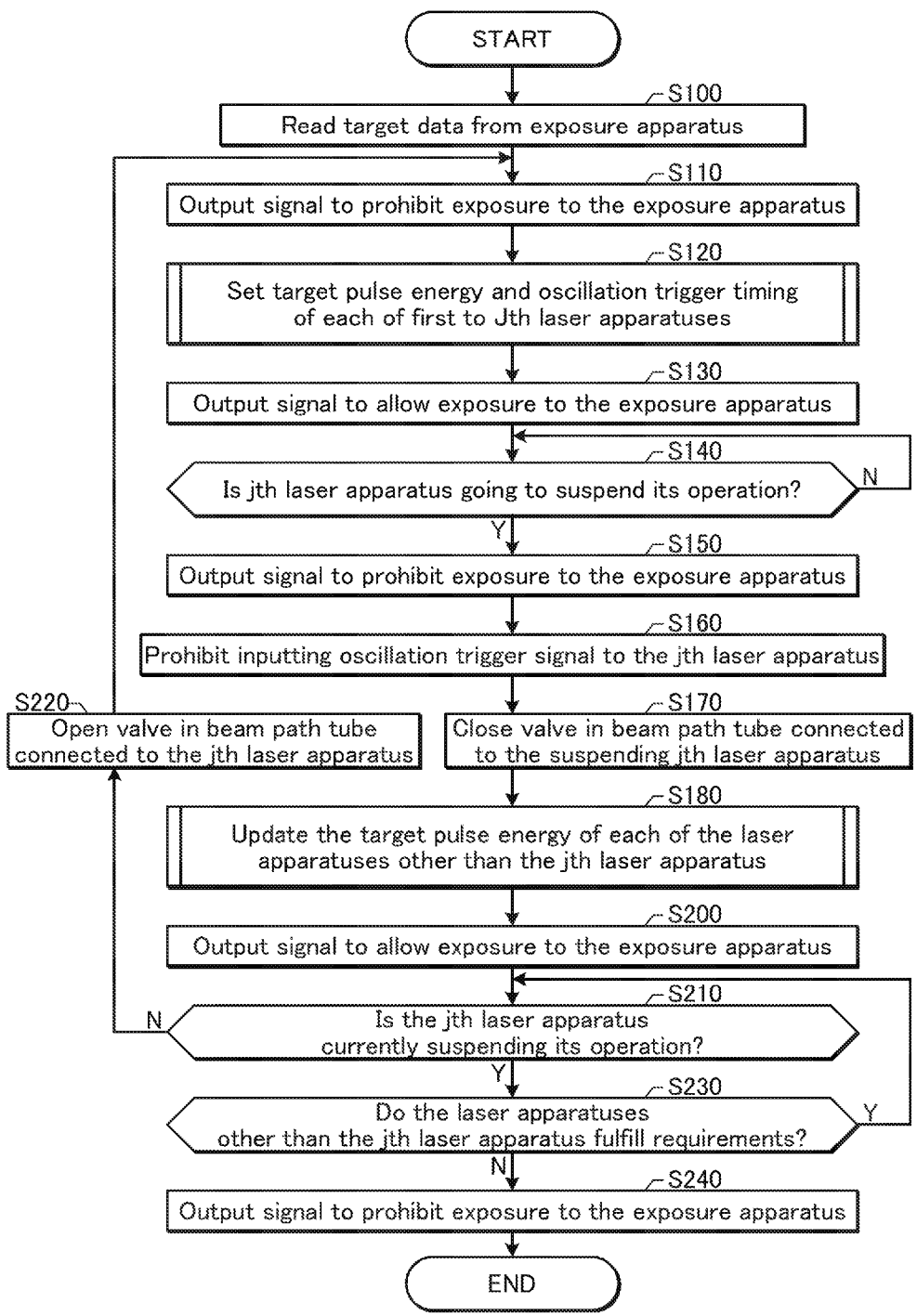
FIG. 6 is a flowchart illustrating an operation of the laser system controller 20 shown in FIG. 5.
Figure 7:
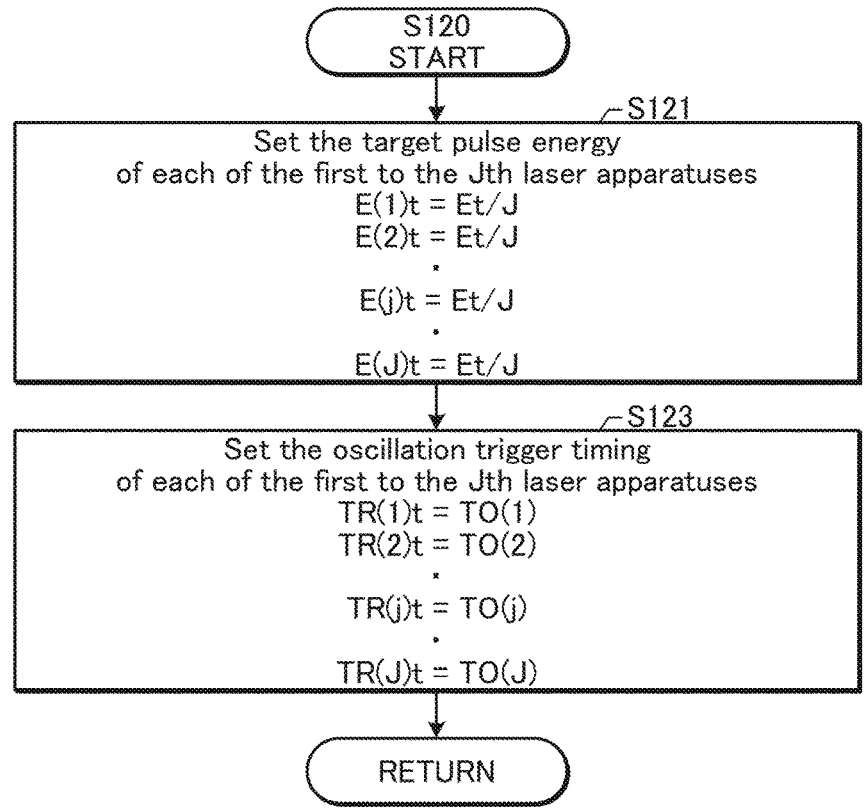
FIG. 7 is a flowchart illustrating detailed processing of setting target pulse energy and oscillation trigger timing of each of first to Jth laser apparatuses shown in FIG. 6.

FIG. 7 is a flowchart illustrating detailed processing of setting the target pulse energy and the oscillation trigger timing of each of the first to Jth laser apparatuses shown in FIG. 6. The processing shown in FIG. 7 may be performed by the laser system controller 20 as a subroutine of S120 shown in FIG. 6.

First, at S121, the laser system controller 20 may set the target pulse energy of each of the first to Jth laser apparatuses as follows.

$$E(1)t = Et/J$$
$$E(2)t = Et/J$$
$$...$$
$$E(j)t = Et/J$$
$$...$$
$$E(J)t = Et/J$$

Here, $E(n)t$ may be the target pulse energy of an nth laser apparatus. $Et$ may be the target pulse energy of the bundled laser beam. In the above example, the target pulse energy of each of the laser apparatuses is calculated by dividing the target pulse energy $Et$ of the bundled laser beam by the number J of the laser apparatuses. However, any other target pulse energy may be calculated for each of the laser apparatuses as long as the total pulse energy is $Et$.

Next, at S123, the laser system controller 20 may set the oscillation trigger timing of each of the first to Jth laser apparatuses as follows.

$$TR(1)t = TO(1)$$
$$TR(2)t = TO(2)$$
$$...$$
$$TR(j)t = TO(j)$$
$$...$$
$$TR(J)t = TO(J)$$

Here, $TR(n)t$ may be the oscillation trigger timing of the nth laser apparatus. $TO(n)$ may be the oscillation trigger timing to be set for the nth laser apparatus such that the pulse laser beams are simultaneously emitted from the laser system 5. $TO(n)$ may be a value to be calculated based on required time from the time when the oscillation trigger signal is given to the nth laser apparatus to the time when the pulse laser beam is emitted from the laser system 5.

After S123, the laser system controller 20 may terminate the processing of this flowchart to proceed to S130 in FIG. 6.

Figure 8:
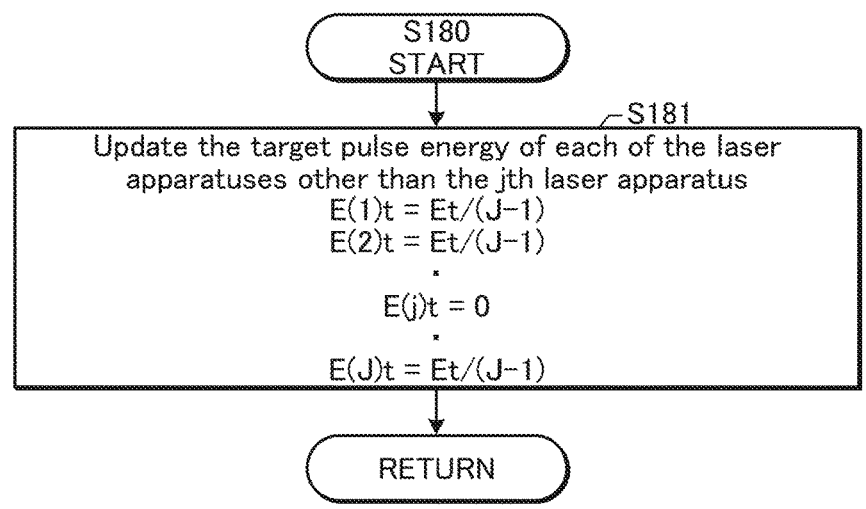
FIG. 8 is a flowchart illustrating detailed processing of updating the target pulse energy of each of the laser apparatuses other than a jth laser apparatus shown in FIG. 6.

FIG. 8 is a flowchart illustrating detailed processing of updating the target pulse energy of each of the laser apparatuses other than the jth laser apparatus shown in FIG. 6. The processing shown in FIG. 8 may be performed by the laser system controller 20 as a subroutine of S180 shown in FIG. 6.

At S181, the laser system controller 20 may update the target pulse energy of each of the laser apparatuses other than the jth laser apparatus as follows.

$$E(1)t = Et/(J-1)$$
$$E(2)t = Et/(J-1)$$
$$...$$
$$E(j)t = 0$$
$$...$$
$$E(J)t = Et/(J-1)$$

Here, $E(n)t$ may be the target pulse energy of an nth laser apparatus. $Et$ may be the target pulse energy of the bundled laser beam. In the above example, the target pulse energy of each of the laser apparatuses is calculated by dividing the target pulse energy $Et$ of the bundled laser beam by the number J−1 of the operated laser apparatuses. However, any other target pulse energy may be calculated for each of the laser apparatuses as long as the total pulse energy is $Et$.

After S181, the laser system controller 20 may terminate the processing of this flowchart to proceed to S200 in FIG. 6.

According to the first embodiment, when one laser apparatus of the J laser apparatuses is going to suspend its operation, the laser system controller 20 may increase the target pulse energy of each laser apparatus by a factor of J/(J−1) to compensate decrease in pulse energy due to suspending operation of the one laser apparatus.

5. Second Embodiment

5.1 Controlling Operation

Figure 9:
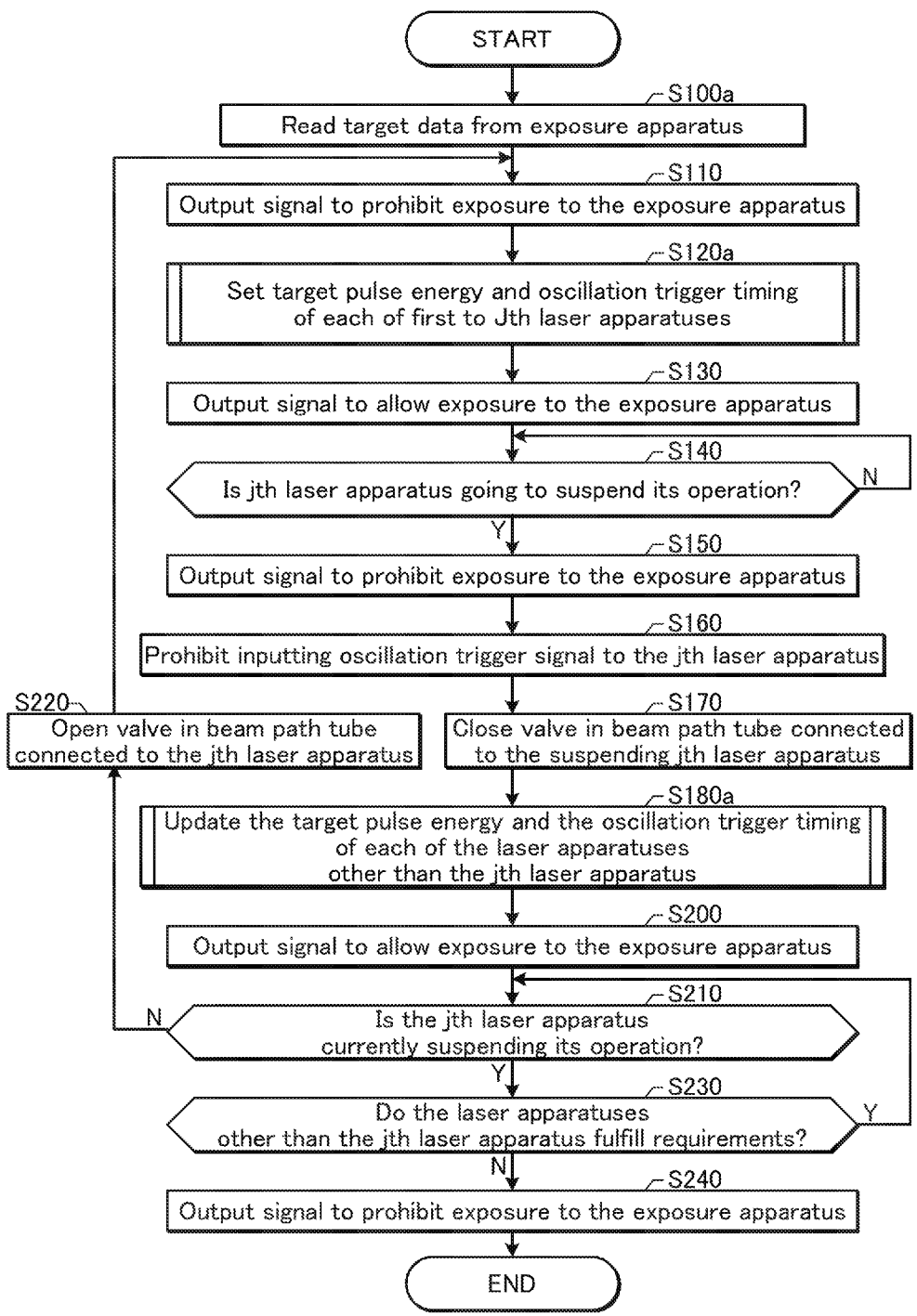
FIG. 9 is a flowchart illustrating an operation of a laser system controller 20 in the second embodiment of the present disclosure.

FIG. 9 is a flowchart illustrating an operation of a laser system controller 20 in the second embodiment of the present disclosure. In the second embodiment, the oscillation trigger timing of each laser apparatus may be controlled based on target pulse width of the bundled laser beam emitted from the laser system 5. The configuration of the laser system of the second embodiment may be substantially the same as that of the first embodiment.

First, at S100a, the laser system controller 20 may read target data from the exposure apparatus controller 40 of the exposure apparatus 4. The target data may include target pulse energy Et of the bundled laser beam emitted from the laser system 5 and target pulse width Dt of the bundled laser beam emitted from the laser system 5.

The next process at S110 may be substantially the same as the corresponding process in the first embodiment described above with reference to FIG. 6.

Next, at S120a, the laser system controller 20 may set the target pulse energy of each of the first to Jth laser apparatuses and the oscillation trigger timing of each of the first to Jth laser apparatuses. The oscillation trigger timing of each of the first to Jth laser apparatuses may be calculated based on the target pulse width Dt of the bundled laser beam. Details of the process in S120a will be described below with reference to FIGS. 10A and 10B.

The next processes at S130 to S170 may be substantially the same as the corresponding processes in the first embodiment described above with reference to FIG. 6.

Next, at S180a, the laser system controller 20 may update the target pulse energy of each of the laser apparatuses other than the jth laser apparatus and the oscillation trigger timing of each of the laser apparatuses other than the jth laser apparatus. For example, a time interval between the oscillation trigger timings of the laser apparatuses other than the jth laser apparatus may be set longer than a time interval set before suspending operation of the jth laser apparatus. Details of the process in S180a will be described below with reference to FIGS. 11A and 11B.

The remaining processes at S200 to S240 may be substantially the same as the corresponding processes in the first embodiment described above with reference to FIG. 6.

5.2 Setting Target Pulse Energy and Oscillation Trigger Timing

Figure 10A:
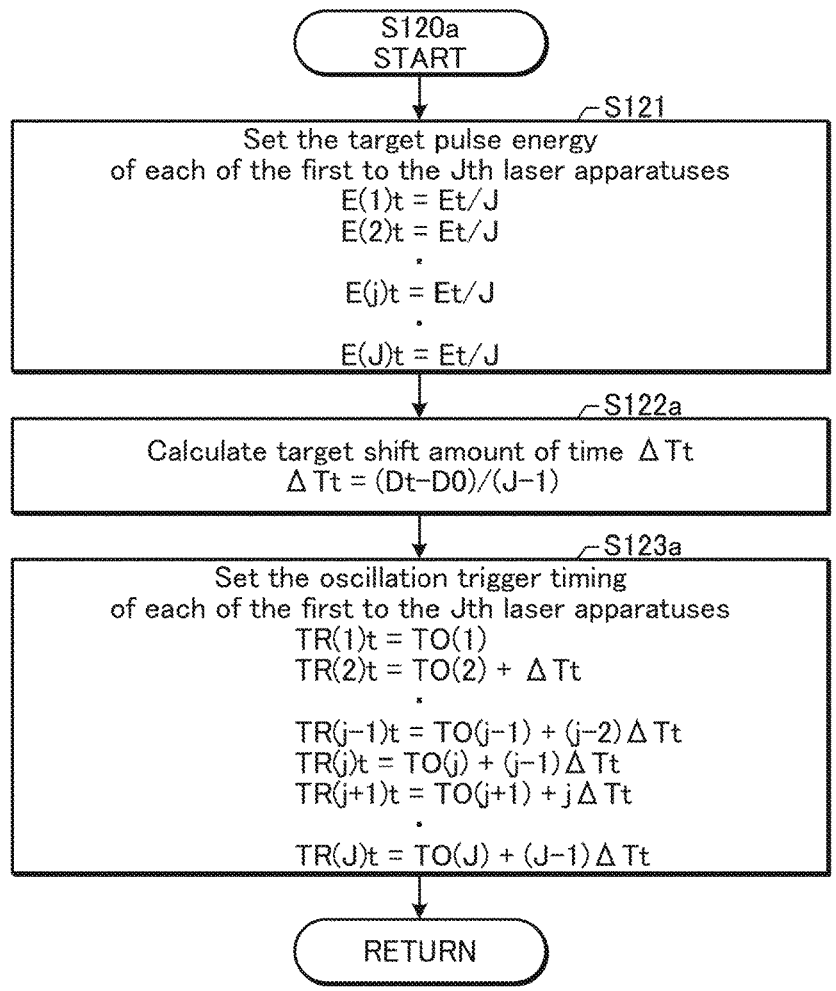
FIG. 10A is a flowchart illustrating detailed processing of setting target pulse energy and oscillation trigger timing of each of first to Jth laser apparatuses shown in FIG. 9.

FIG. 10A is a flowchart illustrating detailed processing of setting the target pulse energy and the oscillation trigger timing of each of the first to Jth laser apparatuses shown in FIG. 9. The processing shown in FIG. 10A may be performed by the laser system controller 20 as a subroutine of S120a shown in FIG. 9.

First, at S121, the laser system controller 20 may set the target pulse energy of each of the first to Jth laser apparatuses. This process may be substantially the same as the corresponding process in the first embodiment described above with reference to FIG. 7.

Next, at S122a, the laser system controller 20 may calculate target shift amount of time ΔTt between the oscillation trigger timings of the laser apparatuses as follows.

$$\Delta Tt = (Dt - D0)/(J-1)$$

Here, Dt may be the target pulse width of the bundled laser beam. D0 may be the pulse width of the pulse laser beam emitted from each laser apparatus.

Figure 10B:
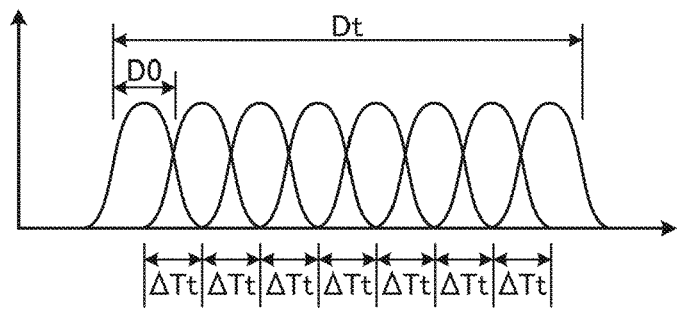
FIG. 10B shows a pulse waveform of the pulse laser beam emitted from each of the laser apparatuses based on the oscillation trigger timing shown in FIG. 10A.

FIG. 10B shows a pulse waveform of the pulse laser beam emitted from each of the laser apparatuses based on the oscillation trigger timing shown in FIG. 10A. D0 may be the pulse width of the pulse laser beam emitted from each laser apparatus. ΔTt may be target shift amount of time between the oscillation trigger timings of the laser apparatuses. In FIG. 10B, ΔTt may be the time interval between peak timings of the respective pulse laser beams emitted from the respective laser apparatuses. In FIG. 10B, J pulse laser beams are emitted from the respective J laser apparatuses at the time interval ΔTt to form the bundled laser beam. J may be equal to 8. The bundled laser beam may have pulse width Dt. The pulse width may correspond to full width at half maximum of the peak intensity.

As shown in FIG. 10B, a time difference between the peak timing of the first pulse and the peak timing of the last pulse may be ΔTt×(J−1). The peak timing of the first pulse is D0/2 after the beginning of the Dt and the peak timing of the last pulse is D0/2 before the end of the Dt. The time difference may thus be Dt−D0. The following equation may thus be obtained.

$$\Delta Tt = (Dt - D0)/(J-1)$$

Referring back to FIG. 10A, at S123a, the laser system controller 20 may set the oscillation trigger timing of each of the first to Jth laser apparatuses as follows.

$$TR(1)t = TO(1)$$

$$TR(2)t = TO(2) + \Delta Tt$$

$$\ldots$$

$$TR(j-1)t = TO(j-1) + (j-2)\Delta Tt$$

$$TR(j)t = TO(j) + (j-1)\Delta Tt$$

$$TR(j+1)t = TO(j+1) + j\Delta Tt$$

$$\ldots$$

$$TR(J)t = TO(J) + (J-1)\Delta Tt$$

Here, TR(n)t may be the oscillation trigger timing of an nth laser apparatus. TO(n) may be the oscillation trigger timing to be set for the nth laser apparatus such that the pulse laser beams are simultaneously emitted from the laser system 5. According to the above equations, each of the first to Jth pulse laser beams may be emitted from the laser system 5 at timings shifted by ΔTt from the first pulse.

After S123a, the laser system controller 20 may terminate the processing of this flowchart to proceed to S130 in FIG. 9.

Figure 11A:
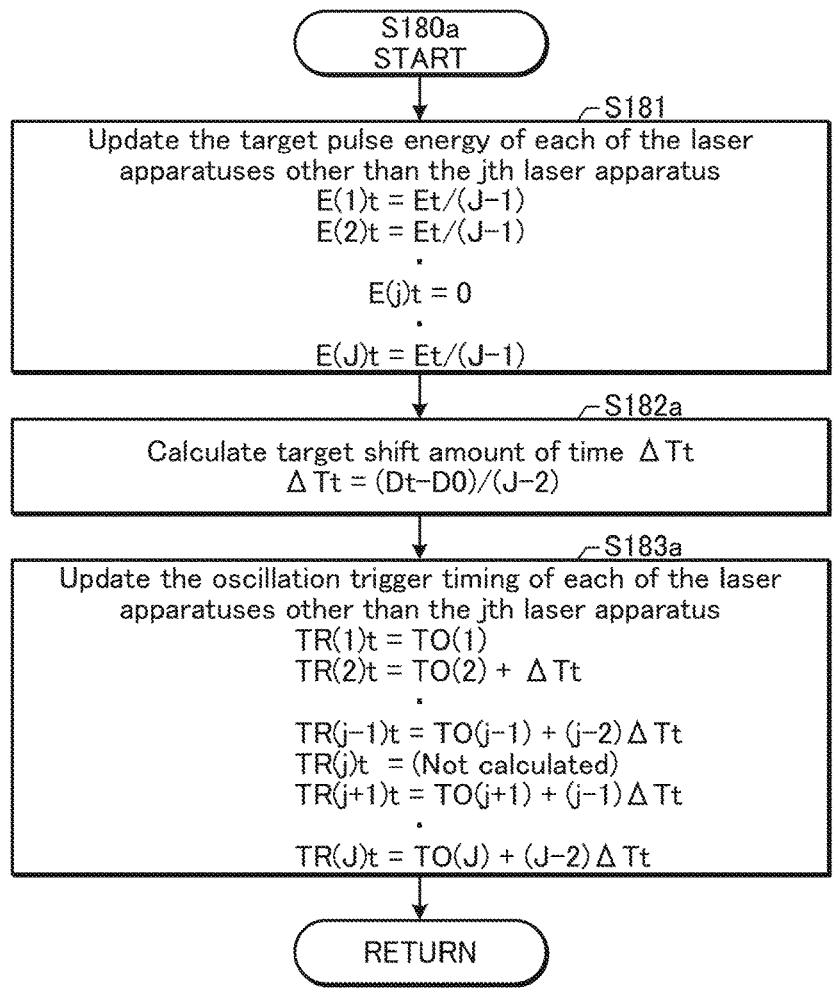
FIG. 11A is a flowchart illustrating detailed processing of updating the target pulse energy of each of the laser apparatuses other than a jth laser apparatus shown in FIG. 9.

FIG. 11A is a flowchart illustrating detailed processing of updating the target pulse energy of each of the laser apparatuses other than the jth laser apparatus shown in FIG. 9. The processing shown in FIG. 11A may be performed by the laser system controller 20 as a subroutine of S180a shown in FIG. 9.

At S181, the laser system controller 20 may update the target pulse energy of each of the laser apparatuses other than the jth laser apparatus. This process may be substantially the same as the corresponding process in the first embodiment described above with reference to FIG. 8.

Next, at S182a, the laser system controller 20 may calculate target shift amount of time ΔTt between the oscillation trigger timings of the laser apparatuses as follows.

$$\Delta Tt = (Dt - D0)/(J-2)$$

Here, Dt may be the target pulse width of the bundled laser beam. D0 may be the pulse width of the pulse laser beam emitted from each laser apparatus.

Figure 11B:
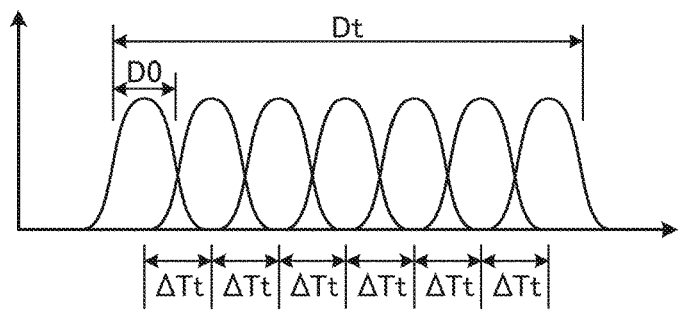
FIG. 11B shows a pulse waveform of the pulse laser beam emitted from each of the laser apparatuses based on the oscillation trigger timing shown in FIG. 11A.

FIG. 11B shows a pulse waveform of the pulse laser beam emitted from each of the laser apparatuses based on the oscillation trigger timing shown in FIG. 11A. D0 may be the pulse width of the pulse laser beam emitted from each laser apparatus. ΔTt may be target shift amount of time between the oscillation trigger timings of the laser apparatuses. In FIG. 11B, ΔTt may be the time interval between peak timings of the respective pulse laser beams emitted from the respective laser apparatuses. In FIG. 11B, J-1 pulse laser beams are emitted from respective J-1 laser apparatuses at the time interval ΔTt to form the bundled laser beam. J-1 may be equal to 7. The bundled laser beam may have pulse width Dt. The pulse width may correspond to full width at half maximum of the peak intensity.

As shown in FIG. 11B, a time difference between the peak timing of the first pulse and the peak timing of the last pulse may be ΔTt×(J-2). The peak timing of the first pulse is D0/2 after the beginning of the Dt and the peak timing of the last pulse is D0/2 before the end of the Dt. The time difference may thus be Dt-D0. The following equation may thus be obtained.

$$\Delta Tt = (Dt - D0)/(J-2)$$

Referring back to FIG. 11A, at S183a, the laser system controller 20 may set the oscillation trigger timing of each of the laser apparatuses other than the jth pulse laser apparatus as follows.

$$TR(1)t = TO(1)$$
$$TR(2)t = TO(2) + \Delta Tt$$
$$...$$
$$TR(j-1)t = TO(j-1) + (j-2)\Delta Tt$$
$$TR(j)t = \text{(Not calculated)}$$
$$TR(j+1)t = TO(j+1) + (j-1)\Delta Tt$$
$$...$$
$$TR(J)t = TO(J) + (J-2)\Delta Tt$$

Here, TR(n)t may be the oscillation trigger timing of the nth laser apparatus. TO(n) may be the oscillation trigger timing to be set for the nth laser apparatus such that the pulse laser beams are simultaneously emitted from the laser system 5. According to the above equations, each of the pulse laser beams other than the jth pulse laser beam may be emitted from the laser system 5 at timings shifted by ΔTt from the first pulse.

After S183a, the laser system controller 20 may terminate the processing of this flowchart to proceed to S200 in FIG. 9.

According to the second embodiment, when one laser apparatus of the J laser apparatuses is going to suspend its operation, the laser system controller 20 may increase the target shift amount of time ΔTt between the oscillation trigger timings of the laser apparatuses by a factor of (J-1)/(J-2) to keep the pulse width of the bundled laser beam nearly at the target pulse width Dt.

6. Third Embodiment

6.1 Overall Configuration

Figure 12:
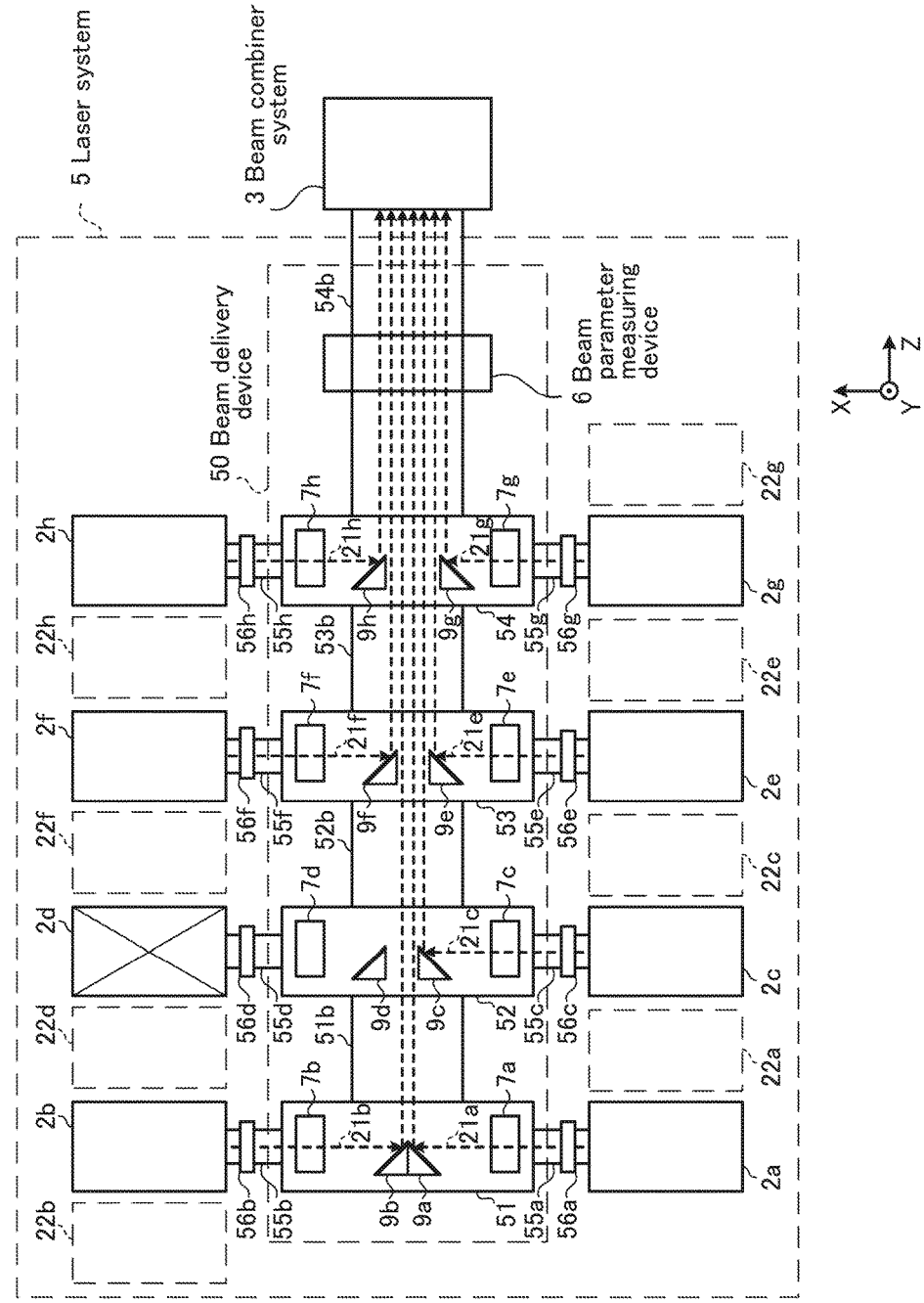
FIG. 12 schematically shows a configuration of a laser system according to a third embodiment of the present disclosure.

FIG. 12 schematically shows a configuration of a laser system according to a third embodiment of the present disclosure. In FIG. 12, the beam delivery device 50 may include a beam parameter measuring device 6. Also in FIG. 12, the first to eighth mirrors 9a to 9h may be separately movable.

The beam parameter measuring device 6 may be provided in the optical path of the bundled laser beam. Based on the beam parameters measured by the beam parameter measuring device 6, feedback, control of the first to eighth laser apparatuses 2a to 2h and the first to eighth beam adjusters 7a to 7h may be performed. The beam parameters of the bundled laser beam may thus approach respective target values.

By moving the first to eighth mirrors 9a to 9h, the following operations may be achieved.

Figure 4B:
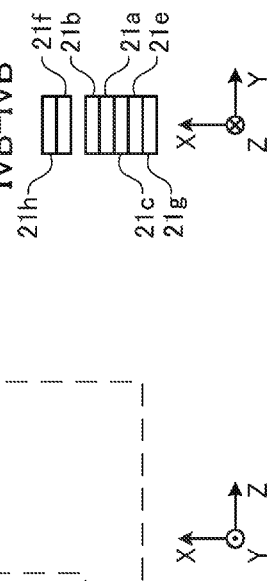
FIG. 4B shows a cross section of the first to eighth pulse laser beams 21a to 21h at a line IVB-IVB in FIG. 4A.

Firstly, as shown in FIG. 12, if the fourth laser apparatus 2d suspends its operation, the sixth and eighth mirrors 9f and 9h may be moved to approach the optical path axis of the bundled laser beam. The optical path axes of the sixth and eighth pulse laser beams 21f and 21h in the beam delivery direction may thus approach the optical path axis of the second pulse laser beam 21b in the beam delivery direction. A gap as shown in FIG. 4B may thus be reduced.

Secondly, as shown in FIG. 12, if the fourth laser apparatus 2d suspends its operation, the fourth mirror 9d may be moved away from the optical path axis of the bundled laser beam. It may then suppress a situation where a part of the second pulse laser beam 21b hits the back side of the fourth mirror 9d. Reducing energy of the bundled laser beam may then be suppressed.

Figure 13:
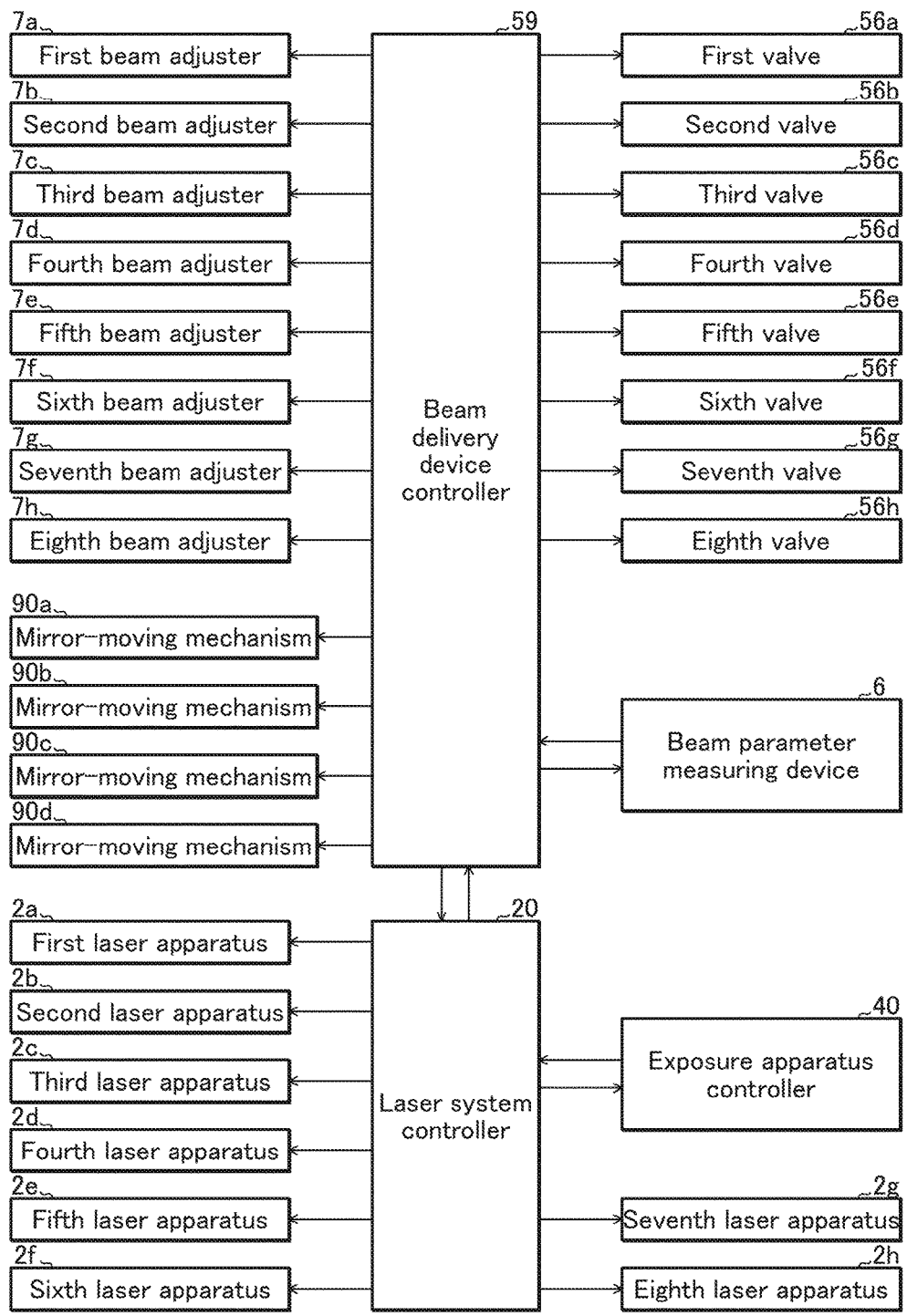
FIG. 13 is a block diagram of a laser system controller 20, a beam delivery device controller 59, and their peripheries of the third embodiment of the present disclosure.

FIG. 13 is a block diagram of a laser system controller 20, a beam delivery device controller 59, and their peripheries of the third embodiment of the present disclosure. In the third embodiment, the beam delivery device controller 59 may be connected to the beam parameter measuring device 6, the first to eighth beam adjusters 7a to 7h, and first to fourth mirror-moving mechanisms 90a to 90d.

The other aspects may be substantially the same as those in the first embodiment described above with reference to FIG. 5.

The beam delivery device controller 59 may calculate the beam parameters of the first to eighth pulse laser beams 21a to 21h based on the data received from the beam parameter measuring device 6. The beam delivery device controller 59 may control the beam adjusters 7a to 7h based on the calculated beam parameters. The beam delivery device controller 59 may further control the mirror-moving mechanisms 90a to 90d based on the calculated beam parameters.

6.2 Beam Parameter Measuring Device

Figure 14:
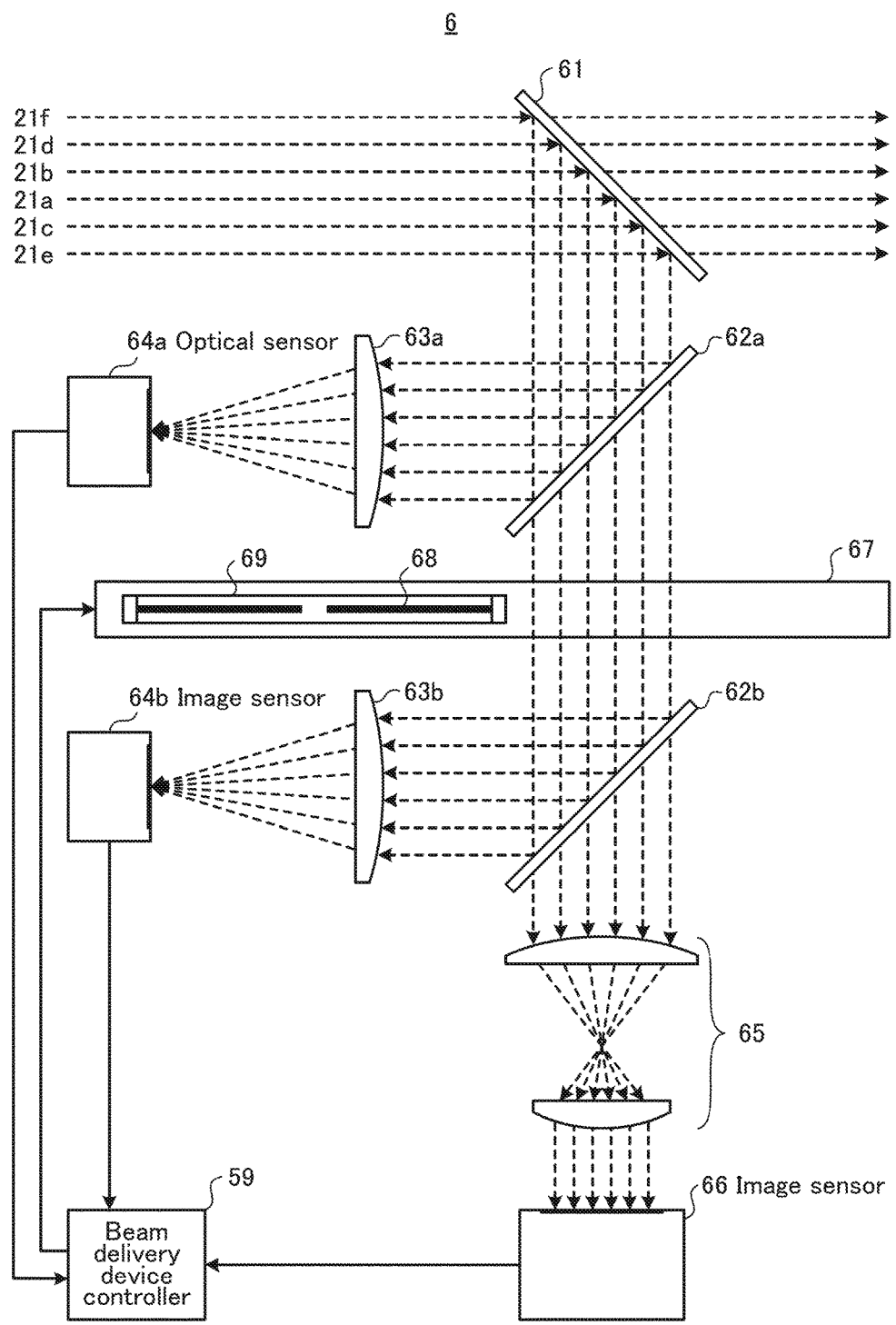
FIG. 14 shows a specific configuration of a beam parameter measuring device 6 shown in FIG. 12.

FIG. 14 shows a specific configuration of the beam parameter measuring device 6 shown in FIG. 12.

The beam parameter measuring device 6 may include beam splitters 61, 62a, and 62b, focusing optics 63a and 63b, an optical sensor 64a, an image sensor 64b, transfer optics 65, an image sensor 66, and a beam selecting mechanism 67.

FIG. 14 shows that the bundled laser beam includes the first to sixth pulse laser beams 21a to 21f; however, the bundled laser beam may include the first to eighth pulse laser beams 21a to 21h, or any plural number of pulse laser beams.

The beam splitter 61 may be provided at a light-emitting position of the beam delivery device 50. The beam splitter 61 may transmit a part of the bundled laser beam, bundled by the beam delivery device 50, at high transmittance to a first direction. The beam splitter 61 may reflect another part of the bundled laser beam to a second direction.

The beam splitter 62a may be provided in the optical path of the bundled laser beam reflected by the beam splitter 61 in the second direction. The beam splitter 62a may transmit a part of the bundled laser beam toward the beam splitter 52b. The beam splitter 62a may reflect another part of the bundled laser beam toward the focusing optics 63a.

The focusing optics 63a may concentrate the bundled laser beam, reflected by the beam splitter 62a, to a light-receiving surface of the optical sensor 54a.

The optical sensor 64a may be provided in a focal plane of the focusing optics 63a. The optical sensor 64a may be a high-speed photodiode or a photoelectric tube. The optical sensor 64a may preferably be a biplanar photo tube. The optical sensor 64a may receive the bundled laser beam concentrated by the focusing optics 63a. The optical sensor 64a may output data on pulse waveform of the bundled laser beam to the beam delivery device controller 59.

The beam delivery device controller 59 may calculate pulse width of the bundled laser beam based on the data on the pulse waveform outputted from the optical sensor 64a. The beam delivery device controller 59 may calculate pulse energy E of the bundled laser beam based on the data on the pulse waveform outputted from the optical sensor 64a.

The beam selecting mechanism 67 may include a slit plate 66 and a moving mechanism 69. The beam selecting mechanism 67 may extend over a cross section of the optical path of the bundled laser beam transmitted by the beam splitter 62a to the second direction. The moving mechanism 69 may move the slit plate 68 across the optical path axis of the bundled laser beam. The slit plate 68 may have a slit through which a single pulse laser beam of the first to sixth pulse laser beams 21a to 21f included in the bundled laser beam may pass. The moving mechanism 69 may control the position of the slit plate 58 such that a selected single pulse laser beam may pass through the beam selecting mechanism 67.

The beam splitter 62b may be provided in the optical path of the bundled laser beam or the individual pulse laser beam which passed through the beam selecting mechanism 67 to the second direction. The beam splitter 62b may transmit a part of the bundled laser beam or the individual pulse laser beam to the transfer optics 65, and reflect another part to the focusing optics 63b.

The transfer optics 65 may transfer an image of the bundled laser beam or the individual pulse laser beam, transmitted by the beam splitter 62b, to a light-receiving surface of the image sensor 66.

The image sensor 66 may output data on distribution of light intensity of the bundled laser beam or the individual pulse laser beam, transferred by the transfer optics 65, to the beam delivery device controller 59.

The beam delivery device controller 59 may calculate a centroid of the distribution of the light intensity, based on the data on the distribution of the light intensity outputted from the image sensor 66, as a beam position of the bundled laser beam or the individual pulse laser beam.

The beam delivery device controller 59 may calculate beam size in the cross section of the bundled laser beam or the individual pulse laser beam. The beam size may be calculated based on the data, outputted from the image sensor 66, on the distribution of the light intensity. The beam size in the cross section may be width of a portion having light intensity corresponding to $1/e^2$ or more of the peak intensity. In the excimer laser, beam sizes in the X direction and the Y direction may be different from each other. These beam sizes may be calculated based on the respective distributions of light intensity in the X direction and the Y direction.

The focusing optics 63b may concentrate the bundled laser beam or the individual pulse laser beam, reflected by the beam splitter 62b, to a light-receiving surface of the image sensor 64b.

The image sensor 64b may be provided in a focal plane of the focusing optics 63b. The image sensor 64b may receive the bundled laser beam or the individual pulse laser beam concentrated by the focusing optics 63b. The image sensor 64b may output data on distribution of light intensity of the bundled laser beam or the individual pulse laser beam at a light-concentration position to the beam delivery device controller 59.

The beam delivery device controller 59 may calculate a centroid of the distribution of the light intensity based on the data on the distribution of the light intensity outputted from the image sensor 64b. The beam delivery device controller 59 may divide the position of the centroid by the focal length of the focusing optics 63b to calculate travelling direction of the bundled laser beam or the individual pulse laser beam.

The beam delivery device controller 59 may calculate beam size in the cross section based on data on the distribution of light intensity outputted from the image sensor 64b. The beam delivery device controller 59 may divide the beam size in the cross section by the focal length of the focusing optics 63b to calculate beam divergence of the bundled laser beam or the individual pulse laser beam. In the excimer laser, beam divergences in the X direction and the Y direction may be different from each other. These beam divergences may be calculated based on the respective distributions of light intensity in the X direction and the Y direction.

6.3 Mirror-Moving Mechanism

Figure 15A:
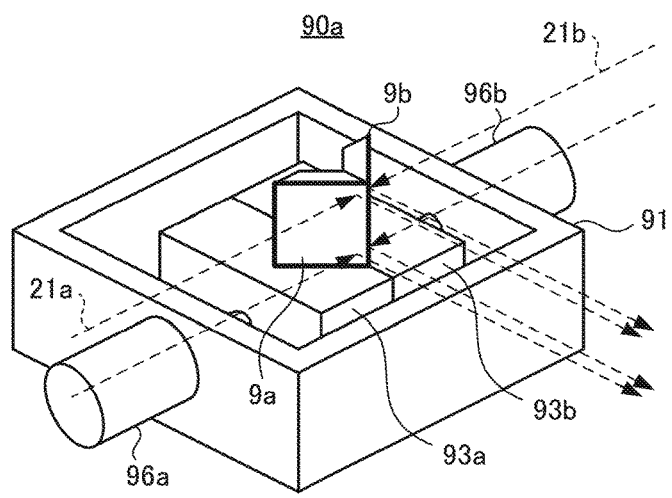
FIGS. 15A to 15C show a mirror-moving mechanism 90a for moving first and second mirrors 9a and 9b shown in FIG. 12.
Figure 15B:
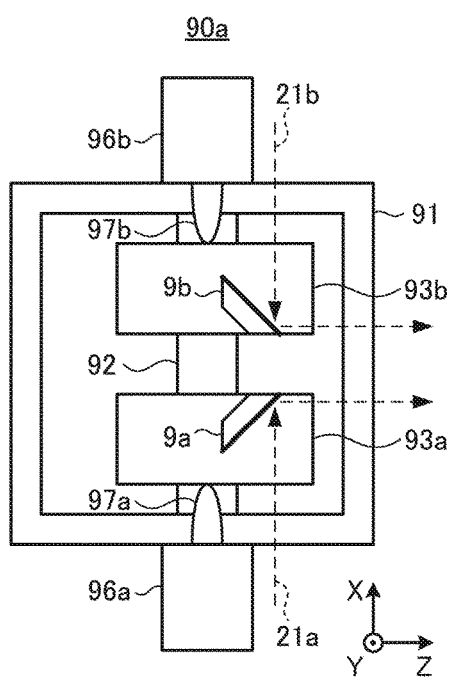
Figure 15C:
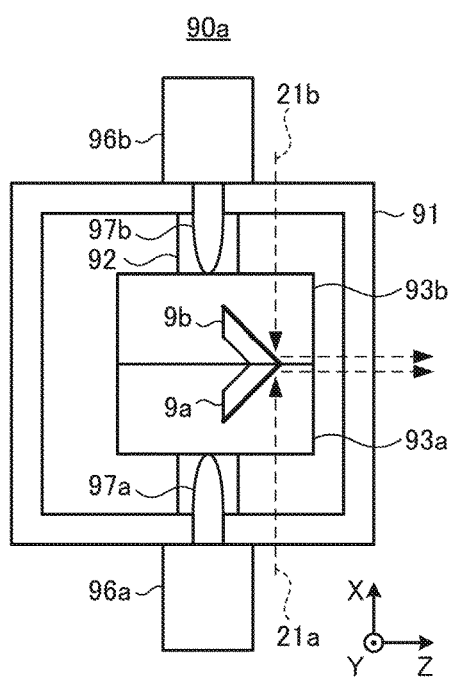

FIGS. 15A to 15C show the mirror-moving mechanism 90a for moving the first and second mirrors 9a and 9b shown in FIG. 12. FIG. 15A is a perspective view, FIG. 15B is a plan view where the gap between the mirrors is wide, and FIG. 15C is another plan view where the gap between the mirrors is narrowed.

The first mirror 9a may be movable by the mirror-moving mechanism 90a along the optical path axis of the first pulse laser beam 21a incident on the first mirror 9a. The second mirror 9b may be movable by the mirror-moving mechanism 90a along the optical path axis of the second pulse laser beam 21b incident on the second mirror 9b. Mechanisms to move the third to eighth mirrors 9c to 9h may be substantially the same as the mirror-moving mechanism 90a.

The mirror-moving mechanism 90a may include a casing 91, a linear guide 92, mirror holders 93a and 93b, and automatic micrometers 96a and 96b. The casing 91 may store the linear guide 92 and the mirror holders 93a and 93b.

The linear guide 92 may be provided such that its longitudinal direction is substantially the same with the X direction. The mirror holder 93a and 93b may hold the first and second mirrors 9a and 9b, respectively. Each of the mirror holders 93a and 93b may be attached to the linear guide 92 so as to move along the longitudinal direction of the linear guide 92. The mirror holders 93a and 93b may be forced to go away from each other by some springs (not shown).

The automatic micrometers 96a and 96b may be attached to the casing 91. Movable elements 97a and 97b of the automatic micrometers 96a and 96b may be capable of pushing the mirror holders 93a and 93b, respectively, to get close to each other.

Upon the movable element 97a being drawn out by the automatic micrometer 96a according to a driving signal outputted by the bean delivery device controller 59, the mirror holder 93a may be pushed. The mirror holder 93a may thus be moved in the X direction, and the gap between the first and second mirrors 9a and 9b may be narrowed.

Upon the movable element 97a being drawn back by the automatic micrometer 96a, the mirror holder 93a may be pushed by the springs (not shown). The mirror holder 93a may thus be moved in the −X direction.

Upon the movable element 97b being drawn out by the automatic micrometer 96b according to a driving signal outputted by the beam delivery device controller 59, the mirror holder 93b may be pushed. The mirror holder 93b may thus be moved in the −X direction, and the gap between the first and second mirrors 9a and 9b may be narrowed.

Upon the movable element 97b being drawn back by the automatic micrometer 96b, the mirror holder 93b may be pushed by the springs (not shown). The mirror holder 93b may thus be moved in the X direction.

6.4 Controlling Operation

Figure 16:
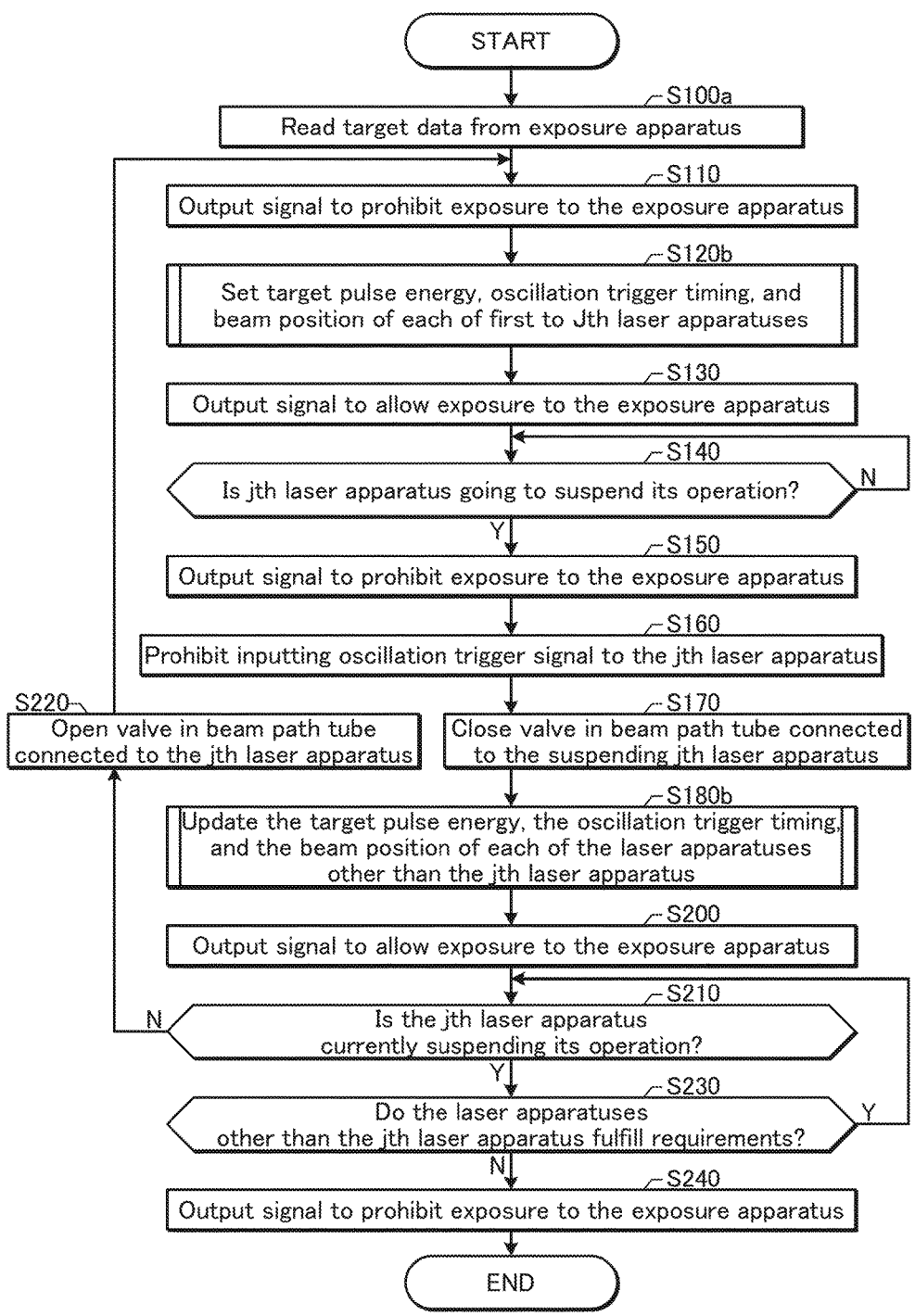
FIG. 16 is a flowchart illustrating an operation of the laser system controller 20 according to the third embodiment of the present disclosure.

FIG. 16 is a flowchart illustrating an operation of the laser system controller 20 according to the third embodiment of the present disclosure. In the third embodiment, the laser system controller 20 may perform the feedback control of the first to eighth laser apparatuses 2a to 2h based on the beam parameters measured by the beam parameter measuring device 6. The laser system controller 20 may further send a control signal to the beam delivery device controller 59 to perform the feedback control of the first to eighth beam adjusters 7a to 7h based on the beam parameters measured by the beam parameter measuring device 6. The laser system controller 20 may further send a control signal to the beam delivery device controller 59 to move the first to fourth mirror-moving mechanisms 90a to 90d.

The other aspects may be substantially the same as those in the second embodiment described above with reference to FIG. 9.

First, the processes at S100a and S110 may be substantially the same as the corresponding processes in the second embodiment described above with reference to FIG. 9.

Next, at S120b, the laser system controller 20 may set target pulse energy of each of the first to Jth laser apparatuses and oscillation trigger timing of each of the first to Jth laser apparatuses. The laser system controller 20 may further set beam position of the pulse laser beam emitted from each of the first to Jth laser apparatuses.

Figure 17:
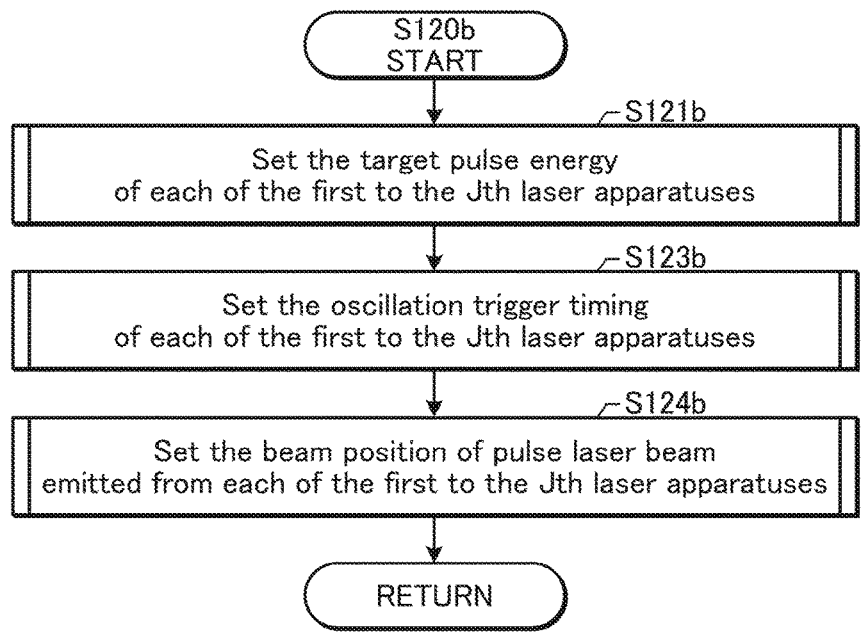
FIG. 17 is a flowchart illustrating detailed processing of S120b shown in FIG. 16.

FIG. 17 is a flowchart illustrating detailed processing of S120b shown in FIG. 16.

First, at S121b, the laser system controller 20 may set the target pulse energy of each of the first to Jth laser apparatuses by feedback control. Details of this process will be described below with reference to FIG. 19.

Next, at S123b, the laser system controller 20 may set the oscillation trigger timing of each of the first to Jth laser apparatuses by feedback control. Details of this process will be described below with reference to FIG. 21.

Next, at S124b, the laser system controller 20 may set the beam position of the pulse laser beam emitted from each of the first to Jth laser apparatuses by feedback control. Details of this process will be described below with reference to FIG. 23.

After S124b, the laser system controller 20 may terminate the processing of this flowchart to proceed to S130 in FIG. 16.

Referring back to FIG. 16, the next processes at S130 to S170 may be substantially the same as the corresponding processes in the second embodiment described above with reference to FIG. 9. As mentioned above, the jth laser apparatus may suspend its operation.

Next, at S180b, the laser system controller 20 may update the target pulse energy of each of the laser apparatuses other than the jth laser apparatus, and update the oscillation trigger timing of each of the laser apparatuses other than the jth laser apparatus. The laser system controller 20 may further update the beam position of the pulse laser beam emitted from each of the laser apparatuses other than the jth laser apparatus.

Figure 18:
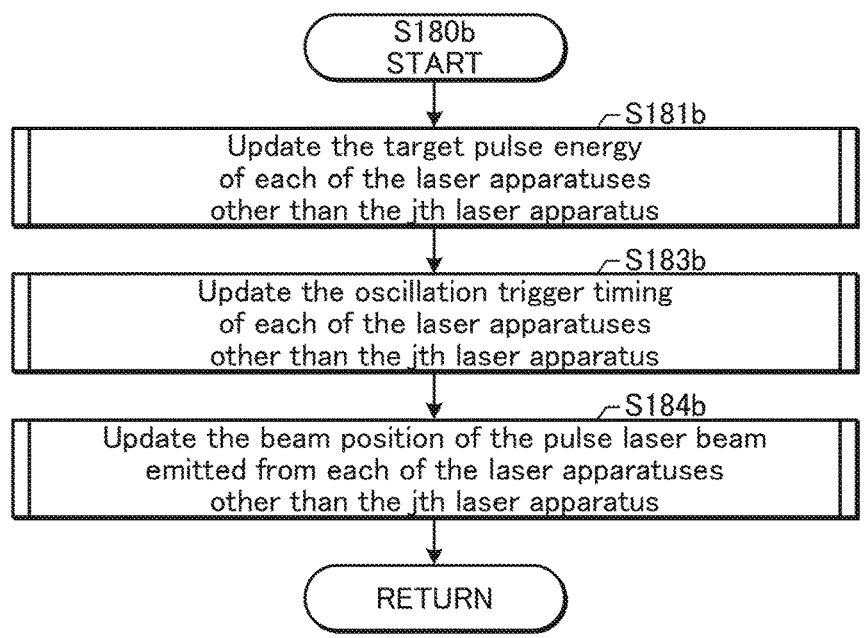
FIG. 18 is a flowchart illustrating detailed processing of S180b shown in FIG. 16.

FIG. 18 is a flowchart illustrating detailed processing of S180b shown in FIG. 16.

First, at S181b, the laser system controller 20 may update the target pulse energy of each of the laser apparatuses other than the jth laser apparatus by feedback control. Details of this process will be described below with reference to FIG. 20.

Next, at 2183b, the laser system controller 20 may update the oscillation trigger timing of each of the laser apparatuses other than the jth laser apparatus by feedback control. Details of this process will be described below with reference to FIG. 22.

Next, at S184b, the laser system controller 20 may update the beam position of the pulse laser beam emitted from each of the laser apparatuses other than the jth laser apparatus by feedback control. Details of this process will be described below with reference to FIG. 24.

After S184b, the laser system controller 20 may terminate the processing of this flowchart to proceed to S200 in FIG. 16.

Referring back to FIG. 16, the remaining processes at S200 to S240 may be substantially the same as the corresponding processes in the second embodiment described above with reference to FIG. 9.

6.5 Setting Target Pulse Energy

Figure 19:
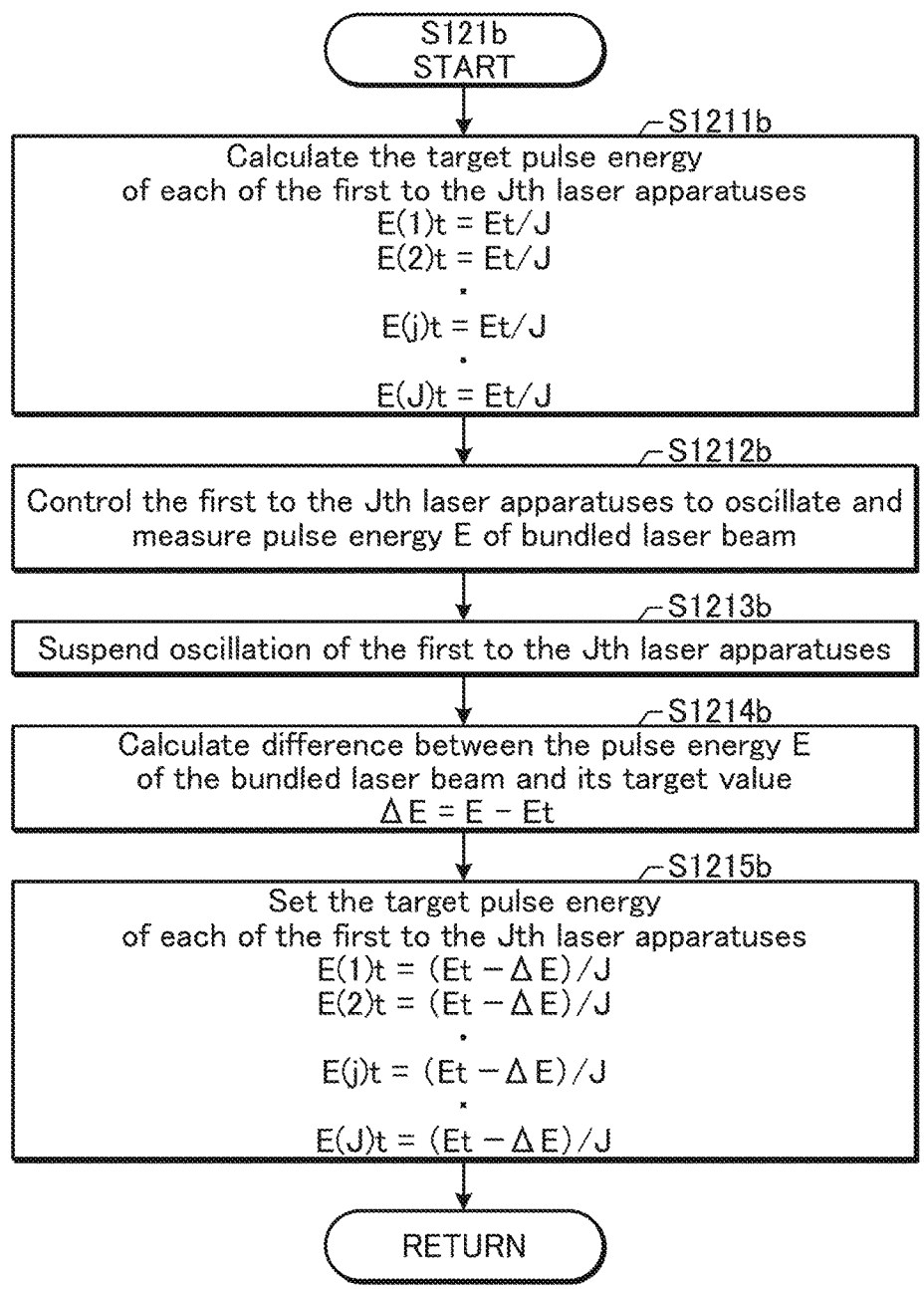
FIG. 19 is a flowchart illustrating detailed processing of setting target pulse energy of each of first to Jth laser apparatuses by feedback control shown in FIG. 17.

FIG. 19 is a flowchart illustrating detailed processing of setting target pulse energy of each of the first to Jth laser apparatuses by feedback control shown in FIG. 17. The processing shown in FIG. 19 may be performed by the laser system controller 20 as a subroutine of S121b shown in FIG. 17.

First, at S1211b, the laser system controller 20 may calculate the target pulse energy of each of the first to Jth laser apparatuses as an initial value. The value calculated here may be substantially the same as the value set at S121 in FIG. 7 or FIG. 10A.

Next, at S1212b, the laser system controller 20 may control the first to Jth laser apparatuses to oscillate and measure pulse energy E of the bundled laser beam. The pulse energy E of the bundled laser beam may be calculated based on the data on the pulse waveform outputted from the optical sensor 64a.

Next, at S1213b, the laser system controller 20 may suspend oscillation of the first to Jth laser apparatuses.

Next, at S1214b, the laser system controller 20 may calculate a difference ΔE between the pulse energy E of the bundled laser beam and its target value Et by the following formula.

$$\Delta E = E - Et$$

The target value Et may be the value received at S100a described above with reference to FIG. 9 or 16. The target value Et may be the value used at the above S1211b for calculating the target pulse energy.

Next, at S1215b, the laser system controller 20 may set the target pulse energy of each of the first to Jth laser apparatuses as follows, $$E(1)t = (Et - \Delta E)/J$$
$$E(2)t = (Et - \Delta E)/J$$
$$\ldots$$
$$E(j)t = (Et - \Delta E)/J$$
$$\ldots$$
$$E(J)t = (Et - \Delta E)/J$$

Here, E(n)t may be the target pulse energy of an nth laser apparatus. Et may be the target pulse energy of the bundled laser beam. In the above example, the target pulse energy of each of the laser apparatuses is calculated by dividing the target pulse energy Et of the bundled laser beam by the number J of the laser apparatuses. However, any other target pulse energy may be calculated for each of the laser apparatuses as long as the total pulse energy is Et.

After S1215b, the laser system controller 20 may terminate the processing of this flowchart to proceed to S123b in FIG. 17.

Figure 20:
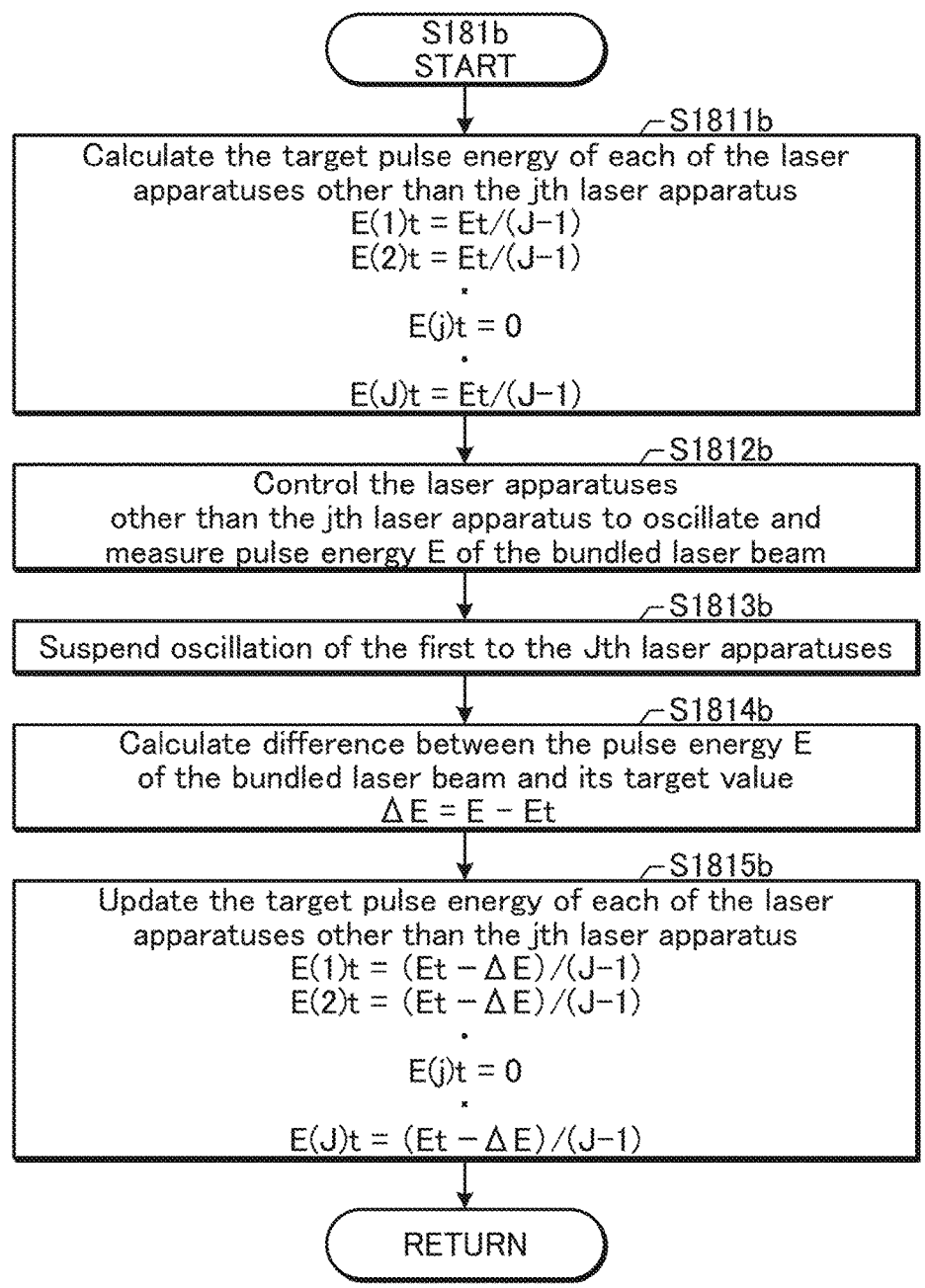
FIG. 20 is a flowchart illustrating detailed processing of updating the target pulse energy of each of the laser apparatuses other than a jth laser apparatus by feedback control shown in FIG. 18.

FIG. 20 is a flowchart illustrating detailed processing of updating the target pulse energy of each of the laser apparatuses other than the jth laser apparatus by the feedback control shown in FIG. 18. The processing shown in FIG. 20 may be performed by the laser system controller 20 as a subroutine of S181b shown in FIG. 18.

First, at S1811b, the laser system controller 20 may calculate the target pulse energy of each of the laser apparatuses other than the jth laser apparatus as an initial value. The value calculated here may be substantially the same as the value set at S181 in FIG. 8 or FIG. 11A.

Next, at S1812b, the laser system controller 20 may control the laser apparatuses other than the jth laser apparatus to oscillate and measure pulse energy E of the bundled laser beam. The pulse energy E of the bundled laser beam may be calculated based on the data on the pulse waveform outputted from the optical sensor 64a.

Next, at S1813b, the laser system controller 20 may suspend oscillation of the first to Jth laser apparatuses.

Next, at S1814b, the laser system controller 20 may calculate a difference ΔE between the pulse energy E of the bundled laser beam and its target value Et by the following formula.

$$\Delta E = E - Et$$

The target value Et may be the value received at S100a described above with reference to FIG. 9 or 16. The target value Et may be the value used at the above S1811b for calculating the target pulse energy.

Next, at S1815b, the laser system controller 20 may update the target pulse energy of each of the laser apparatuses other than the jth laser apparatus.

$$E(1)t = (Et - \Delta E)/(J-1)$$
$$E(2)t = (Et - \Delta E)/(J-1)$$
$$\ldots$$
$$E(j)t = 0$$
$$\ldots$$
$$E(J)t = (Et - \Delta E)/(J-1)$$

Here, E(n)t may be the target pulse energy of an nth laser apparatus. Et may be the target pulse energy of the bundled laser beam. In the above example, the target pulse energy of each of the laser apparatuses is calculated by dividing the target pulse energy Et of the bundled laser beam by the number J−1 of the operated laser apparatuses. However, any other target pulse energy may be calculated for each of the laser apparatuses as long as the total pulse energy is Et.

After S1815b, the laser system controller 20 may terminate the processing of this flowchart to proceed to S183b in FIG. 18.

6.6 Setting Oscillation Trigger Timing

Figure 21:
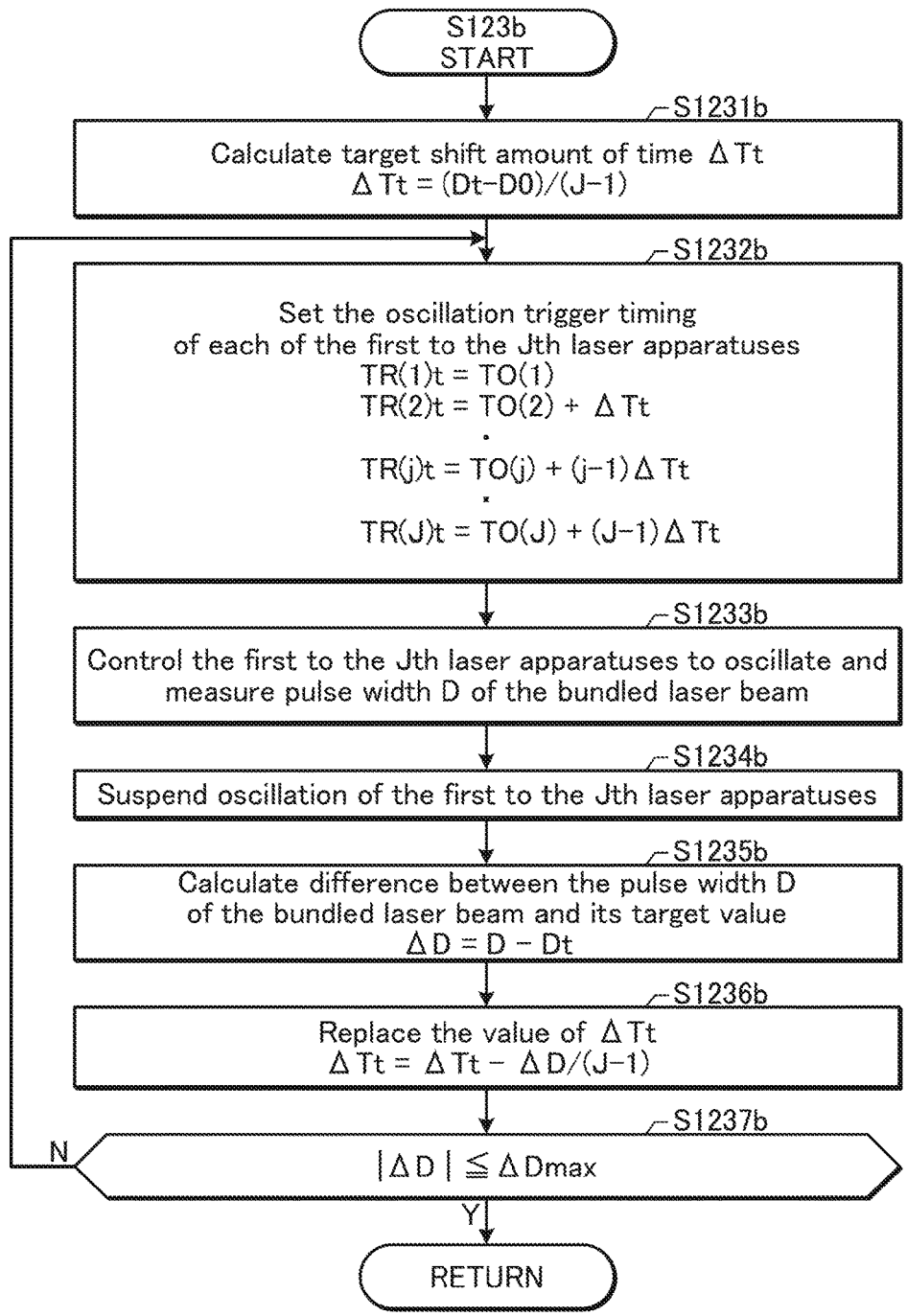
FIG. 21 is a flowchart illustrating detailed processing of setting oscillation trigger timing of each of the first to Jth laser apparatuses by feedback control shown in FIG. 17.

FIG. 21 is a flowchart illustrating detailed processing of setting the oscillation trigger timing of each of the first to Jth laser apparatuses by the feedback control shown in FIG. 17. The processing shown in FIG. 21 may be performed by the laser system controller 20 as a subroutine of S123b shown in FIG. 17.

First, at S1231b, the laser system controller 20 may calculate target shift amount of time ΔTt between the oscillation trigger timings of the laser apparatuses. The value calculated here may be substantially the same as the value set at S122a in FIG. 10A.

Next, at S1232b, the laser system controller 20 may set the oscillation trigger timing of each of the first to Jth laser apparatuses. The value set here may be calculated by substantially the same formula as the value set at S123a in FIG. 10A.

Next, at S1233b, the laser system controller 20 may control the first to Jth laser apparatuses to oscillate and measure pulse width D of the bundled laser beam. The pulse width D of the bundled laser beam may be calculated based on the data on the pulse waveform outputted from the optical sensor 64a.

Next, at S1234b, the laser system controller 20 may suspend oscillation of the first to Jth laser apparatuses.

Next, at S1235b, the laser system controller 20 may calculate a difference ΔD between the pulse width D of the bundled laser beam and its target value Dt by the following formula.

$$\Delta D = D - Dt$$

The target value Dt may be the value received at S100a described above with reference to FIG. 9 or 16. The target value Dt may be the value used at the above S1231b for calculating the target shift amount of time.

Next, at S1236b, the laser system controller 20 may replace the value of the target shift amount of time ΔTt as follows.

$$\Delta Tt = \Delta Tt - \Delta D/(J-1)$$

ΔTt in the right side of the above formula may be the current value, and ΔTt in the left side of the above formula may be a new value set by replacing the current value. The target shift amount ΔTt may thus be set such that the difference ΔD between the pulse width D of the bundled laser beam and its target value Dt approaches 0.

Next, at S1237b, the laser system controller 20 may determine whether an absolute value |ΔD| of the difference ΔD between the pulse width D of the bundled laser beam and its target value Dt is equal to or less than an acceptable limit ΔDmax.

If the absolute value |ΔD| is not equal to or less than the acceptable limit ΔDmax (S1237; NO), the laser system controller 20 may return to the above S1232b. Here, the new value of ΔTt set at S1236b may be used at S1232b.

If the absolute value |ΔD| is equal to or less than the acceptable limit ΔDmax (S1237; YES), the laser system controller 20 may terminate the processing of this flowchart to proceed to S124b in FIG. 17.

Figure 22:
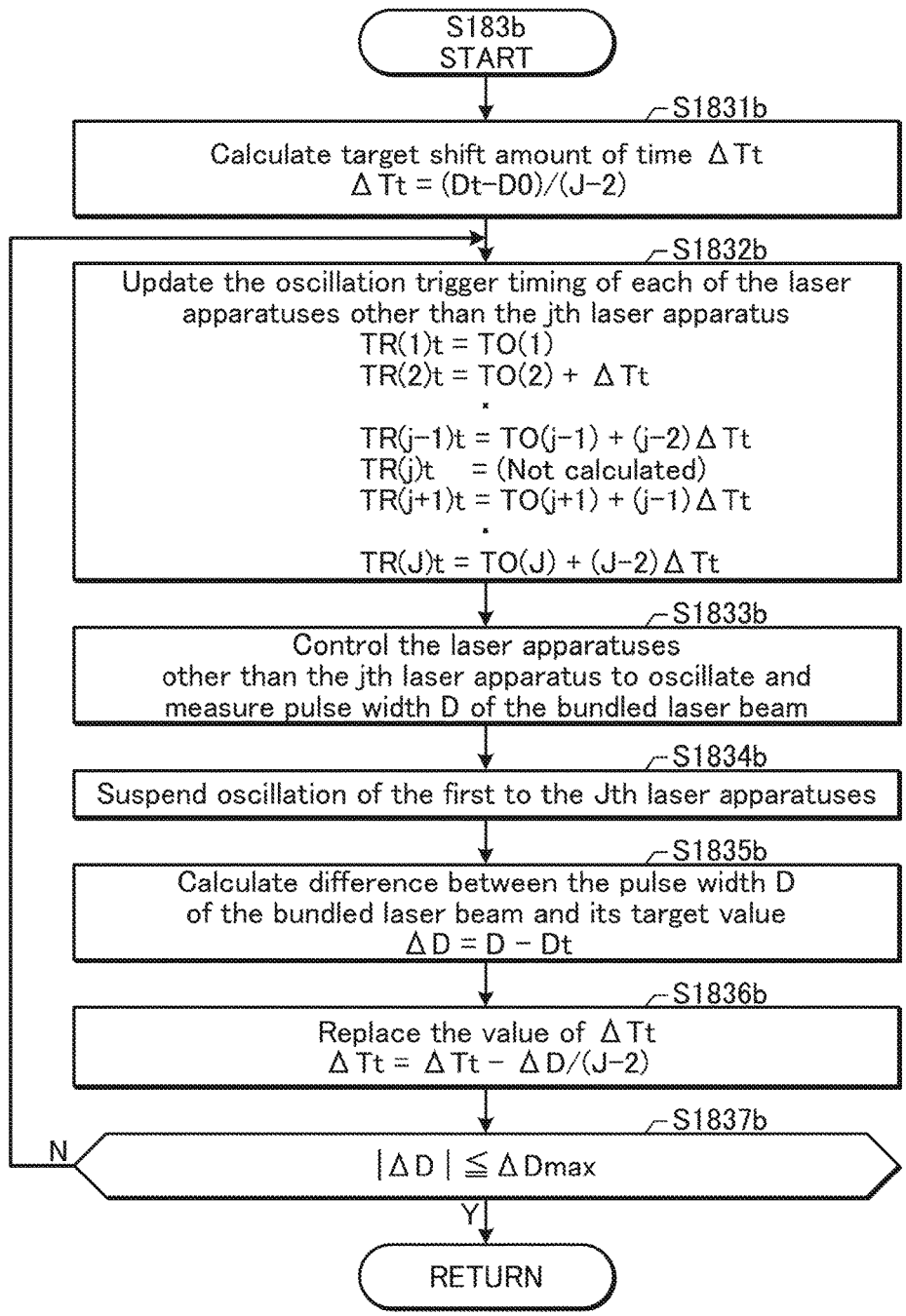
FIG. 22 is a flowchart illustrating detailed processing of updating the oscillation trigger timing of each of the laser apparatuses other than the jth laser apparatus by feedback control shown in FIG. 18.

FIG. 22 is a flowchart illustrating detailed processing of updating the oscillation trigger timing of each of the laser apparatuses other than the jth laser apparatus by the feedback control shown in FIG. 18. The processing shown in FIG. 22 may be performed by the laser system controller 20 as a subroutine of S183b shown in FIG. 18.

First, at S1831b, the laser system controller 20 may calculate target shift amount of time ΔTt between the oscillation trigger timings of the laser apparatuses. The value calculated here may be substantially the same as the value set at S182a in FIG. 11A.

Next, at S1832b, the laser system controller 20 may update the oscillation trigger timing of each of the laser apparatuses other than the jth laser apparatus. The value set here may be calculated by substantially the same formula as the value set at S183a in FIG. 11A.

Next, at S1833b, the laser system controller 20 may control the laser apparatuses other than the jth laser apparatus to oscillate and measure pulse width D of the bundled laser beam. The pulse width D of the bundled laser beam may be calculated based on the data on the pulse waveform outputted from the optical sensor 64a.

Next, at S1834b, the laser system controller 20 may suspend oscillation of the first to Jth laser apparatuses.

Next, at S1835b, the laser system controller 20 may calculate a difference ΔD between the pulse width D of the bundled laser beam and its target value Dt by the following formula.

$$\Delta D = D - Dt$$

The target value Dt may be the value received at S100a described above with reference to FIG. 9 or 16. The target value Dt may be the value used at the above S1831b for calculating the target shift amount of time.

Next, at S1836b, the laser system controller 20 may replace the value of the target shift amount of time ΔTt as follows.

$$\Delta Tt = \Delta Tt - \Delta D/(J-2)$$

ΔTt in the right side of the above formula may be the current value, and ΔTt in the left side of the above formula may be a new value set by replacing the current value. The target shift amount ΔTt may thus be set such that the difference ΔD between the pulse width D of the bundled laser beam and its target value Dt approaches 0.

Next, at S1837b, the laser system controller 20 may determine whether an absolute value |ΔD| of the difference ΔD between the pulse width D of the bundled laser beam and its target value Dt is equal to or less than an acceptable limit ΔDmax.

If the absolute value |ΔD| is not equal to or less than the acceptable limit ΔDmax (S1837; NO), the laser system controller 20 may return to the above S1832b. Here, the new value of ΔTt set at S1836b may be used at S1832b.

If the absolute value |ΔD| is equal to or less than the acceptable limit ΔDmax (S1837; YES), the laser system controller 20 may terminate the processing of this flowchart to proceed to S184b in FIG. 18.

6.7 Setting Beam Position

Figure 23:
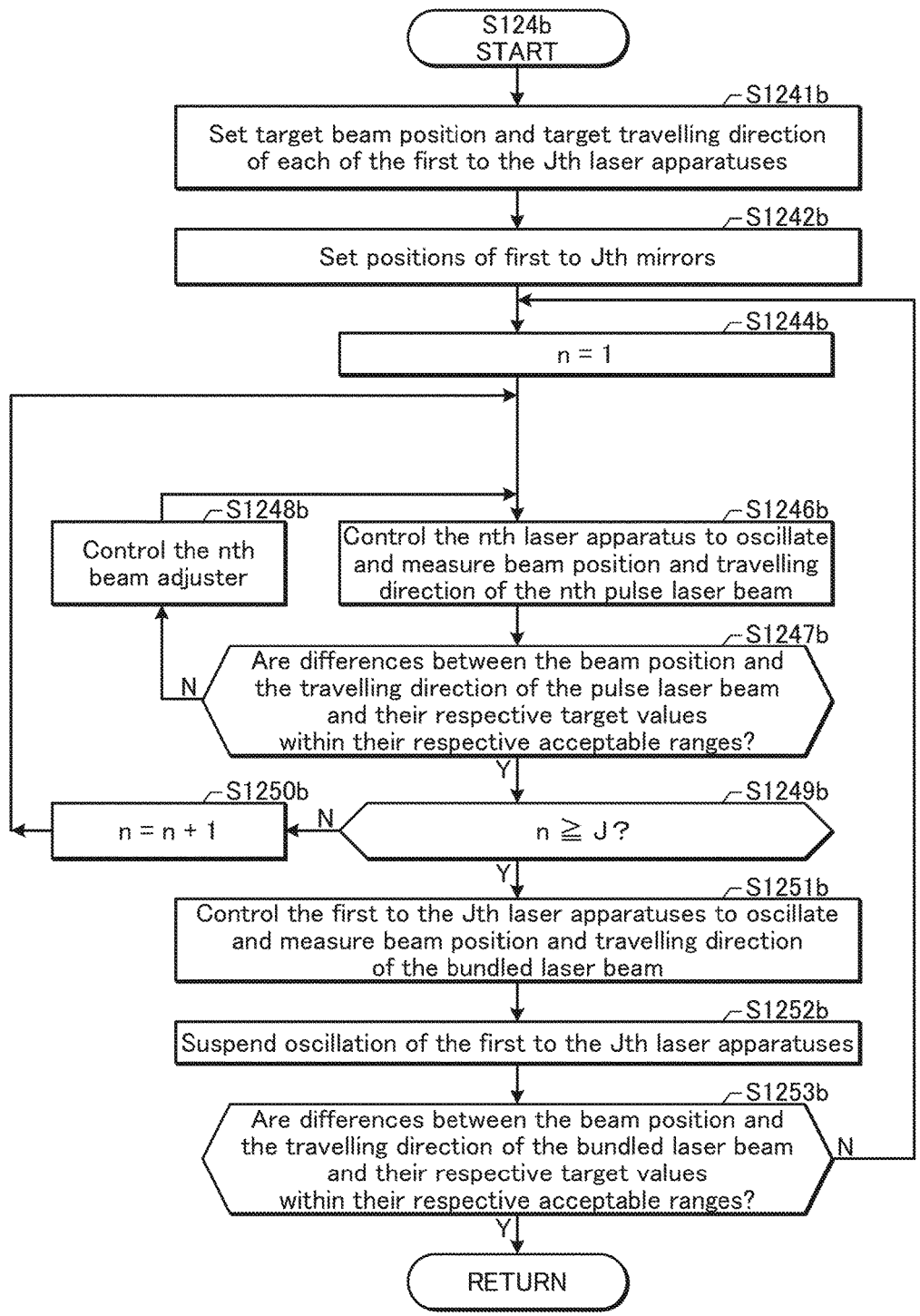
FIG. 23 is a flowchart illustrating detailed processing of setting beam position of the pulse laser beam emitted from each of the first to Jth laser apparatuses by feedback control shown in FIG. 17.

FIG. 23 is a flowchart illustrating detailed processing of setting the beam position of the pulse laser beam emitted from each of the first to Jth laser apparatuses by the feedback control shown in FIG. 17. The processing shown in FIG. 23 may be performed by the laser system controller 20 as a subroutine of S124b shown in FIG. 17.

First, at S1241b, the laser system controller 20 may set target beam position and target travelling direction of the pulse laser beam emitted from each of the first to Jth laser apparatuses. The target beam position may be set based on the number of the laser apparatuses included in the laser system 5. The target travelling direction may be set to the beam delivery direction.

Next, at S1242b, the laser system controller 20 may set positions of the first to Jth mirrors. The first to Jth mirrors may be the first to eighth mirrors 9a to 9h. The laser system controller 20 may send a control signal to the beam delivery device controller 59 to move the first to Jth mirrors to the respective positions having been set.

The position of each of the first to Jth mirrors may be set, as shown in FIG. 3 for example, such that the first to sixth pulse laser beams 21a to 21f may pass between the seventh and eighth mirrors 9g and 9h, the first to fourth pulse laser beams 21a to 21d may pass between the fifth and sixth mirrors 9e and 9f, and the first and second pulse laser beams 21a and 21b may pass between the third and fourth mirrors 9c and 9d.

Next, at S1244b, the laser system controller 20 may set a value of a counter n to 1. The counter n may designate one of the first to Jth laser apparatuses. The value of the counter n may be one of integers in a range from 1 to J.

Next, at S1246b, the laser system controller 20 may control the nth laser apparatus to oscillate and measure the beam position and the travelling direction of the nth pulse laser beam. The beam position of the nth pulse laser beam may be calculated based on the data on the distribution of the light intensity outputted from the image sensor 66. The travelling direction of the nth pulse laser beam may be calculated based on the data on the distribution of the light intensity outputted from the image sensor 64b. The laser system controller 20 may control the nth laser apparatus to suspend its operation.

Next, at S1247b, the laser system controller 20 may determine whether a difference between the beam position of the nth pulse laser beam and its target value is within an acceptable range. The laser system controller 20 may further determine whether a difference between the travelling direction of the nth pulse laser beam and its target value is within an acceptable range.

If the differences between the beam position and the travelling direction of the nth pulse laser beam and their respective target values are not within the respective acceptable ranges (S1247b; NO), the laser system controller 20 may control at S1248b the nth beam adjuster such that the beam position and the travelling direction of the nth pulse laser beam approach the respective target values. The nth beam adjuster may be one of the first to eighth beam adjusters 7a to 7h.

After S1248b, the laser system controller 20 may return to the above S1246b to measure the beam position and the travelling direction of the nth pulse laser beam.

If the differences between the beam position and the travelling direction of the nth pulse laser beam and their respective target values are within the respective acceptable ranges (S1247b; YES), the laser system controller 20 may determine at S1249b whether the value of the counter n is equal to or more than the maximum value J.

If the value of the counter n is not equal to or more than the maximum value J (S1249b; NO), the laser system controller 20 may add 1 to the value of the counter n at S1250b to update the counter n. After S1250b, the laser system controller 20 may return to the above S1246b to measure the beam position and the travelling direction of the nth pulse laser beam for a new value of the counter n.

If the value of the counter n is equal to or more than the maximum value J (S1249b; YES), the laser system controller 20 may control at S1251b the first to Jth laser apparatuses to oscillate and measure the beam position and the travelling direction of the bundled laser beam. The beam position of the bundled laser beam may be calculated based on the data on the distribution of light intensity outputted from the image sensor 66. The travelling direction of the bundled laser beam may be calculated based on the data on the distribution of light intensity outputted from the image sensor 64b.

Next, at S1252b, the laser system controller 20 may suspend oscillation of the first to Jth laser apparatuses.

Next, at S1253b, the laser system controller 20 may determine whether the differences between the beam position and the travelling direction of the bundled laser beam and their respective target values are within their respective acceptable ranges.

If the differences between the beam position and the travelling direction of the bundled laser beam and their respective target values are not within their respective acceptable ranges (S1253b; NO), the laser system controller 20 may return to the above S1244b to measure the beam position and the travelling direction of the individual pulse laser beam.

In FIG. 23, the first to Jth laser apparatuses are controlled to oscillate one by one to measure the beam parameters. However, next to S1242b, all of the first to Jth laser apparatuses may receive oscillation trigger. The beam selecting mechanism 67 of the beam parameter measuring device 6 may then be controlled to select a laser beam to be measured to measure the beam parameters of the laser beams one by one. When the beam parameters of the bundled laser beam are measured, the slit plate 68 may be moved to the position as shown in FIG. 14.

If the differences between the beam position and the travelling direction of the bundled laser beam and their respective target values are within their respective acceptable ranges (S1253b; YES), the laser system controller 20 may terminate the processing of this flowchart to proceed to S130 in FIG. 16.

Figure 24:
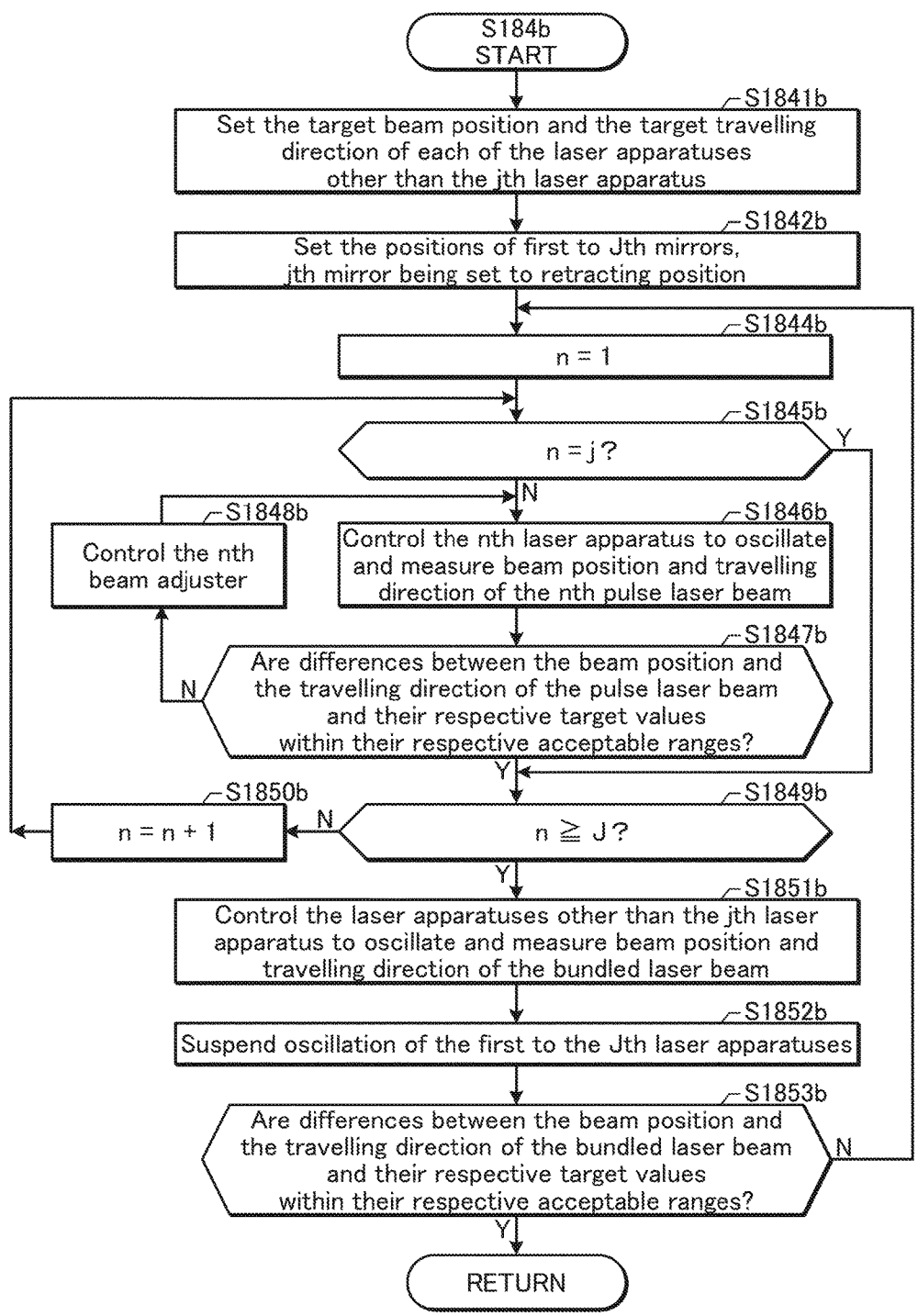
FIG. 24 is a flowchart illustrating detailed processing of updating beam position of the pulse laser beam emitted from each of the laser apparatuses other than the jth laser apparatus by feedback control shown in FIG. 18.

FIG. 24 is a flowchart illustrating detailed processing of updating the beam position of the pulse laser beam emitted from each of the laser apparatuses other than the jth laser apparatus by the feedback control shown in FIG. 18. The processing shown in FIG. 24 may be performed by the laser system controller 20 as a subroutine of S184b shown in FIG. 18.

First, at S1841b, the laser system controller 20 may set target beam position and target travelling direction of the pulse laser beam emitted from each of the laser apparatuses other than the jth laser apparatus. The target beam position may be set based on the number of laser apparatuses in the laser system 5 other than the suspending laser apparatuses. The travelling direction may be set to the beam delivery direction.

Next, at S1842b, the laser system controller 20 may set positions of the first to Jth mirrors. The first to Jth mirrors may be the first to eighth mirrors 9a to 9h. The laser system controller 20 may send a control signal to the beam delivery device controller 59 to move the first to Jth mirrors to the respective positions having been set.

The position of each of the first to Jth mirrors may be set, as shown in FIG. 12 for example, such that the sixth and eighth mirrors 9f and 9h approach the optical path axis of the bundled laser beam when the fourth laser apparatus 2d suspends its operation. The fourth mirror 9d may go away from the optical path axis of the bundled laser beam when the fourth laser apparatus 2d suspends its operation.

Next, at S1844b, the laser system controller 20 may set a value of a counter n to 1. The counter n may designate one of the first to Jth laser apparatuses. The value of the counter n may be one of integers in a range from 1 to J.

Next, at S1845b, the laser system controller 20 may determine whether the value of the counter n is equal to the value of j.

If n is equal to j (S1845b; YES), the laser system controller 20 may skip below-mentioned S1846b-S1848b to proceed to S1849b. The laser system controller 20 does not have to measure the beam position and the travelling direction of the jth laser apparatus or to control the beam adjuster.

If n is not equal to j (S1845b; NO), the laser system controller 20 may control at S1846b the nth laser apparatus to oscillate and measure the beam position and the travelling direction of the nth pulse laser beam. The beam position of the nth pulse laser beam may be calculated based on the data on the distribution of light intensity outputted from the image sensor 66. The travelling direction of the nth pulse laser beam may be calculated based on the data on the distribution of light intensity outputted from the image sensor 64b. The laser system controller 20 may then suspend oscillation of the nth laser apparatus.

Next, at S1847b, the laser system controller 20 may determine whether differences between the beam position and the travelling direction of the nth pulse laser beam and their respective target values are within their respective acceptable ranges.

If the differences between the beam position and the travelling direction of the nth pulse laser beam and their respective target values are not within their respective acceptable ranges (S1847b; NO), the laser system controller 28 may control at S1848b the nth beam adjuster such that the beam position and the travelling direction of the nth pulse laser beam approach the respective target values. The nth beam adjuster may be one of the first to eighth beam adjusters 7a to 7h.

After S1848b, the laser system controller 20 may return to the above S1846b to measure the beam position and the travelling direction of the nth pulse laser beam.

If the differences between the beam position and the travelling direction of the nth pulse laser beam and their respective target values are within their respective acceptable ranges (S1847b; YES), the laser system controller 20 may determine at S1849b whether the value of the counter n is equal to or more than the maximum value J.

If the value of the counter it is not equal to r more than the maximum value J (S1849b; NO), the laser system controller 20 may add 1 to the value of the counter it at S1850b to update the counter n. After S1850b, the laser system controller 20 may return to the above S1845b.

If the value of the counter n is equal to or more than the maximum value J (S1849b; YES), the laser system controller 20 may control at S1851b the laser apparatuses other than the jth laser apparatus to oscillate and measure the beam position and the travelling direction of the bundled laser beam. The beam position of the bundled laser beam may be calculated based on the data on the distribution of light intensity outputted from the image sensor 66. The travelling direction of the bundled laser beam may be calculated based on the data on the distribution of light intensity outputted from the image sensor 64b.

Next, at S1852b, the laser system controller 20 may suspend oscillation of the first to Jth laser apparatuses.

Next, at S1853b, the laser system controller 20 may determine whether the differences between the beam position and the travelling direction of the bundled laser beam and their respective target values are within their respective acceptable ranges.

If the differences between the beam position and the travelling direction of the bundled laser beam and their respective target values are not within their respective acceptable ranges (S1853b; NO), the laser system controller 20 may return to the above S1844b to measure the beam position and the travelling direction of the individual pulse laser beam.

If the differences between the beam position and the travelling direction of the bundled laser beam and their respective target values are within their respective acceptable ranges (S1853b; YES), the laser system controller 20 may terminate the processing of this flowchart to proceed to S200 in FIG. 16.

7. Fourth Embodiment

7.1 Overall Configuration

Figure 25:
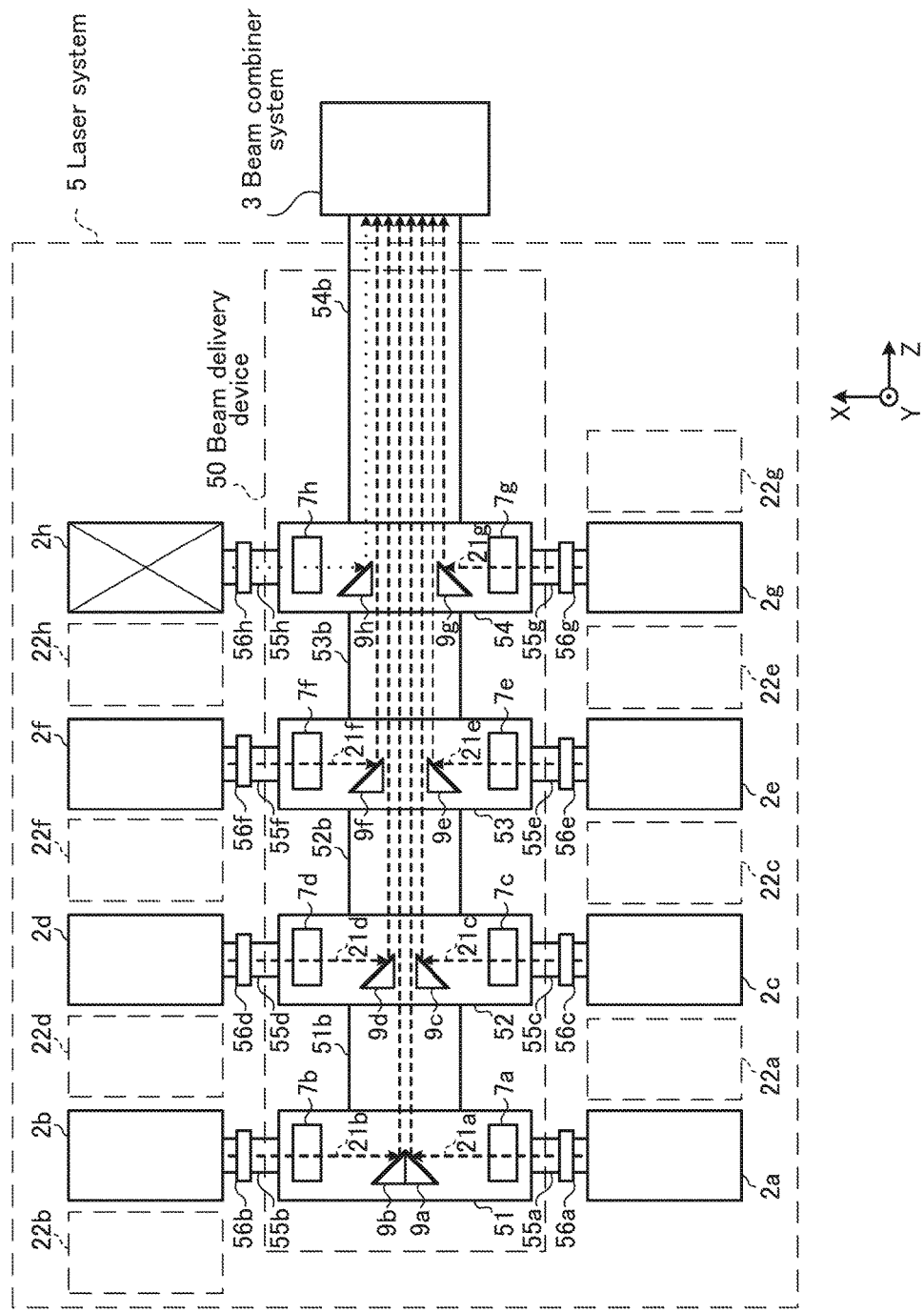
FIG. 25 schematically shows a configuration of a laser system according to the fourth embodiment of the present disclosure.
Figure 26:
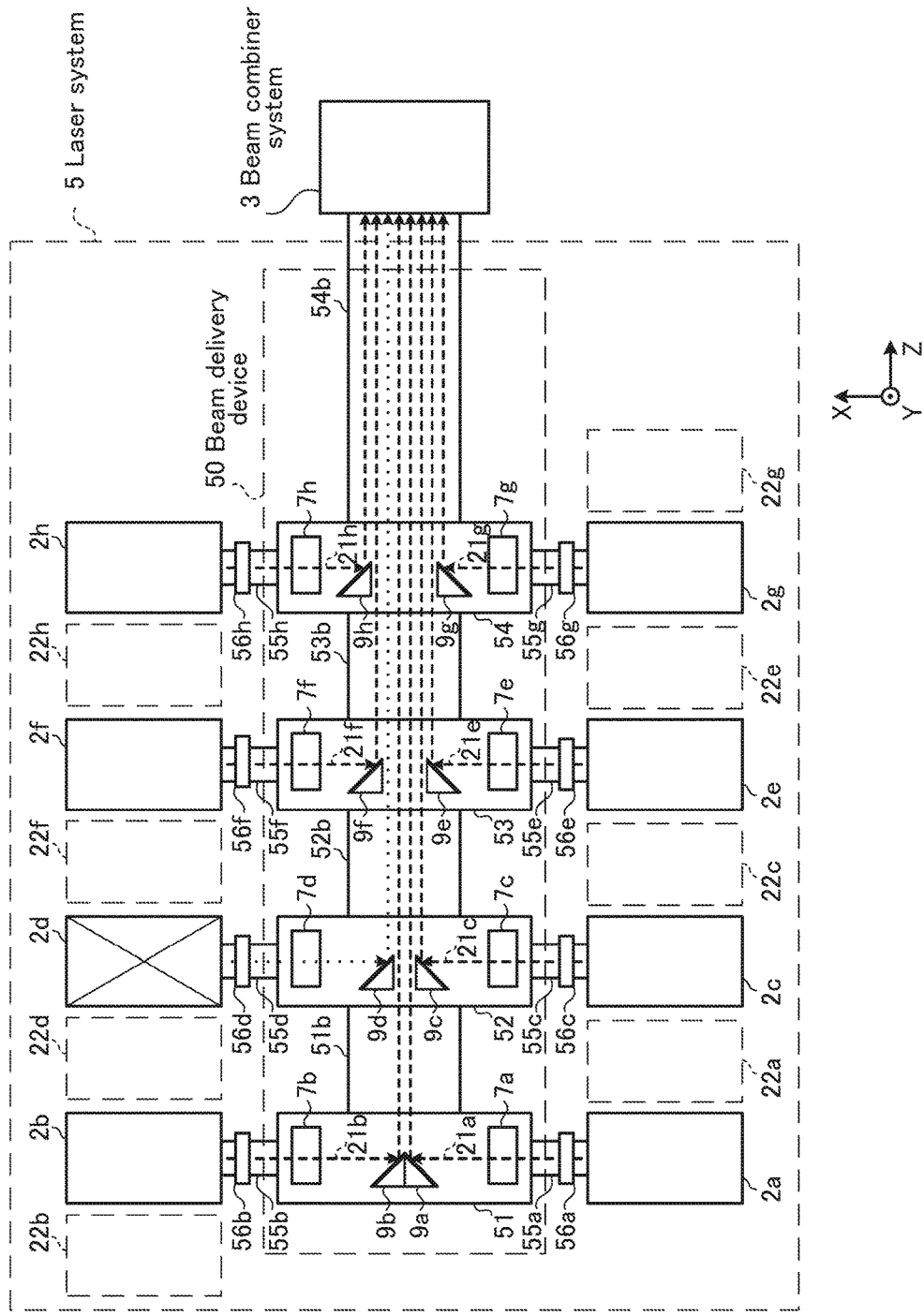
FIG. 26 schematically shows a configuration of the laser system according to the fourth embodiment of the present disclosure.

FIGS. 25 and 26 schematically show a configuration of a laser system according to a fourth embodiment of the present disclosure. In FIG. 25, the eighth laser apparatus 2h may be provided as a back-up laser apparatus. In the fourth embodiment, the first to seventh laser apparatuses 2a to 2g may be in operation and the eighth laser apparatus 2h may be suspending its operation in normal.

As shown in FIG. 26, if, for example, the fourth laser apparatus 2d is going to suspend its operation, the eighth laser apparatus 2h may be operated in return. The beam parameters of the bundled laser beam may then be stabilized.

The eighth laser apparatus 2h, as well as the first to seventh laser apparatuses 2a to 2g, may be positioned in relation to the position of the beam delivery device 50. Time required to start using the eighth laser apparatus 2h may be short when, for example, the fourth laser apparatus 2d is going to suspend its operation.

The other configurations may be substantially the same as those in the first embodiment described above with reference to FIGS. 3A and 4A.

7.2 Controlling Operation

Figure 27:
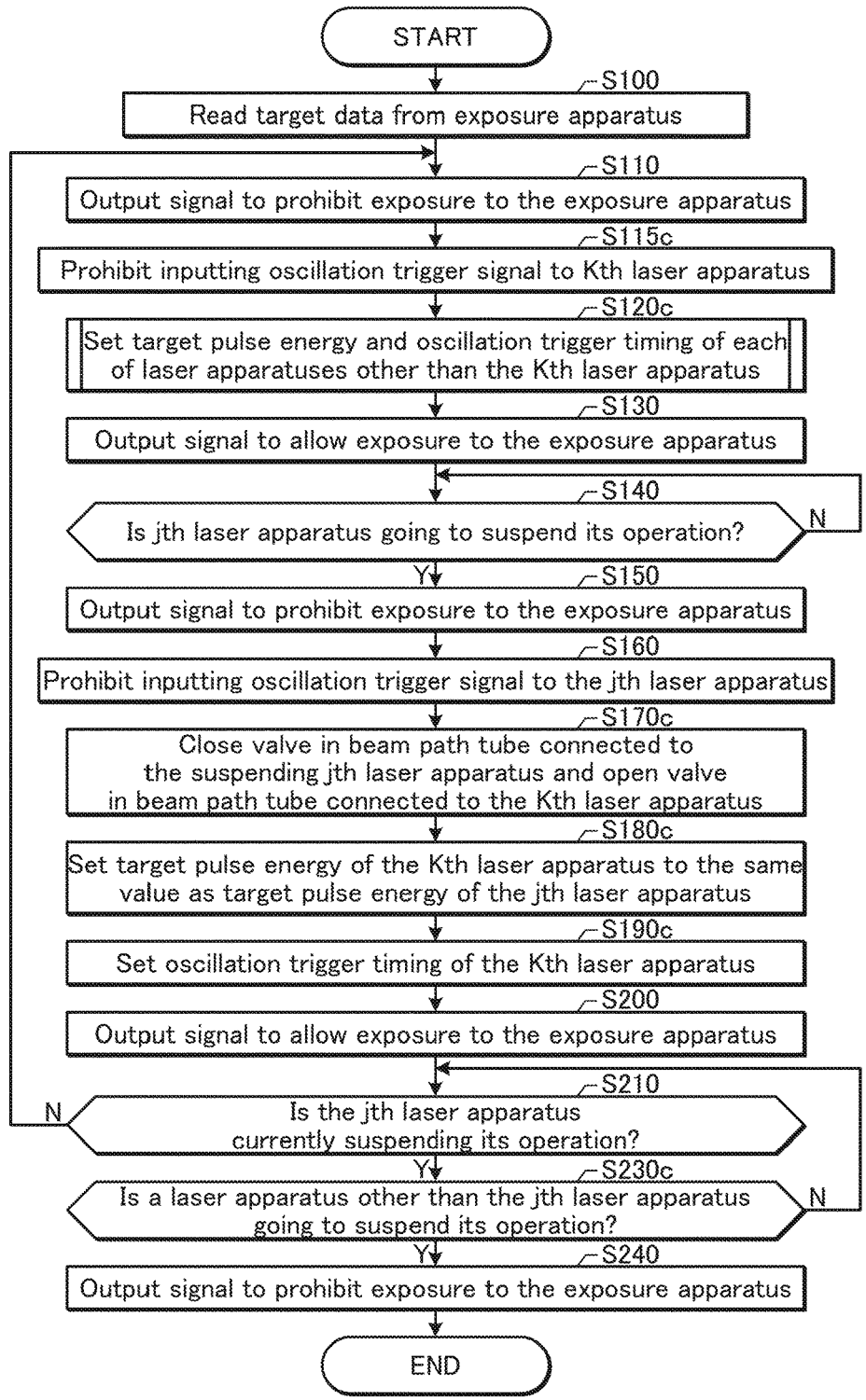
FIG. 27 is a flowchart illustrating an operation of a laser system controller 20 according to the fourth embodiment of the present disclosure.

FIG. 27 is a flowchart illustrating an operation of a laser system controller 20 according to the fourth embodiment of the present disclosure. In the fourth embodiment, the laser system controller 20 may suspend operation of a Kth laser apparatus in normal. If a jth laser apparatus is going to suspend its operation, the Kth laser apparatus may then be operated in return.

The other aspects may be substantially the same as those in the first embodiment described above with reference to FIG. 6.

First, the processes at S100 and S110 may be substantially the same as the processes in the first embodiment described with reference to FIG. 6.

Next, at S115c, the laser system controller 20 may prohibit inputting an oscillation trigger signal to the Kth laser apparatus.

Next, at S120c, the laser system controller 20 may set target pulse energy of each of the laser apparatuses other than the Kth laser apparatus and oscillation trigger timing of each of the laser apparatuses other than the Kth laser apparatus. Details of this process will be described below with reference to FIG. 28.

The next processes at S130 to S160 may be substantially the same as the corresponding processes in the first embodiment described above with reference to FIG. 6. The jth laser apparatus may suspend its operation as described above.

Next, at S170c, the laser system controller 20 may send a control signal to the beam delivery device controller 59 to close the valve in the beam path tube connected to the suspending jth laser apparatus. The laser system controller 20 may further send a control signal to the beam delivery device controller 59 to open the valve in the beam path tube connected to the back-up Kth laser apparatus.

Next, at S180c, the laser system controller 20 may set target pulse energy of the Kth laser apparatus to a value substantially the same as target pulse energy of the jth laser apparatus. Target pulse energy for each of the other laser apparatuses does not have to be changed.

Next, at S190c, the laser system controller 20 may set oscillation trigger timing of the Kth laser apparatus. The oscillation trigger timing of the Kth laser apparatus may be calculated based on required time from the time when the oscillation trigger signal is given to the Kth laser apparatus to the time when the pulse laser beam is emitted from the laser system 5. The oscillation trigger timing of the Kth laser apparatus may be set such that the pulse laser beams emitted from the laser apparatuses other than the jth laser apparatus are simultaneously emitted from the laser system 5.

The next processes at S200 and S210 may be substantially the same as the corresponding processes in the first embodiment described above with reference to FIG. 6. At S210, the laser system controller 20 may determine whether the jth laser apparatus is currently suspending its operation.

If the jth laser apparatus is currently suspending its operation (S210; YES), the laser system controller 20 may proceed to S230c. At S230c, the laser system controller 20 may determine whether one of the laser apparatuses other than the jth laser apparatus is going to suspend its operation.

If no laser apparatus other than the jth laser apparatus is going to suspend its operation (S230c; NO), the laser system controller 20 may return to the above S210.

If one of the laser apparatuses other than the jth laser apparatus is going to suspend its operation (S230c; YES), the laser system controller 20 may proceed to S240. The process at S240 may be substantially the same as the corresponding process in the first embodiment described above with reference to FIG. 6.

At the above S210, if the jth laser apparatus is capable of resuming its operation by, for example, completing the maintenance, the laser system controller 20 may determine that the jth laser apparatus is not currently suspending its operation. If the jth laser apparatus is not currently suspending its operation (S210; NO), the laser system controller 20 may return to the above S110. The Kth laser apparatus may then suspend its operation to standby for back-up use and the jth laser apparatus may be operated in return.

7.3 Setting Target Pulse Energy and Oscillation Trigger Timing

Figure 28:
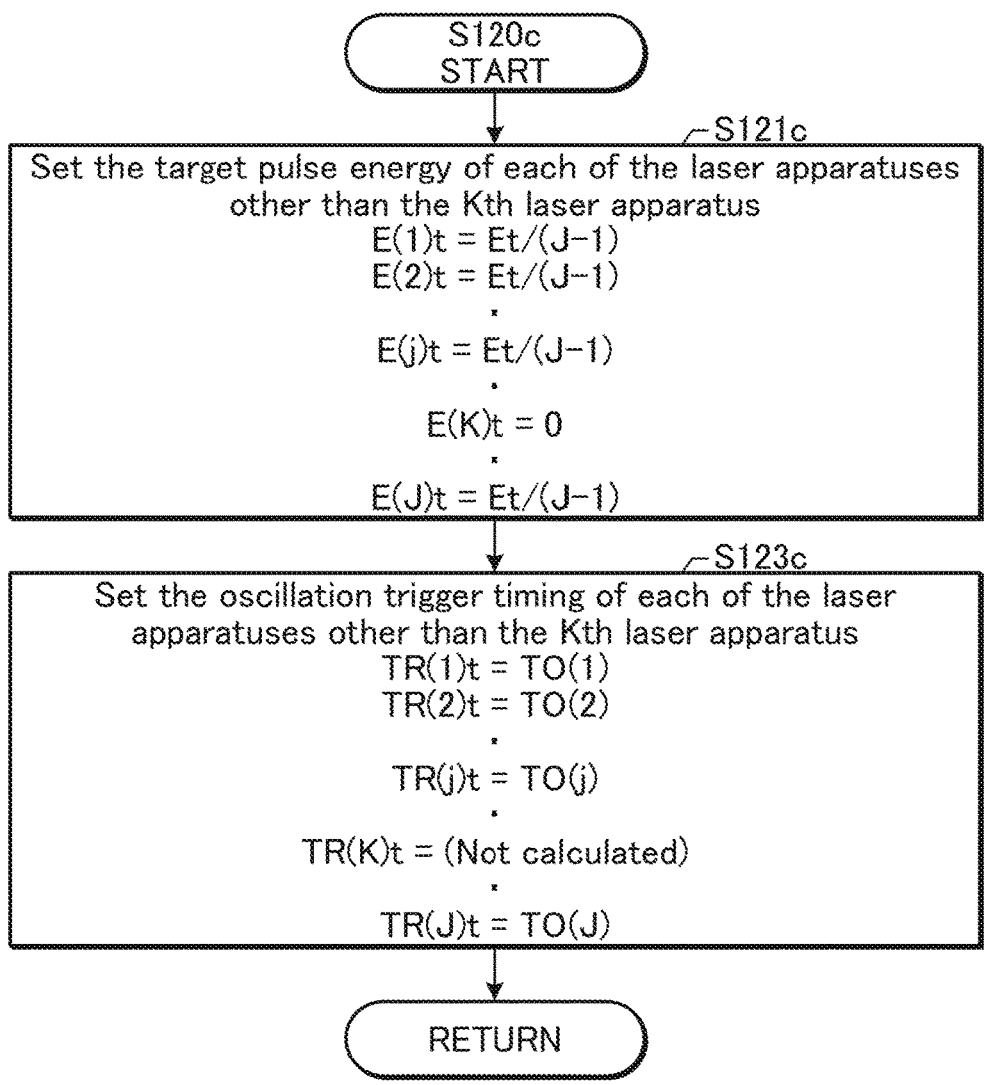
FIG. 28 is a flowchart illustrating detailed processing of setting target pulse energy and oscillation trigger timing of each of the laser apparatuses other than a Kth laser apparatus shown in FIG. 27.

FIG. 28 is a flowchart illustrating detailed processing of setting the target pulse energy and the oscillation trigger timing of each of the laser apparatuses other than the Kth laser apparatus shown in FIG. 27. The processing shown in FIG. 28 may be performed by the laser system controller 20 as a subroutine of S120c shown in FIG. 27.

First, at S121c, the laser system controller 20 may set target pulse energy of each of the laser apparatuses other than the Kth laser apparatus as follows.

$$E(1)t = Et/(J-1)$$
$$E(2)t = Et/(J-1)$$
$$\ldots$$
$$E(j)t = Et/(J-1)$$
$$\ldots$$
$$E(K)t = 0$$
$$\ldots$$
$$E(J)t = Et/(J-1)$$

Here, E(n)t may be the target pulse energy of an nth laser apparatus. Et may be the target pulse energy of the bundled laser beam. In the above example, the target pulse energy of each of the laser apparatuses is calculated by dividing the target pulse energy Et of the bundled laser beam by the number J−1 of the operated laser apparatuses. However, any other target pulse energy may be calculated for each of the laser apparatuses as long as the total pulse energy is Et.

Next, at 2123c, the laser system controller 20 may set oscillation trigger timing of each of the laser apparatuses other than the Kth laser apparatus as follows.

$$TR(1)t = TO(1)$$
$$TR(2)t = TO(2)$$
$$\ldots$$
$$TR(j)t = TO(j)$$
$$\ldots$$
$$TR(K)t = \text{(Not calculated)}$$
$$\ldots$$
$$TR(J)t = TO(J)$$

Here, TR(n)t may be the oscillation trigger timing of the nth laser apparatus. TO(n) may be the oscillation trigger timing to be set for the nth laser apparatus such that the pulse laser beams are simultaneously emitted from the laser system 5. TO(n) may be a value to be calculated based on required time from the time when the oscillation trigger signal is given to the nth laser apparatus to the time when the pulse laser beam is emitted from the laser system 5.

After S123c, the laser system controller 20 may terminate the processing of this flowchart to proceed to S130 in FIG. 27.

8. Fifth Embodiment

8.1 Overall Configuration

Figure 29:
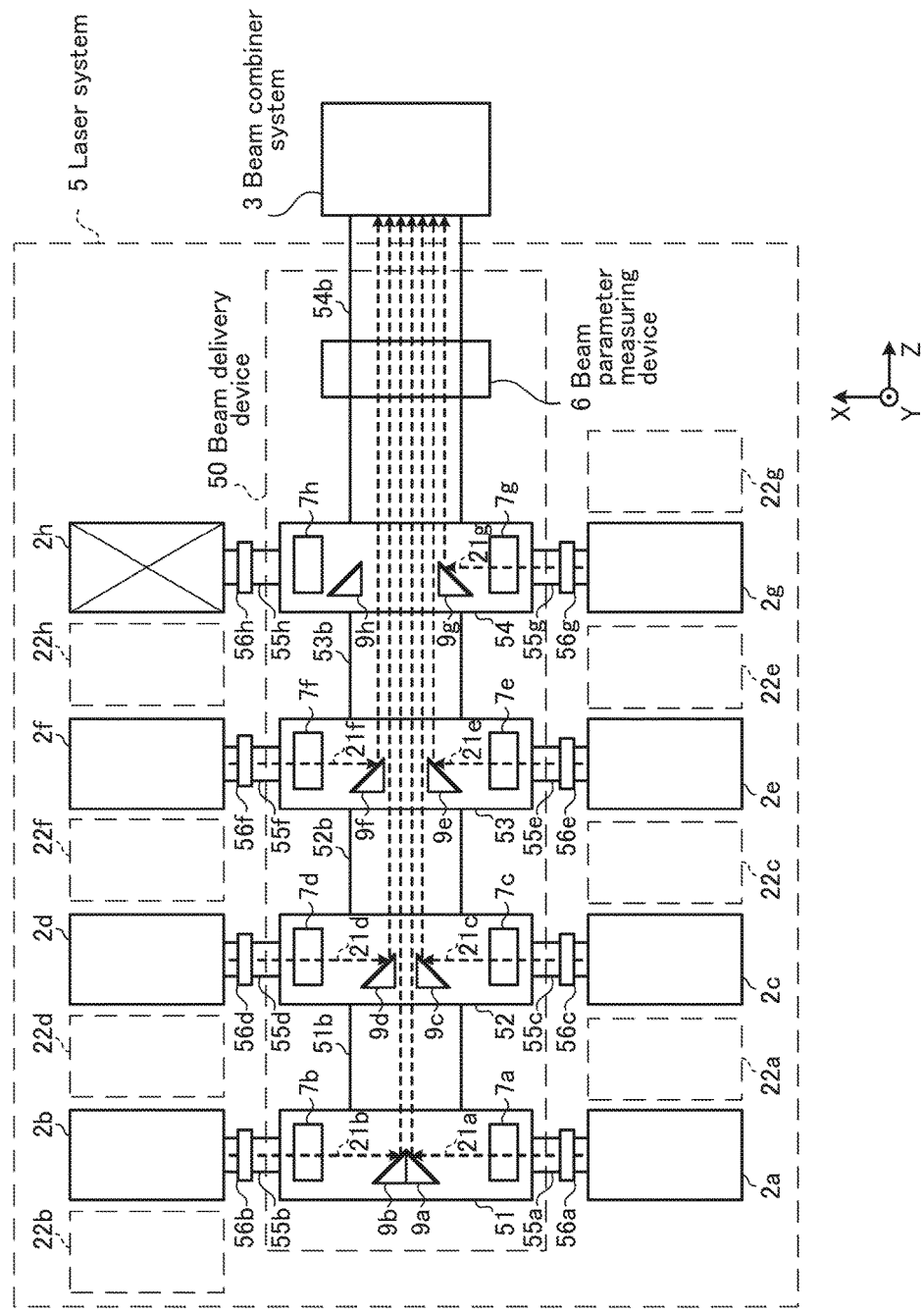
FIG. 29 schematically shows a configuration of a laser system according to a fifth embodiment of the present disclosure.
Figure 30:
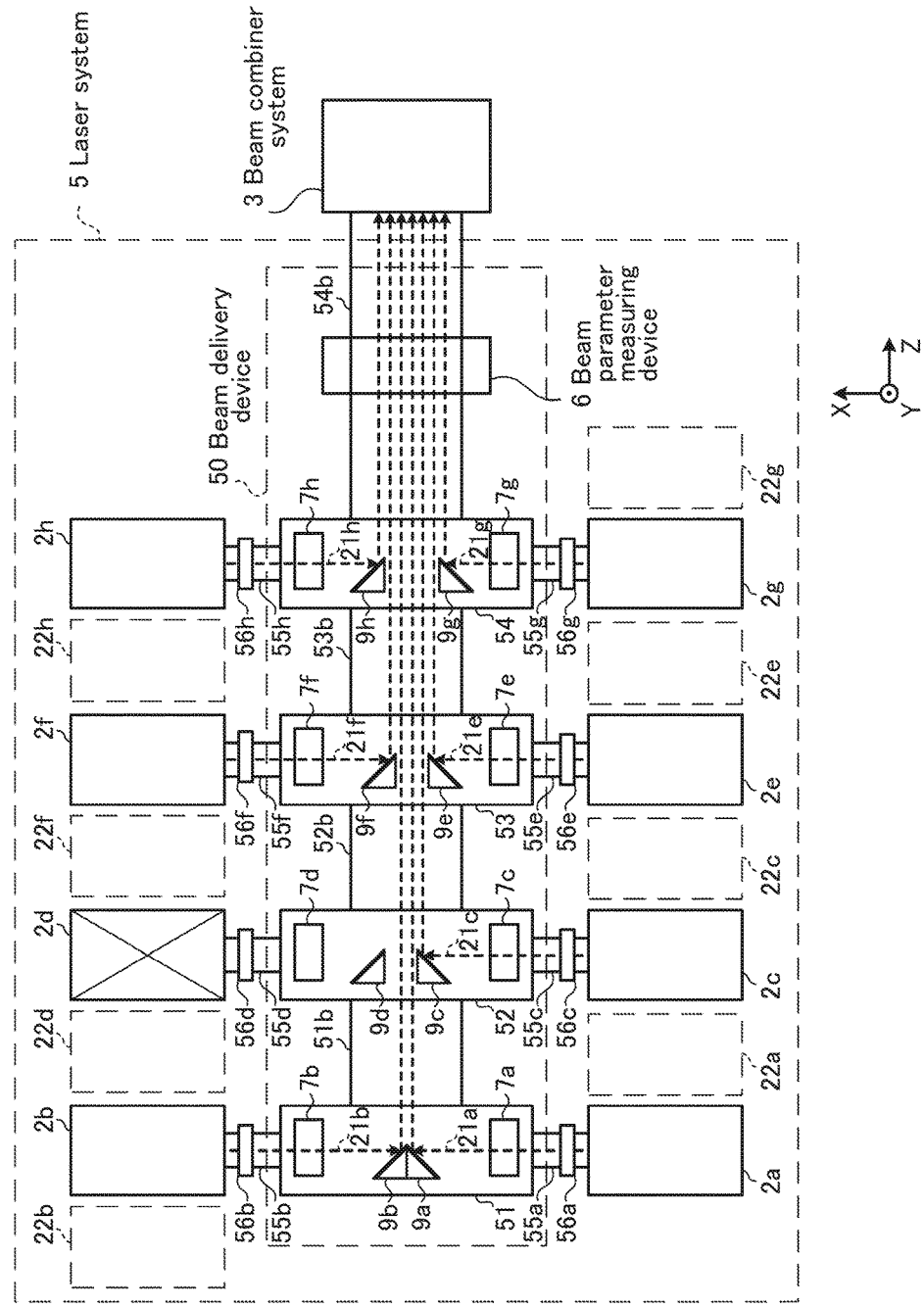
FIG. 30 schematically shows a configuration of the laser system according to the fifth embodiment of the present disclosure.

FIGS. 29 and 30 schematically show a configuration of a laser system according to a fifth embodiment of the present disclosure. In FIG. 29, the first to seventh laser apparatuses 2a to 2g may be in operation and the eighth laser apparatus 2h may be suspending its operation. As shown in FIG. 30, if, for example, the fourth laser apparatus 2d is going to suspend its operation, the eighth laser apparatus 2h may be operated in return. The beam parameters of the bundled laser beam may then be stabilized.

However, in FIG. 30, when the fourth laser apparatus 2d is capable of resuming its operation by, for example, completing the maintenance, the fourth laser apparatus 2d does not have to be operated and the eighth laser apparatus 2h does not have to suspend its operation. If one of the laser apparatuses other than the fourth laser apparatus 2d is going to suspend its operation, the fourth laser apparatus 2d may be operated in return.

In the fifth embodiment, as shown in FIG. 29, if the eighth laser apparatus 2h is currently suspending its operation, the eighth mirror 9h may have been moved away from the optical path axis of the bundled laser beam.

As shown in FIG. 30, if the fourth laser apparatus 2d suspends its operation, the sixth and eighth mirrors 9f and 9h may be moved to approach the optical path axis of the bundled laser beam. If the fourth laser apparatus 2d suspends its operation, the fourth mirror 9d may be moved away from the optical path axis of the bundled laser beam.

The other configurations may be substantially the same as those in the fourth embodiment described above with reference to FIGS. 25 and 26.

8.2 Controlling Operation

Figure 31:
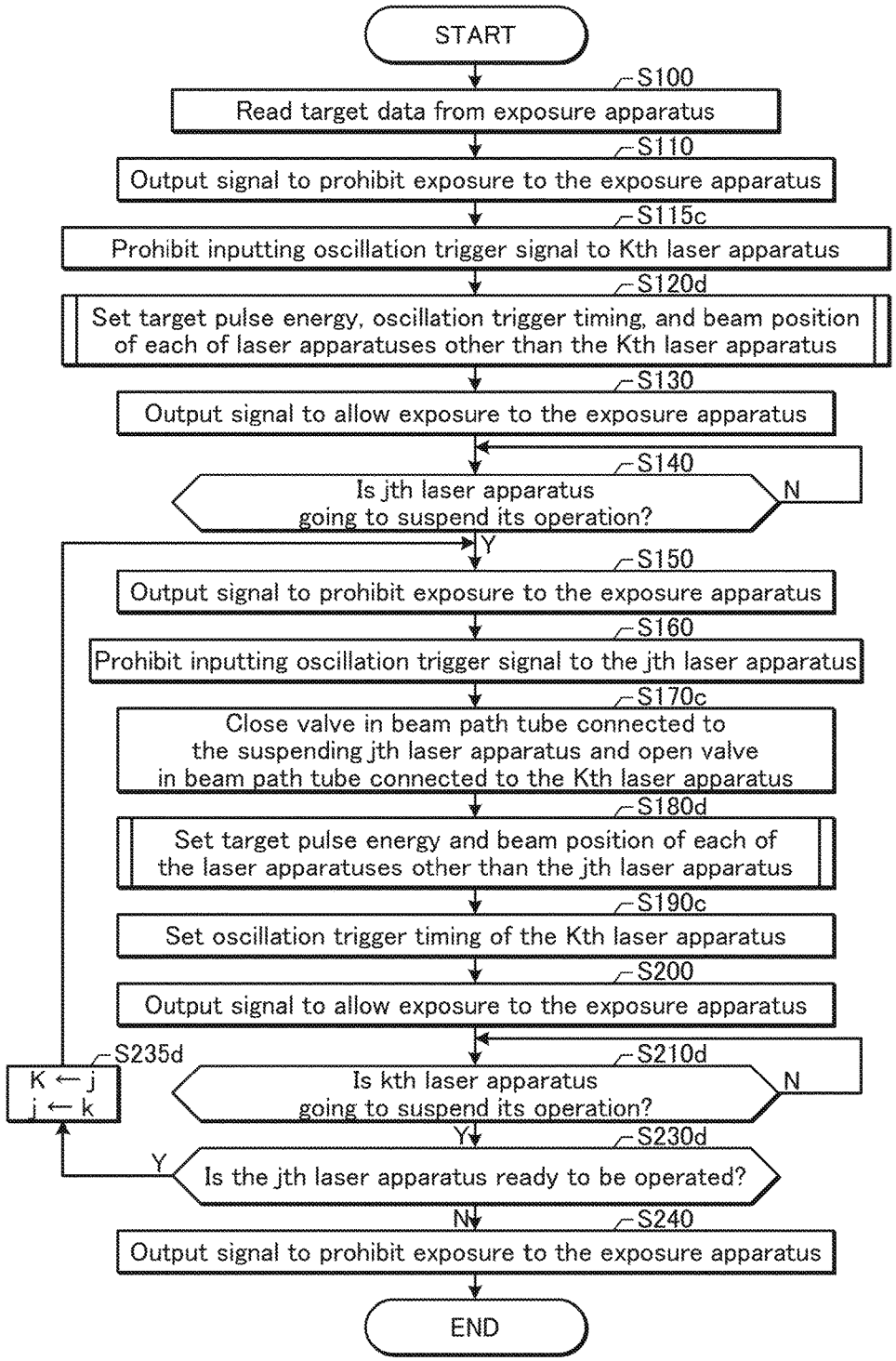
FIG. 31 is a flowchart illustrating an operation of a laser system controller 20 according to the fifth embodiment of the present disclosure.

FIG. 31 is a flowchart illustrating an operation of a laser system controller 20 according to the fifth embodiment of the present disclosure. In the fifth embodiment, when the jth laser apparatus is going to suspend its operation, the Kth laser apparatus may be operated in return. If a kth laser apparatus different from the jth laser apparatus is to going suspend its operation, the jth laser apparatus may be operated in return.

First, the processes at S100 to S115c may be substantially the same as the corresponding processes in the fourth embodiment described above with reference to FIG. 27.

Next, at S120d, the laser system controller 20 may set target pulse energy of each of the laser apparatuses other than the Kth laser apparatus and oscillation trigger timing of each of the laser apparatuses other than the Kth laser apparatus. The laser system controller 20 may set beam position of the pulse laser beam emitted from each of the laser apparatuses other than the Kth laser apparatus. Details of this process will be described below with reference to FIG. 32.

The next processes at S130 to S170c may be substantially the same as the corresponding processes in the fourth embodiment described above with reference to FIG. 27. As mentioned above, the jth laser apparatus may suspend its operation.

Next, at S1130d, the laser system controller 20 may set target pulse energy of each of the laser apparatuses other than the jth laser apparatus. The laser system controller 20 may further set beam position of the pulse laser beam emitted from each of the laser apparatuses other than the jth laser apparatus. Details of this process will be described below with reference to FIG. 33.

The next processes at S190c and S200 may be substantially the same as the corresponding processes in the fourth embodiment described above with reference to FIG. 27.

Next, at S210d, the laser system controller 20 may determine whether one of the laser apparatuses other than the jth laser apparatus is going to suspend its operation.

If no laser apparatus other than the jth laser apparatus is going to suspend its operation (S210d; NO), the laser system controller 20 may repeat the process of S210d without proceeding to the next step until deciding that one of the laser apparatuses other than the jth laser apparatus is going to suspend its operation. The laser apparatuses other than the jth laser apparatus may continue emitting the pulse laser beam.

If one of the laser apparatuses other than the jth laser apparatus is going to suspend its operation, the laser system controller 20 may determine that a kth laser apparatus is going to suspend its operation. If the kth laser apparatus is going to suspend its operation (S210d; YES), the laser system controller 20 may proceed to S230d.

At S230d, the laser system controller 20 may determine whether the jth laser apparatus is ready to be operated. If the kth laser apparatus is going to suspend its operation (S210d; YES) and the jth laser apparatus is not ready to be operated (S230d; NO), the laser system controller 20 may proceed to S240. The process at S240 may be substantially the same as the corresponding process in the fourth embodiment described above with reference to FIG. 27.

If the jth laser apparatus is ready to be operated (S230d; YES), the laser system controller 20 may proceed to S235d. At S235d, the laser system controller 20 may set the current value of j as a new value of K, set the current value of k as a new value of j, and return to the above S150. The suspending jth laser apparatus may thus become the Kth laser apparatus to be operated. The kth laser apparatus to suspend its operation may thus become the suspending jth laser apparatus.

Figure 32:
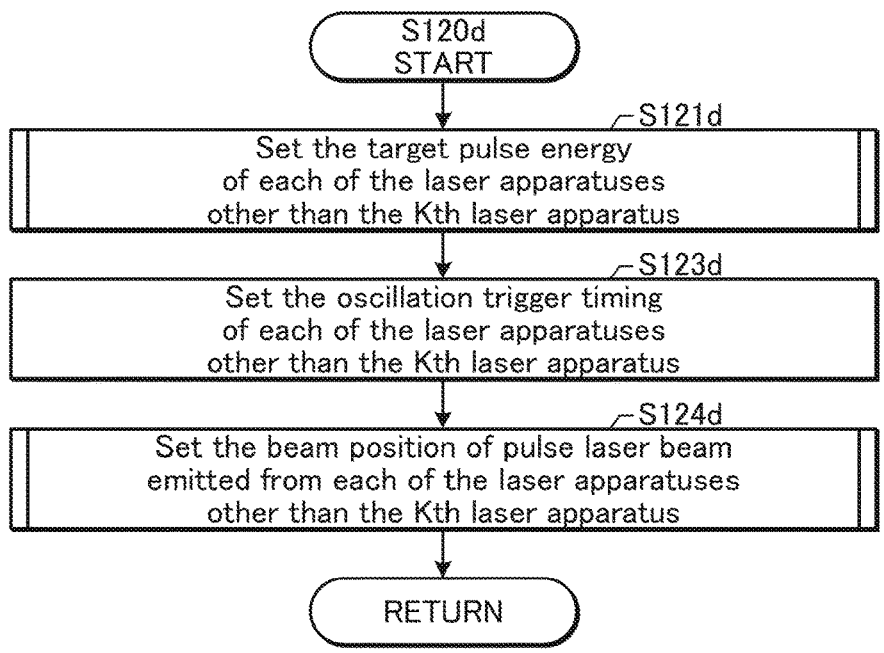
FIG. 32 is a flowchart illustrating detailed processing of setting target pulse energy, oscillation trigger timing, and beam position of the pulse laser beam emitted from each of the laser apparatuses other than a Kth laser apparatus shown in FIG. 31.

8.3 Setting Target Pulse Energy, Oscillation Trigger Timing, and Beam Position FIG. 32 is a flowchart illustrating detailed processing of setting the target pulse energy, the oscillation trigger timing, and the beam position of the pulse laser beam emitted from each of the laser apparatuses other than the Kth laser apparatus shown in FIG. 31. The processing shown in FIG. 32 may be performed by the laser system controller 20 as a subroutine of S120d shown in FIG. 31.

First, at S121d, the laser system controller 20 may set the target pulse energy of each of the laser apparatuses other than the Kth laser apparatus by feedback control. Details of this process will be described below with reference to FIG. 34.

Next, at S123d, the laser system controller 20 may set the oscillation trigger timing of each of the laser apparatuses other than the Kth laser apparatus. The oscillation trigger timing of each of the laser apparatuses other than the Kth laser apparatus may be set in substantially the same manner with that in S123c explained above with reference to FIG. 28.

Next, at S124d, the laser system controller 20 may set the beam position of the pulse laser beam emitted from each of the laser apparatuses other than the Kth laser apparatus by feedback control. Details of this process will be described below with reference to FIG. 35.

After S124d, the laser system controller 20 may terminate the processing of this flowchart to proceed to S130 in FIG. 31.

Figure 33:
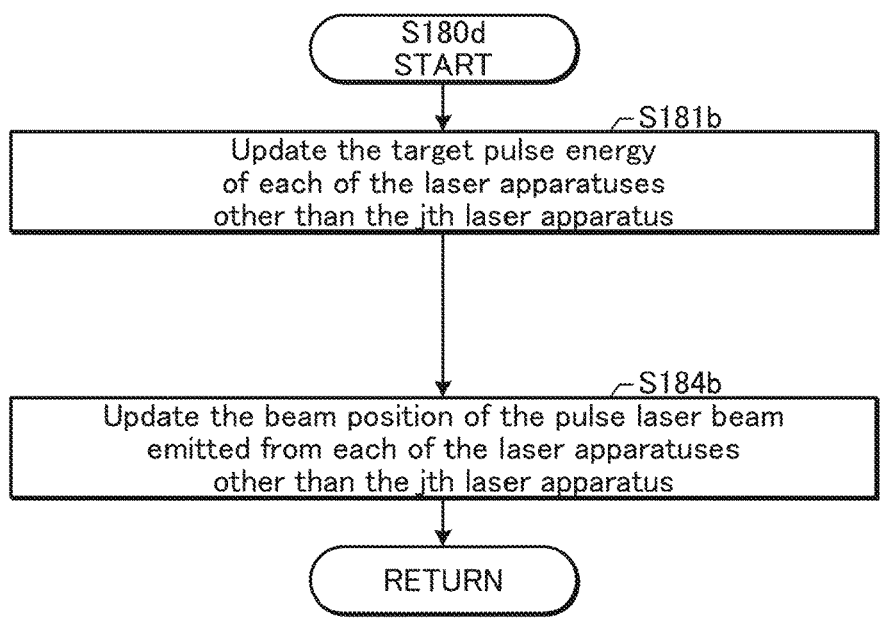
FIG. 33 is a flowchart illustrating detailed processing of updating the target pulse energy and the beam position of the pulse laser beam emitted from each of the laser apparatuses other than a jth laser apparatus shown in FIG. 31.

FIG. 33 is a flowchart illustrating detailed processing of updating the target pulse energy and the beam position of the pulse laser beam emitted from each of the laser apparatuses other than the jth laser apparatus shown in FIG. 31. The processing shown in FIG. 33 may be performed by the laser system controller 20 as a subroutine of S180d shown in FIG. 31.

First, at S181b, the laser system controller 20 may update the target pulse energy of each of the laser apparatuses other than the jth laser apparatus by feedback control. This process may be substantially the same as the corresponding process in the third embodiment described above with reference to FIG. 20.

Next, at S184b, the laser system controller 20 may update the beam position of the pulse laser beam emitted from each of the laser apparatuses other than the jth laser apparatus by feedback control. This process may be substantially the same as the corresponding process in the third embodiment described above with reference to FIG. 24.

After S184b, the laser system controller 20 may terminate the processing of this flowchart to proceed to S190c in FIG. 31.

Figure 34:
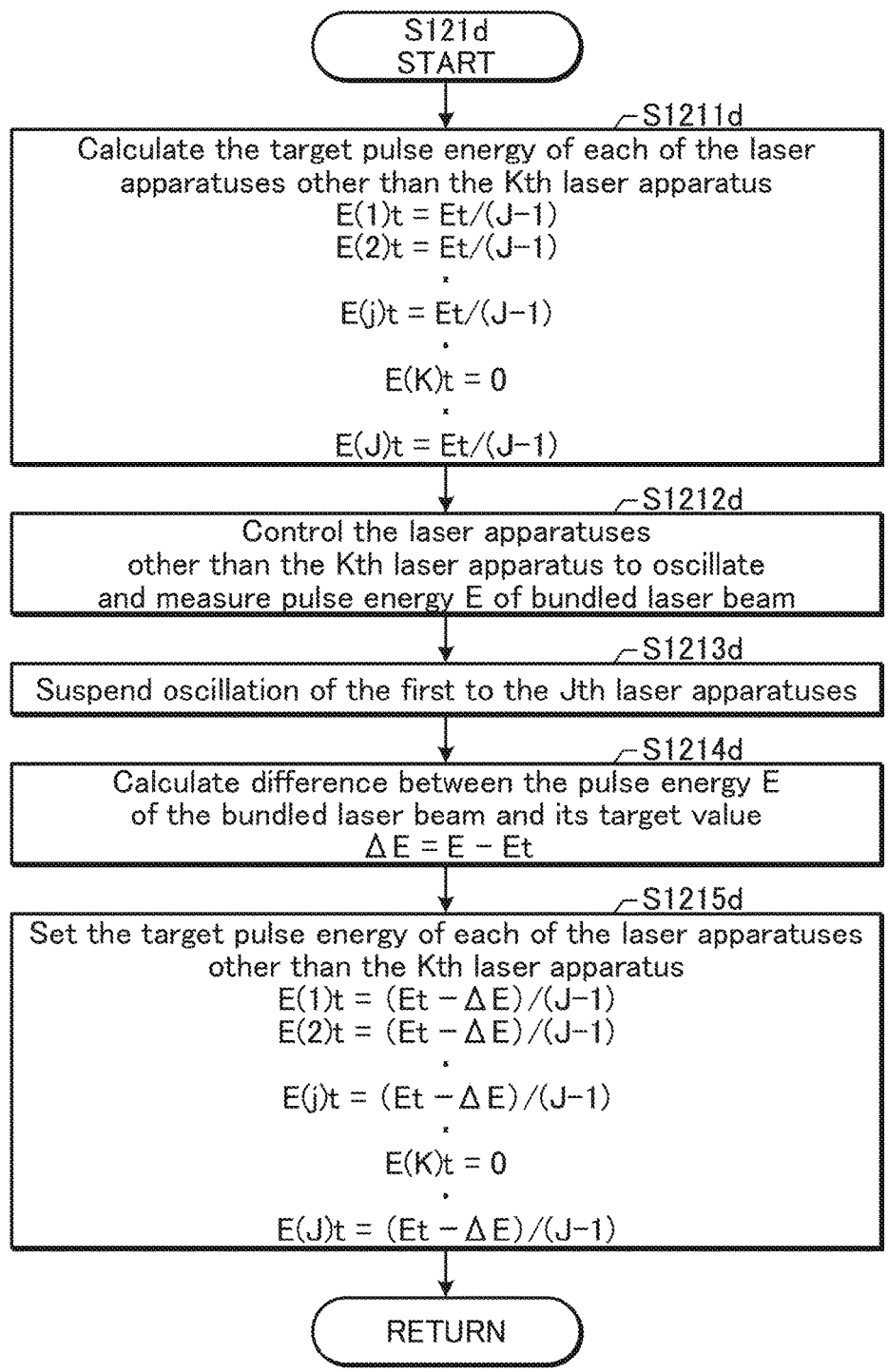
FIG. 34 is a flowchart illustrating detailed processing of setting the target pulse energy of each of the laser apparatuses other than the Kth laser apparatus by feedback control shown in FIG. 32.

FIG. 34 is a flowchart illustrating detailed processing of setting the target pulse energy of each of the laser apparatuses other than the Kth laser apparatus by the feedback control shown in FIG. 32. The processing shown in FIG. 34 may be performed by the laser system controller 20 as a subroutine of S121d shown in FIG. 32.

First, at S1211d, the laser system controller 20 may calculate the target pulse energy of each of the laser apparatuses other than the Kth laser apparatus as an initial value. The value calculated here may be substantially the same as the value set at S121c in FIG. 28.

Next, at S1212d, the laser system controller 20 may control the laser apparatuses other than the Kth laser apparatus to oscillate and measure pulse energy E of the bundled laser beam.

Next, at S1213d, the laser system controller 20 may suspend oscillation of the first to Jth laser apparatuses.

Next, at S1214d, the laser system controller 20 may calculate a difference $\Delta E$ between the pulse energy E of the bundled laser beam and its target value Et by the following formula.

$$\Delta E = E - Et$$

The target value Et may be the value received at S100 described above with reference to FIGS. 6, 27, and 31. The target value Et may be the value used at the above S1211d for calculating the target pulse energy.

Next, at S1215d, the laser system controller 20 may update the target pulse energy of each of the laser apparatuses other than the Kth laser apparatus as follows.

$$E(1)t = (Et - \Delta E)/(J-1)$$
$$E(2)t = (Et - \Delta E)/(J-1)$$
$$\dots$$
$$E(j)t = (Et - \Delta E)/(J-1)$$
$$\dots$$
$$E(K)t = 0$$
$$\dots$$
$$E(J)t = (Et - \Delta E)/(J-1)$$

Here, E (n) t may be the target pulse energy of an nth laser apparatus. Et may be the target pulse energy of the bundled laser beam. In the above example, the target pulse energy of each of the laser apparatuses is calculated by dividing the target pulse energy Et of the bundled laser beam by the number J−1 of the operated laser apparatuses, However, any other target pulse energy may be calculated for each of the laser apparatuses as long as the total pulse energy is Et.

After S1215d, the laser system controller 20 may terminate the processing of this flowchart to proceed to S123d in FIG. 32.

Figure 35:
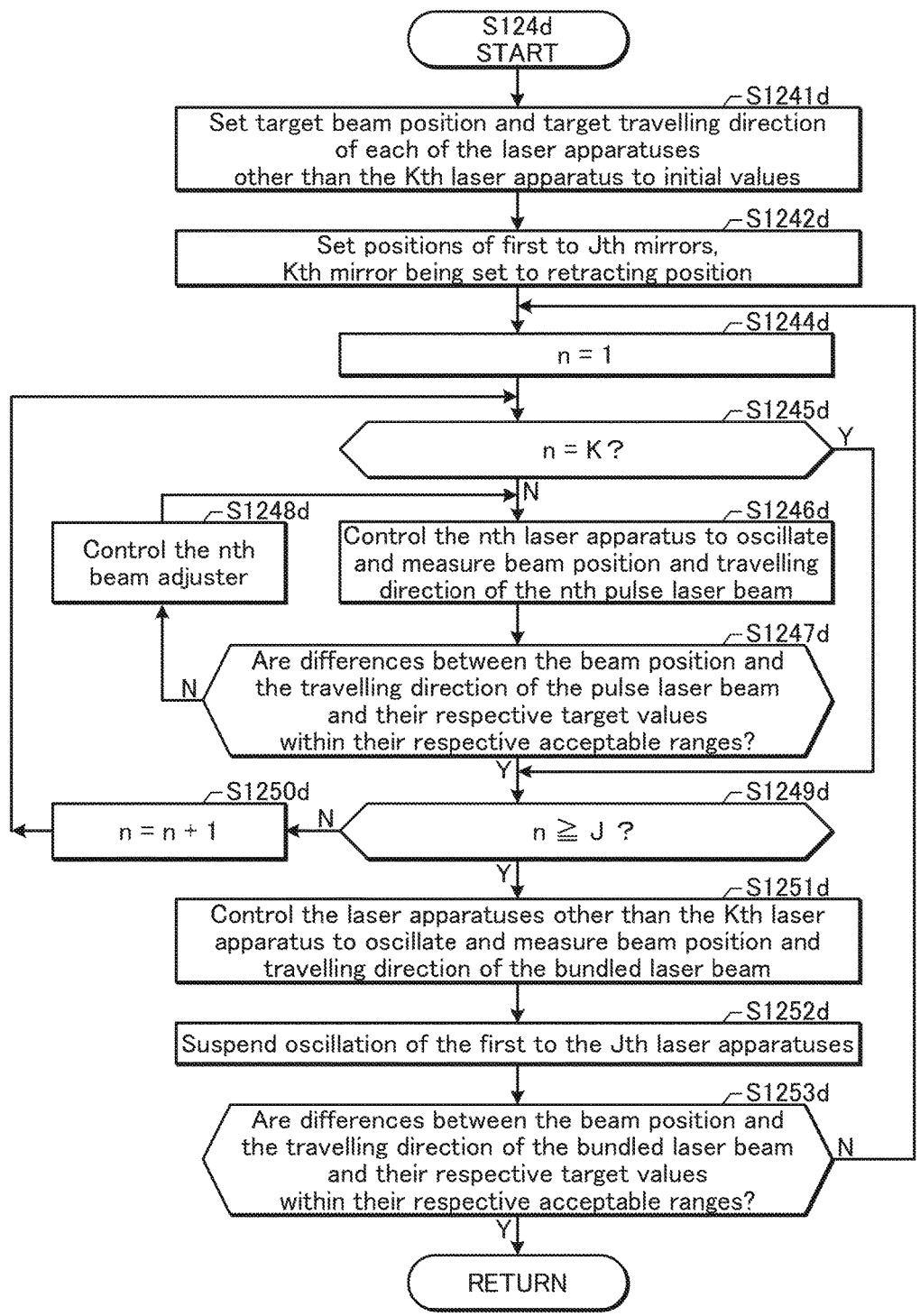
FIG. 35 is a flowchart illustrating detailed processing of setting the beam position of the pulse laser beam emitted from each of the laser apparatuses other than the Kth laser apparatus by feedback control shown in FIG. 32.

FIG. 35 is a flowchart illustrating detailed processing of setting the beam position of the pulse laser beam emitted from each of the laser apparatuses other than the Kth laser apparatus by the feedback control shown in FIG. 32. The processing shown in FIG. 35 may be performed by the laser system controller 20 as a subroutine of S124d shown in FIG. 32.

First, at S1241d, the laser system controller 20 may set target beam position and target travelling direction of the pulse laser beam emitted from each of the laser apparatuses other than the Kth laser apparatus. The target beam position may be set based on the number of the laser apparatuses in the laser system 5 other than the Kth laser apparatus. The target travelling direction may be set to the beam delivery direction.

Next, at S1242d, the laser system controller 20 may set positions of the first to Jth mirrors. The first to Jth mirrors may be the first to eighth mirrors 9a to 9h. The laser system controller 20 may send a control signal to the beam delivery device controller 59 to move the first to Jth mirrors to the respective positions having been set. The Kth mirror may be set to a retracting position.

The positions of the first to Jth mirrors may be set, as shown in FIG. 29, for example, such that the eighth mirror 9h is moved away from the optical path axis of the bundled laser beam when the eighth laser apparatus 2h is suspending its operation.

Next, at S1244d, the laser system controller 20 may set a value of a counter n to 1.

Next, at S1245d, the laser system controller 20 may determine whether the value of n is equal to the value of K. If the value of n is equal to the value of K, the laser system controller 20 may proceed to S1249d. If the value of n is not equal to the value of K, the laser system controller 20 may proceed to S1246d.

Next, at S1246d, the laser system controller 20 may control the nth laser apparatus to oscillate and measure the beam position and the travelling direction of the nth pulse laser beam. The laser system controller 20 may then suspend oscillation of the nth laser apparatus.

Next, at S1247d, the laser system controller 20 may determine whether differences between the beam position and the travelling direction of the nth pulse laser beam and their respective target values are within their respective acceptable ranges.

If the differences between the beam position and the travelling direction of the nth pulse laser beam and their respective target values are not within their respective acceptable ranges (S1247d; NO), the laser system controller 20 may control at S1248d the nth beam adjuster such that the beam position and the travelling direction of the nth pulse laser beam approach the respective target values.

After S1248d, the laser system controller 20 may return to the above S1246d to measure the beam position and the travelling direction of the nth pulse laser beam.

If the differences between the beam position and the travelling direction of the nth pulse laser beam and their respective target values are within their respective acceptable ranges (S1247d; YES), the laser system controller 20 may determine at S1249d whether the value of the counter n is equal to or more than the maximum value J.

If the value of the counter n is not equal to or more than the maximum value J (S1249d; NO), the laser system controller 20 may add 1 to the value of the counter n at S1250d to update the counter n. After S1250d, the laser system controller 20 may return to the above S1246d to measure the beam position and the travelling direction of the nth pulse laser beam for a new value of the counter n.

If the value of the counter n is equal to or more than the maximum value J (S1249d; YES), the laser system controller 20 may control at S1251d the laser apparatuses other than the Kth laser apparatus to oscillate and measure the beam position and the travelling direction of the bundled laser beam.

Next, at S1252d, the laser system controller 20 may suspend oscillation of the first to Jth laser apparatuses.

Next, at S1253d, the laser system controller 20 may determine whether the differences between the beam position and the travelling direction of the bundled laser beam and their respective target values are within their respective acceptable ranges.

If the differences between the beam position and the travelling direction of the bundled laser beam and their respective target values are not within their respective acceptable ranges (S1253d; NO), the laser system controller 20 may return to the above S1244d to measure the beam position and the travelling direction of the individual pulse laser beam.

If the differences between the beam position and the travelling direction of the bundled laser beam and their respective target values are within their respective acceptable ranges (S1253d; YES), the laser system controller 20 may terminate the processing of this flowchart to proceed to S130 in FIG. 31.

9. Sixth Embodiment

Figure 36:
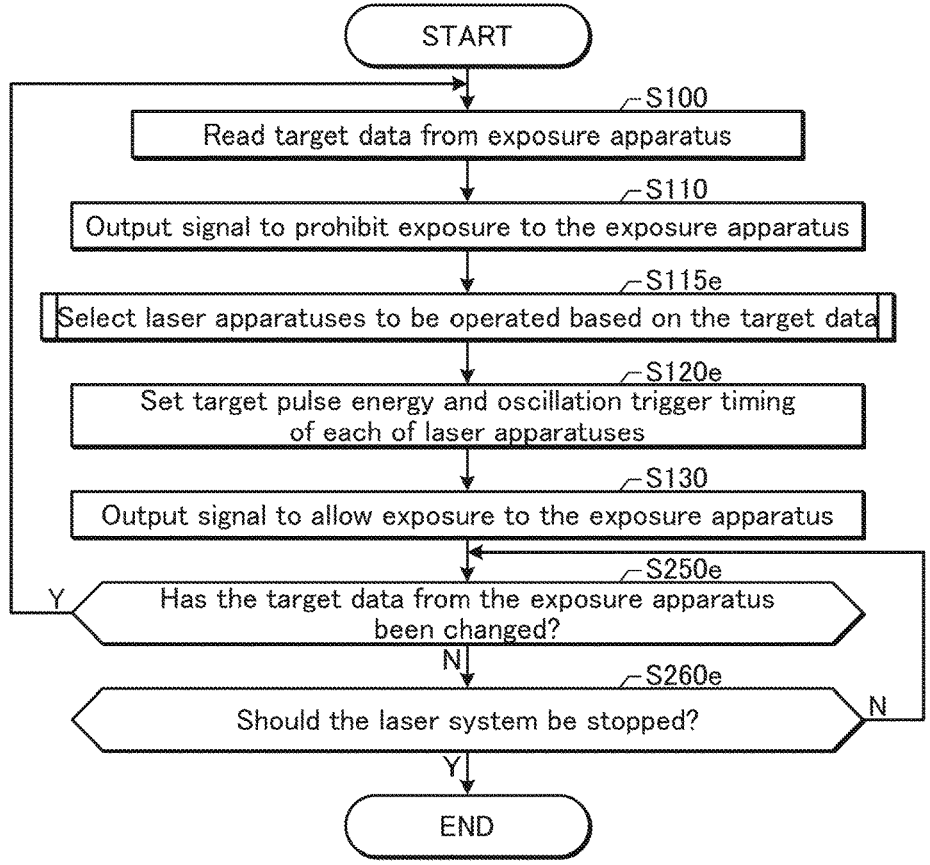
FIG. 36 is a flowchart illustrating an operation of a laser system controller 20 according to a sixth embodiment of the present disclosure.

FIG. 36 is a flowchart illustrating an operation of a laser system controller 20 according to a sixth embodiment of the present disclosure. In the sixth embodiment, the laser system controller 20 may select laser apparatuses to be operated among the first to Jth laser apparatuses based on the target data. In the sixth embodiment, the device configuration shown in FIG. 3 may be used.

First, at S100, the laser system controller 20 may read target data from the exposure apparatus controller 40 of the exposure apparatus 4. The target data may include the target pulse energy Et of the bundled laser beam emitted from the laser system 5.

Next, at S110, the laser system controller 20 may output a signal to prohibit exposure to the exposure controller 40 of the exposure apparatus 4.

Next, at S115e, the laser system controller 20 may select laser apparatuses to be operated among the first to Jth laser apparatuses based on the target data received at S100. Details of this process will be described below with reference to FIG. 37.

Next, at S120e, the laser system controller 20 may set the target pulse energy of each of the laser apparatuses to be operated and the oscillation trigger timing of each of the laser apparatuses to be operated. This process may be performed as described above with reference to FIG. 7. However, the target pulse energy may depend on the number of the laser apparatuses to be operated.

Next, at S130, the laser system controller 20 may output a signal to allow exposure to the exposure apparatus controller 40 of the exposure apparatus 4.

Next, at S250e, the laser system controller 20 may read target data from the exposure apparatus controller 40 of the exposure apparatus 4 and determine whether the target data has been changed.

If the target data has been changed (S250e; YES), the laser system controller 20 may return to the above S100 to select laser apparatuses to be operated based on the new target data.

If the target data has not been changed (S250e; NO), the laser system controller 20 may determine at S260e whether the laser system 5 should be stopped.

If the laser system 5 should not be stopped (S260e; NO), the laser system controller 20 may return to the above S250e.

If the laser system 5 should be stopped (S260e; NO), the laser system controller 20 may terminate the processing of this flowchart.

Figure 37:
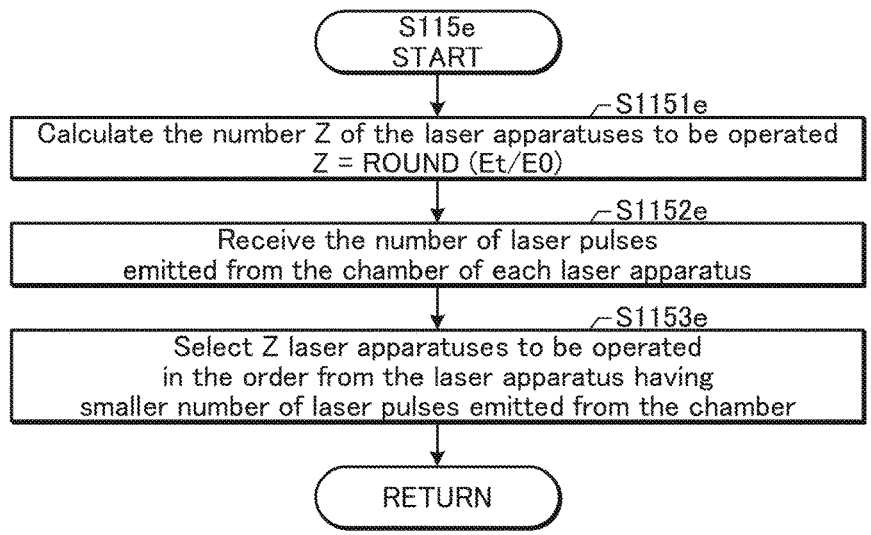
FIG. 37 is a flowchart illustrating detailed processing of selecting operated laser apparatuses based on target data shown in FIG. 36.

FIG. 37 is a flowchart illustrating detailed processing of selecting the operated laser apparatuses based on the target data shown in FIG. 36. The processing shown in FIG. 37 may be performed by the laser system controller 20 as a subroutine of S115e shown in FIG. 36.

First, at S1151e, the laser system controller 20 may calculate the number Z of the laser apparatuses to be operated based on the target data by the following formula.

$$Z = \text{ROUND}(Et/E0)$$

ROUND(X) may represent a function to round X off after its decimal point. Et may be the target pulse energy of the bundled laser beam. E0 may be rated pulse energy of each laser apparatus. The rated pulse energy may be a predetermined value that may allow stable operation.

Next, at S1152e, the laser system controller 20 may receive data from each laser apparatus on the number of laser pulses emitted from the chamber of each laser apparatus. The number of laser pulses emitted from the chamber of each laser apparatus may be related to deterioration of the laser apparatus or remaining lifetime of the laser apparatus.

Next, at S1153e, the laser system controller 20 may select Z laser apparatuses in the order from the laser apparatus having the smaller number of laser pulses emitted from the chamber. The Z laser apparatuses may be selected as the laser apparatuses to be operated.

After S1153e, the laser system controller 20 may terminate the processing of this flowchart to return to S120e in FIG. 36.

According to the sixth embodiment, the laser apparatuses to be operated are selected based on the target data and the laser apparatuses may be operated under the conditions close to the rated pulse energy. This may extend lifetime of the laser apparatuses.

10. Seventh Embodiment

Figure 38:
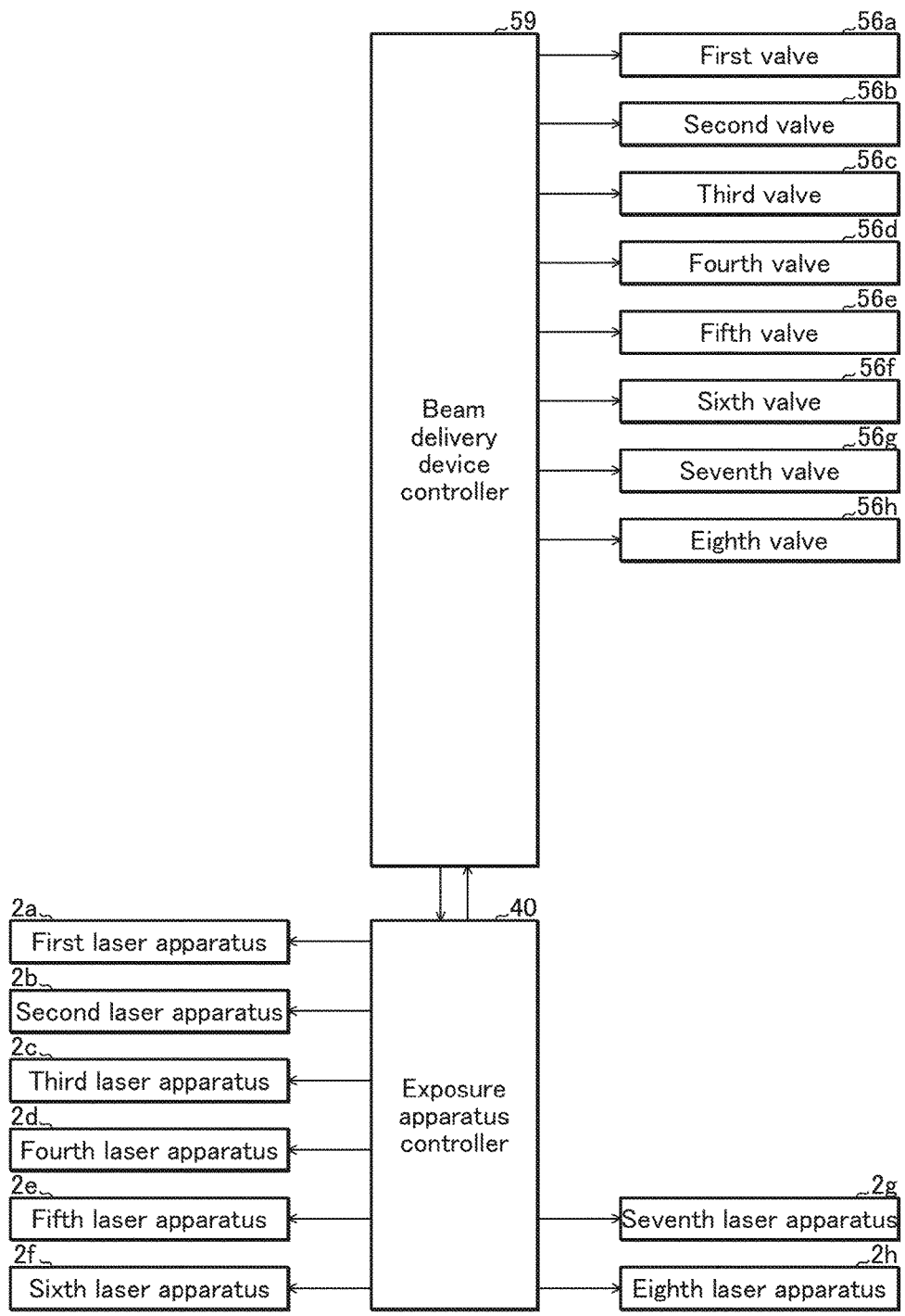
FIG. 38 is a block diagram of a laser system according to a seventh embodiment of the present disclosure.

FIG. 38 is a block diagram of a laser system according to a seventh embodiment of the present disclosure. In the seventh embodiment, instead of the laser system controller 20, the exposure apparatus controller 40 in the exposure apparatus 4 may perform the various controls.

In FIG. 38, the beam delivery device controller 59 may control the first to eighth valves 56a to 56h. However, the exposure apparatus controller 40 may control these valves.

In other aspects, the seventh embodiment may be substantially the same as each embodiment described above.

11. Laser Apparatus

Figure 39:
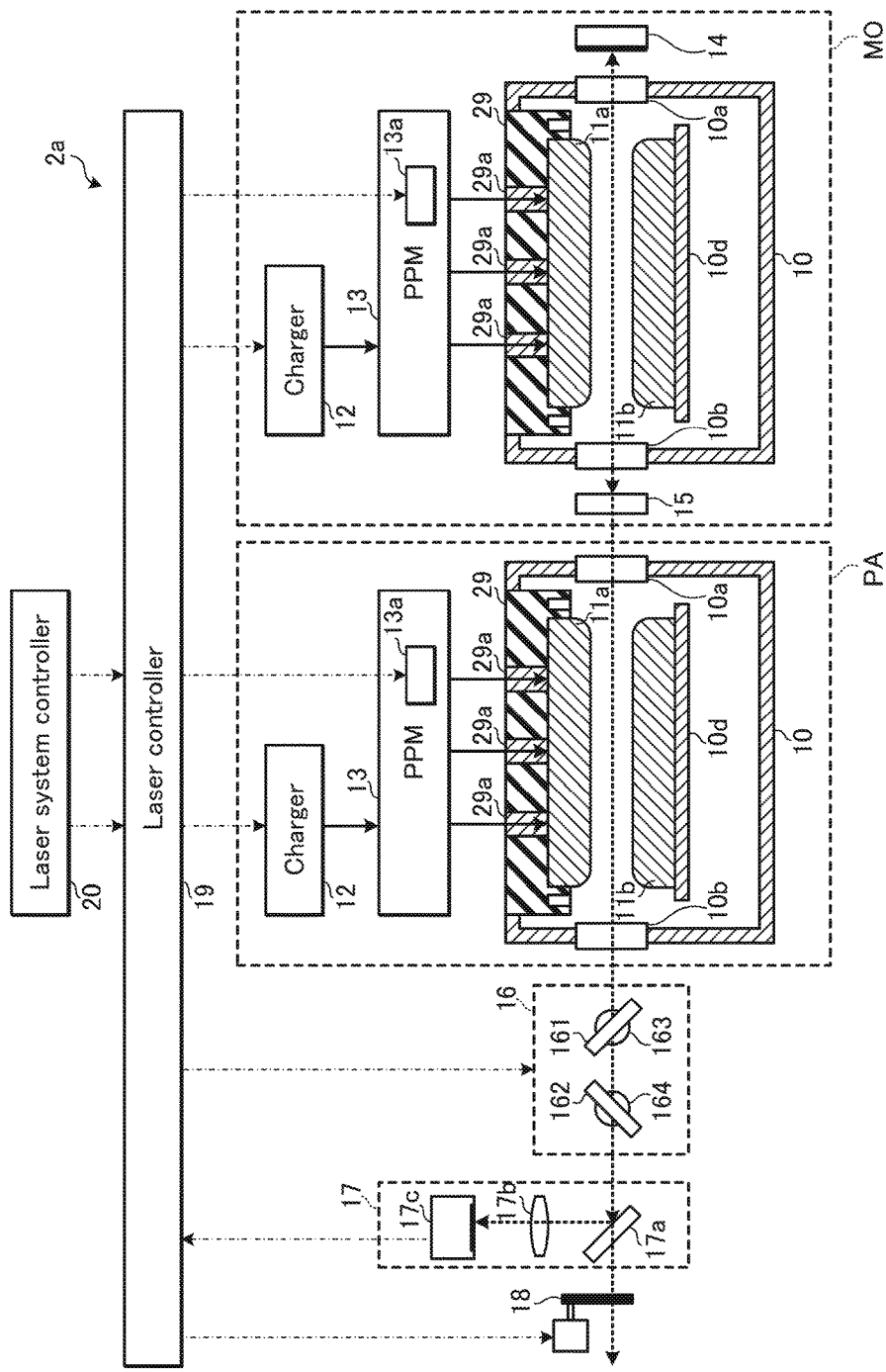
FIG. 39 shows an exemplary configuration of a laser apparatus that can be used in each of the above embodiments.

FIG. 39 shows an exemplary configuration of a laser apparatus that can be used in each of the above embodiments. The first laser apparatus 2a may include a master oscillator MO, a power amplifier PA, an attenuator 16, a pulse energy measuring unit 17, a shutter 18, and a laser controller 19. Configuration of each of the second to eighth laser apparatuses 2b to 2h may be substantially the same as that of the first laser apparatus 2a.

The master oscillator MO may include a laser chamber 10, a pair of electrodes 11a and 11b, a charger 12, and a pulse power module (PPM) 13. The master oscillator MO may further include a high-reflective mirror 14 and an output coupling mirror 15. FIG. 39 shows an internal configuration of the laser chamber 10 viewed from the direction substantially perpendicular to the travelling direction of the laser beam.

The laser chamber 10 may store laser gases constituting a laser medium, including a rare gas such as argon, krypton or xenon, a buffer gas such as neon or helium, and a halogen gas such as chlorine or fluorine. The pair of electrodes 11a and 11b may be provided in the laser chamber 10 as electrodes for exciting the laser medium by electric discharge. The laser chamber 10 may have an opening, sealed by an insulating member 29. The electrode 11a may be supported by the insulating member 29 and the electrode 11b may be supported by a return plate 10d. The return plate 10d may be electrically connected to an inner surface of the laser chamber 10 through electric wirings (not shown). In the insulating member 29, conductive members 29a may be molded. The conductive members 29a may apply high-voltage, which is supplied by the pulse power module 13, to the electrode 11a.

The charger 12 may be a direct-current power source for charging a charge capacitor (not shown) of the pulse power module 13 at a predetermined voltage. The pulse power module 13 may include a switch 13a controlled by the laser controller 19. When the switch 13a turns ON, the pulse power module 13 may generate the pulsed high-voltage using electric energy in the charger 12. The high-voltage may be applied to the pair of electrodes 11a and 11b.

The high-voltage applied to the pair of electrodes 11a and 11b may cause dielectric breakdown and cause the electric discharge between the pair of electrodes 11a and 11b. Energy of the electric discharge may excite the laser medium in the laser chamber 10 to a high energy level. The excited laser medium may then change to a low energy level, where the laser medium generates light according to the difference of the energy levels.

The laser chamber 10 may have windows 10a and 10b at respective ends of the chamber. The light generated in the laser chamber 10 may be emitted from the laser chamber 10 through the windows 10a and 10b.

The high-reflective mirror 14 may reflect the light emitted from the window 10a of the laser chamber 10 at high reflectance to return the light to the laser chamber 10.

The output coupling mirror 15 may transmit to output a part of the light emitted from the window 10b of the laser chamber 10 and reflect to return another part of the light to the laser chamber 10.

The high-reflective mirror 14 and the output coupling mirror 15 may thus constitute an optical resonator. The light emitted from the laser chamber 10 may travel back and forth between the high-reflective mirror 14 and the output coupling mirror 15. The light may be amplified at every time to pass a laser gain region between the electrode 11a and the electrode 11b. The pulse laser beam of the amplified light may be emitted through the output coupling mirror 15.

The power amplifier PA may be provided in the optical path of the pulse laser beam emitted from the output coupling mirror 15 of the master oscillator MO. The power amplifier PA may include, as in the master oscillator MO, a laser chamber 10, a pair of electrodes 11a and 11b, a charger 12, and a pulse power module (PPM) 13. Configurations of these elements may be substantially the same as those in the master oscillator. The power amplifier PA does not have to include the high-reflective mirror 14 or the output coupling mirror 15. The pulse laser beam, which entered the power amplifier PA through the window 10a, may once pass the laser gain region between the electrode 11a and the electrode 11b, and then be emitted through the window 10b.

The attenuator 16 may include a first partially-reflective mirror 161, a second partially-reflective mirror 162, a first rotating stage 163, and a second rotating stage 164. Each of the first partially-reflective mirror 161 and the second partially-reflective mirror 162 may be coated with a film having variable transmittance of the pulse laser beam depending on an incident angle of the pulse laser beam.

The first rotating stage 163 and the second rotating stage 164 may adjust posture angles of the first partially-reflective mirror 161 and the second partially-reflective mirror 162, respectively. An incident angle of the pulse laser beam to the first partially-reflective mirror 161 and an incident angle of the pulse laser beam to the second partially-reflective mirror 162 may be adjusted to coincide with each other. These incident angles may be adjusted such that each of the first partially-reflective mirror 161 and the second partially-reflective mirror 162 has a desired transmittance. The pulse laser beam entered the attenuator 16 may thus be attenuated to have a desired pulse energy and emitted from the attenuator 16. The attenuator 16 may control its transmittance based on a control signal from the laser controller 19.

The pulse energy measuring unit 17 may be provided in the optical path of the pulse laser beam emitted from the attenuator 16. The pulse energy measuring unit 17 may include a beam splitter 17a, focusing optics 17b, and an optical sensor 17c.

The beam splitter 17a may transmit a part of the pulse laser beam, emitted from the attenuator 16, at high transmittance to the shutter 18. The beam splitter 17a may reflect another part of the pulse laser beam to the focusing optics 17b. The focusing optics 17b may concentrate the light reflected by the beam splitter 17a on the light-receiving surface of the optical sensor 17c. The optical sensor 17c may detect pulse energy of the pulse laser beam concentrated on the light-receiving surface and output data on the pulse energy to the laser controller 19.

The laser controller 19 may send and receive various signals to and from the laser system controller 20. For example, the laser controller 19 may receive the oscillation trigger signal or data on the target pulse energy from the laser system controller 20. Further, the laser controller 19 may send a setting signal to set the charging voltage to the charger 12 and send an instruction signal for ON/OFF of the switch to the pulse power module 13.

The laser controller 19 may receive the data on the pulse energy from the pulse energy measuring unit 17 and control the charging voltage of the charger 12 with reference to the data on the pulse energy. Controlling the charging voltage of the charger 12 may result in controlling the pulse energy of the laser beam.

Further, the laser controller 19 may correct timing of an oscillation trigger such that the discharge occurs at a predetermined timing from the oscillation trigger based on the charging voltage. The laser controller 19 may further control the transmittance of the attenuator 16 such that pulse energy of the pulse laser beam emitted from the attenuator 16 approaches the target pulse energy, if the target pulse energy is lower than a lower limit of the laser apparatus that may allow stable operation.

The shutter 18 may be provided in the optical path of the pulse laser beam transmitted by the beam splitter 17a of the pulse energy measuring unit 17. The laser controller 19 may control the shutter 18 to be closed, from starting laser oscillation, until difference between the pulse energy received from the pulse energy measuring unit 17 and the target pulse energy falls within an acceptable range. The laser controller 19 may control the shutter 18 to be opened if the difference between the pulse energy received from the pulse energy measuring unit 17 and the target pulse energy falls within the acceptable range. The signal to indicate the pulse energy may be sent to the laser system controller 20 to show the timing of the pulse laser beam 21.

FIG. 39 shows an example where the laser apparatus includes the power amplifier PA and the attenuator 16; however, the power amplifier PA and the attenuator 16 may be omitted. Further, the attenuator 16 may be provided in the optical path of the laser beam emitted from the laser apparatus.

Further, the laser apparatus does not have to be limited to the excimer laser apparatus. The laser apparatus may be a solid laser apparatus. For example, the solid laser apparatus may be a YAG laser apparatus to generate a third harmonic light having a wavelength of 355 nm or a fourth harmonic light having a wavelength of 266 nm.

12. Optical Path Length Adjuster

Each of the beam adjusters 7a to 7e used in the above embodiments may include an optical path length adjuster 71.

For example, the optical path length adjuster 71 may make the first pulse laser beam 21a detour to change the optical path length of the first pulse laser beam 21a. The optical path length adjuster 71 may change optical path length of the first pulse laser beam 21a under control by the beam delivery device controller 59.

Figure 40:
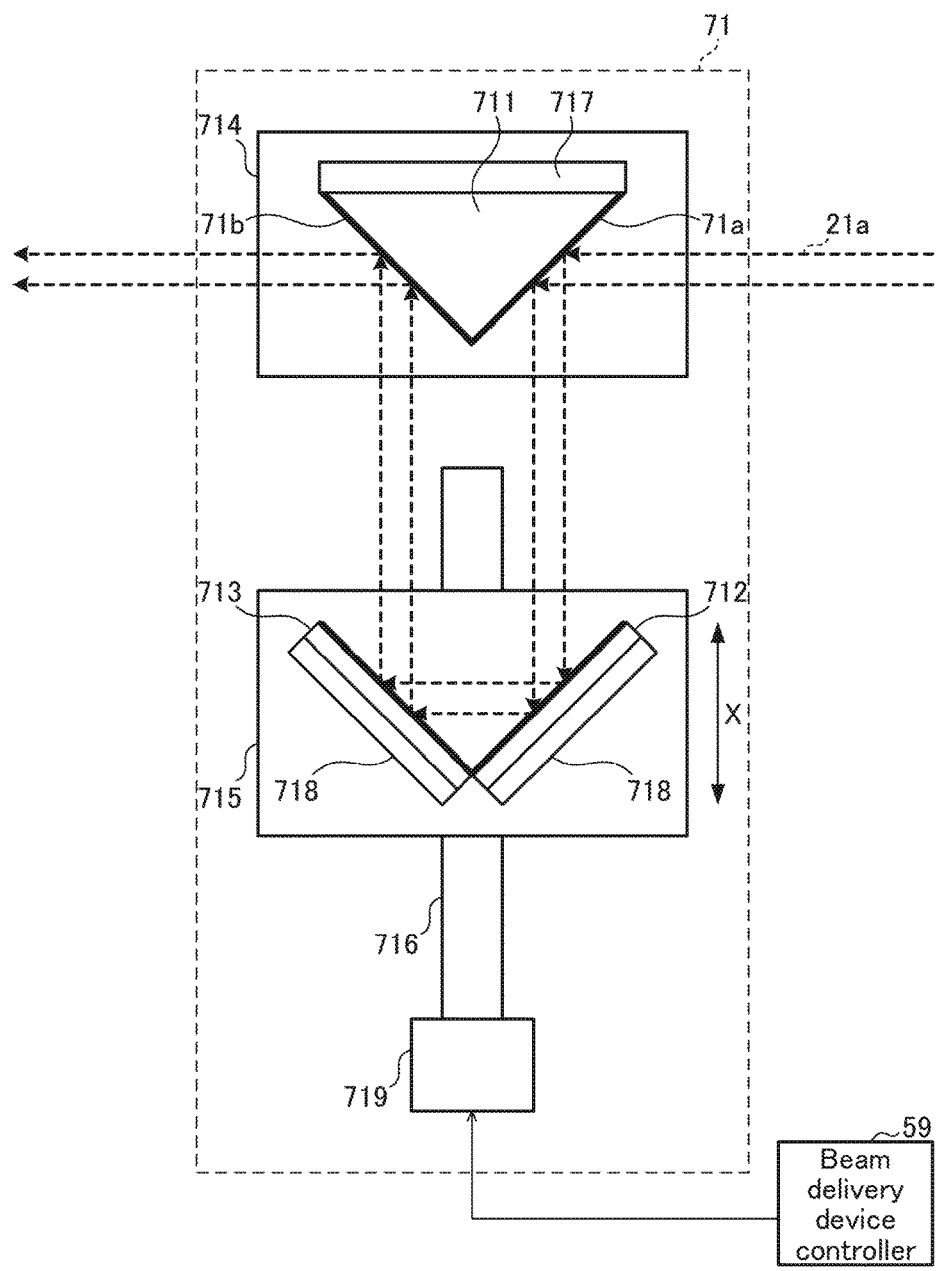
FIG. 40 schematically shows a configuration of an optical path length adjuster 71.

FIG. 40 schematically shows a configuration of the optical path length adjuster 71. The optical path length adjuster 71 may include a right-angle prism 711, two high-reflective mirrors 712 and 713, plates 714 and 715, and a uniaxial stage 716.

The right-angle prism 711 may have a first surface 71a and a second surface 71b perpendicular to each other, each of which may be coated with a high-reflective film. The right-angle prism 711 may be held by a holder 717. The holder 717 may be fixed to the plate 714. The right-angle prism 711 may be provided in the optical path of the first pulse laser beam 21a.

The two high-reflective mirrors 712 and 713 may be held by a holder 718 such that their reflective surfaces are perpendicular to each other. The holder 718 may be fixed to the plate 715. The plate 715 may be fixed to the uniaxial stage 716. The uniaxial stage 716 may be configured to move the two high-reflective mirrors 712 and 713 in a direction substantially parallel to the optical path axis of the first pulse laser beam 21a reflected by the first surface 71a of the right-angle prism 711.

The first pulse laser beam 21a reflected by the first surface 71a of the right-angle prism 711 may be reflected by the two high-reflective mirrors 712 and 713 and then be made incident on the second surface 71b of the right-angle prism 711. The first pulse laser beam 21a incident on the second surface 71b of the right-angle prism 711 may emit from the second surface 71b of the right-angle prism 711 along an extension line of the optical path axis of the first pulse laser beam 21a incident on the first surface 71a of the right-angle prism 711.

The beam delivery device controller 59 may drive a motor 719 of the uniaxial stage 716 to move the two high-reflective mirrors 712 and 713. Moving the two high-reflective mirrors 712 and 713 by a distance X may cause the optical path length of the first pulse laser beam 21a to be changed by 2X. By changing the optical path length, beam size or the optical path length of the first pulse laser beam 21a may be changed. The optical path length adjusters may control the respective optical path lengths from the corresponding laser apparatus to the emitting position of the laser system 5 to be substantially the same with each other.

13. Beam Divergence Adjuster

Each of the beam adjusters 7a to 7e in the above embodiments may include a beam divergence adjuster 72.

The beam divergence adjuster 72 may be configured to change, for example, the beam divergence of the first pulse laser beam 21a. The beam divergence adjuster 72 may change the beam divergence of the first pulse laser beam 21a under control by the beam delivery device controller 59.

Figure 41A:
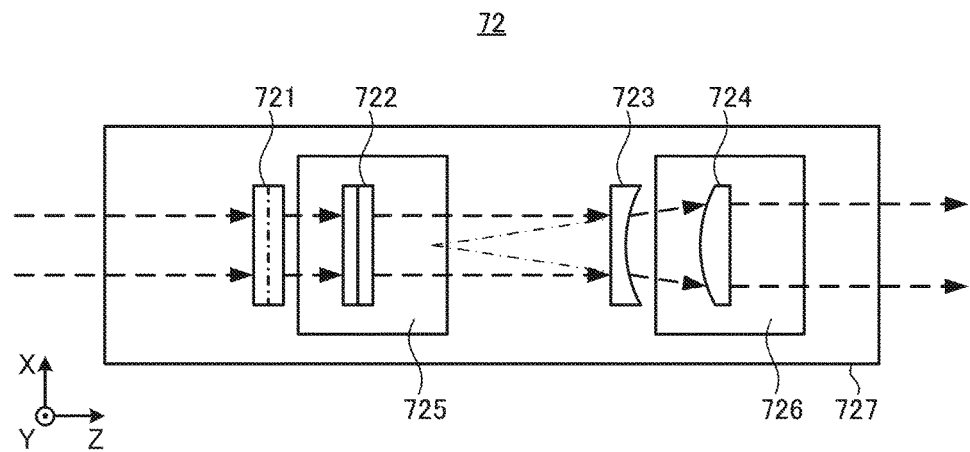
FIGS. 41A and 41B schematically show a configuration of a beam divergence adjuster 72.
Figure 41B:
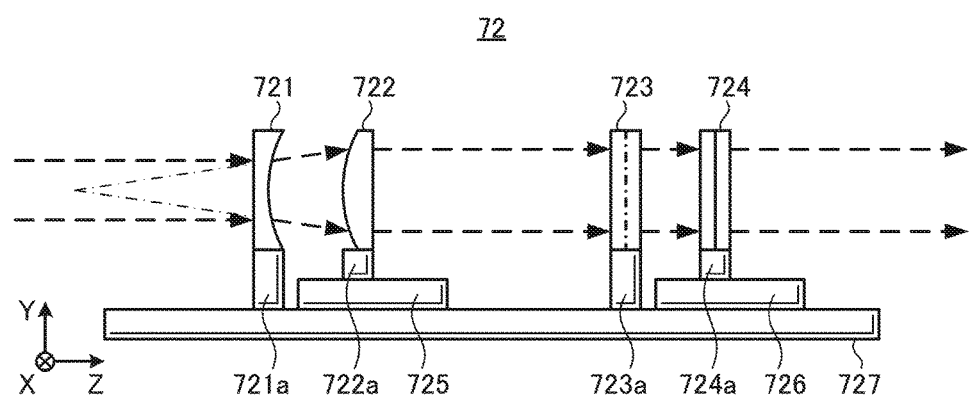

FIGS. 41A and 41B schematically show a configuration of the beam divergence adjuster 72. FIG. 41A is a plan view, and FIG. 41B is a side view. The beam divergence adjuster 72 may include a first cylindrical concave lens 721, a first cylindrical convex lens 722, a second cylindrical concave lens 723, and a second cylindrical convex lens 724.

The first cylindrical concave lens 721 may be held by a holder 721a on a plate 727. The first cylindrical convex lens 722 may be held by a holder 722a on a uniaxial stage 725. The second cylindrical concave lens 723 may be held by a holder 723a on the plate 727. The second cylindrical convex lens 724 may be held by a holder 724a on a uniaxial stage 726. The uniaxial stage 725 may move the first cylindrical convex lens 722 along the optical path axis of the first pulse laser beam 21a. The uniaxial stage 726 may move the second cylindrical convex lens 724 along the optical path axis of the first pulse laser beam 21a.

The concave surface of the first cylindrical concave lens 721 and the convex surface of the first cylindrical convex lens 722 may be cylindrical surfaces each having a central axis substantially parallel to the X direction. The first cylindrical concave lens 721 and the first cylindrical convex lens 722 may thus expand or reduce the beam width in the Y direction.

A focal position of the first cylindrical concave lens 721 and a focal position of the first cylindrical convex lens 722 may coincide with each other, and focal lengths of these lenses may be not so far from each other. In that case, the beam divergence adjuster 72 may suppress change in beam divergence of the first pulse laser beam 21a in the Y direction. The uniaxial stage 725 may move the first cylindrical convex lens 722 along the optical path axis of the first pulse laser beam 21a, such that the focal position of the first cylindrical concave lens 721 separates from the focal position of the first cylindrical convex lens 722. When the focal position of the first cylindrical concave lens 721 is separate from the focal position of the first cylindrical convex lens 722, the beam divergence adjuster 72 may change the beam divergence of the pulse laser beam 21a in the Y direction.

The concave surface of the second cylindrical concave lens 723 and the convex surface of the second cylindrical convex lens 724 may be cylindrical surfaces each having a central axis substantially parallel to the Y direction. The second cylindrical concave lens 723 and the second cylindrical convex lens 724 may thus expand or reduce the beam width in the X direction.

A focal position of the second cylindrical concave lens 723 and a focal position of the second cylindrical convex lens 724 may coincide with each other, and focal lengths of these lenses may be not so far from each other. In that case, the beam divergence adjuster 72 may suppress change in beam divergence of the first pulse laser beam 21a in the X direction. The uniaxial stage 726 may move the second cylindrical convex lens 724 along the optical path axis of the first pulse laser beam 21a such that the focal position of the second cylindrical concave lens 723 separates from the focal position of the second cylindrical convex lens 724. When the focal position of the second cylindrical concave lens 723 is separate from the focal position of the second cylindrical convex lens 724, the beam divergence adjuster 72 may change the beam divergence of the pulse laser beam 21a in the X direction.

According to this beam divergence adjuster 72, the beam divergence in the Y direction and the beam divergence in the X direction are independently controlled.

14. Beam Combiner Including Fly Eye Lens

Figure 42:
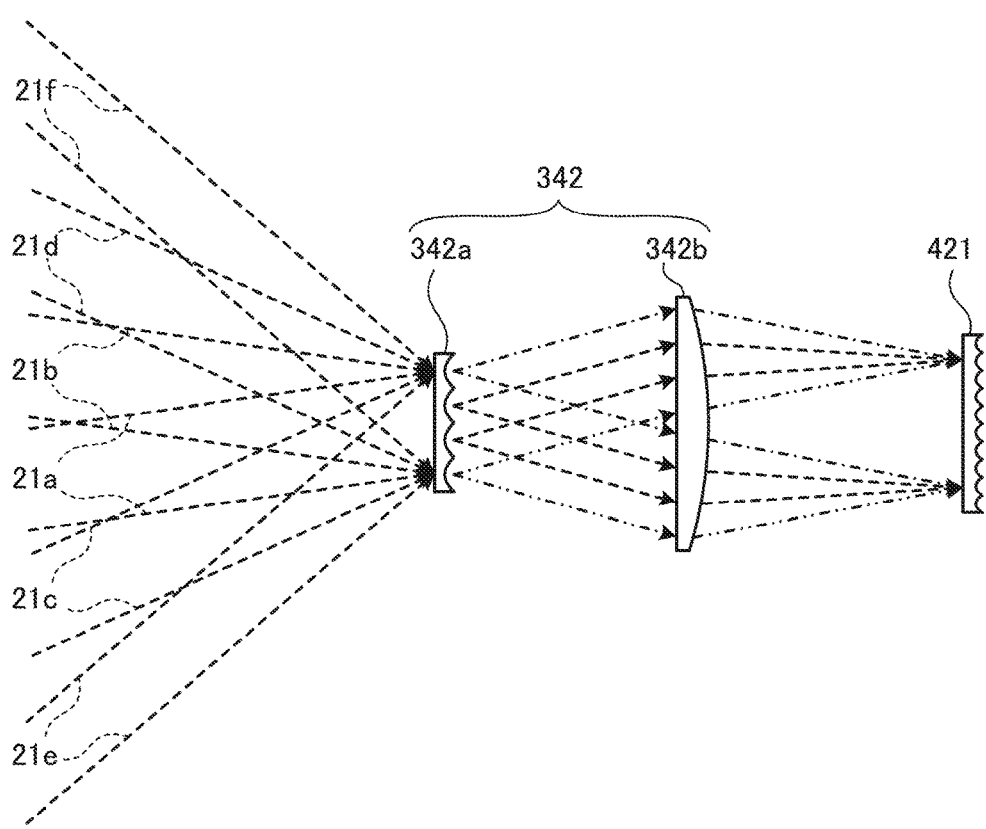
FIG. 42 shows an exemplary beam combiner that can be used in each of the above embodiments.

FIG. 42 shows an exemplary beam combiner that can be used in each of the above embodiments. In FIG. 42, illustration of the high-reflective mirror 41 in the exposure apparatus 4 is omitted. Instead of the beam combiner 34 using the diffractive optical element shown in FIG. 1, a beam combiner 342 including a fly eye lens 342a and condenser optics 342b may be used.

The fly eye lens 342a may be constituted by an ultraviolet-transmitting substrate, such as a synthetic quartz substrate or a calcium fluoride substrate, on which multiple concave or convex lenses are formed. The fly eye lens 342a may be provided at the position where the first to sixth pulse laser beams 21a to 21f emitted from the incident optics 33 overlap with each other. The lenses included in the fly eye lens 342a may be arranged in the cross sections of the plurality of pulse laser beams. The lenses may transmit respective parts of the plurality of pulse laser beams toward the condenser optics 342b and expand beam widths of the respective parts. The fly eye lens 342a may thus form multiple point light sources as secondary light sources using the pulse laser beams. The fly eye lens 342a may include a set of cylindrical concave or convex lenses arranged in one direction and another set of cylindrical concave or convex lenses arranged in another direction perpendicular to the one direction.

The condenser optics 342b may include at least one convex lens. The condenser optics 342b may extend over the optical paths of the respective parts of the plurality of pulse laser beams expanded by the respective lenses of the fly eye lens 342a.

The fly eye lens 342a may be provided such that a front-side focal plane of the condenser optics 342b substantially coincides with respective focal positions of the fly eye lens 342a. The condenser optics 342b may thus collimate each of the parts of the plurality of pulse laser beams expanded by the respective lenses of the fly eye lens 342a, such that each of the parts has substantially parallel rays.

The condenser optics 342b may be provided such that a rear-side focal plane of the condenser optics 342b substantially coincides with a light-receiving surface of the fly eye lens 421 of the exposure apparatus 4. The condenser optics 342b may thus make the respective parts, expanded by the respective lenses of the fly eye lens 342a, enter substantially the same portion of the fly eye lens 421.

Consequently, the pulse laser beam in which the parts are overlapping with each other at the light-receiving surface of the fly eye lens 421 of the exposure apparatus 4 may have small variation in light intensity distribution in a cross section of the pulse laser beam.

15. Configuration of Controller

Figure 43:
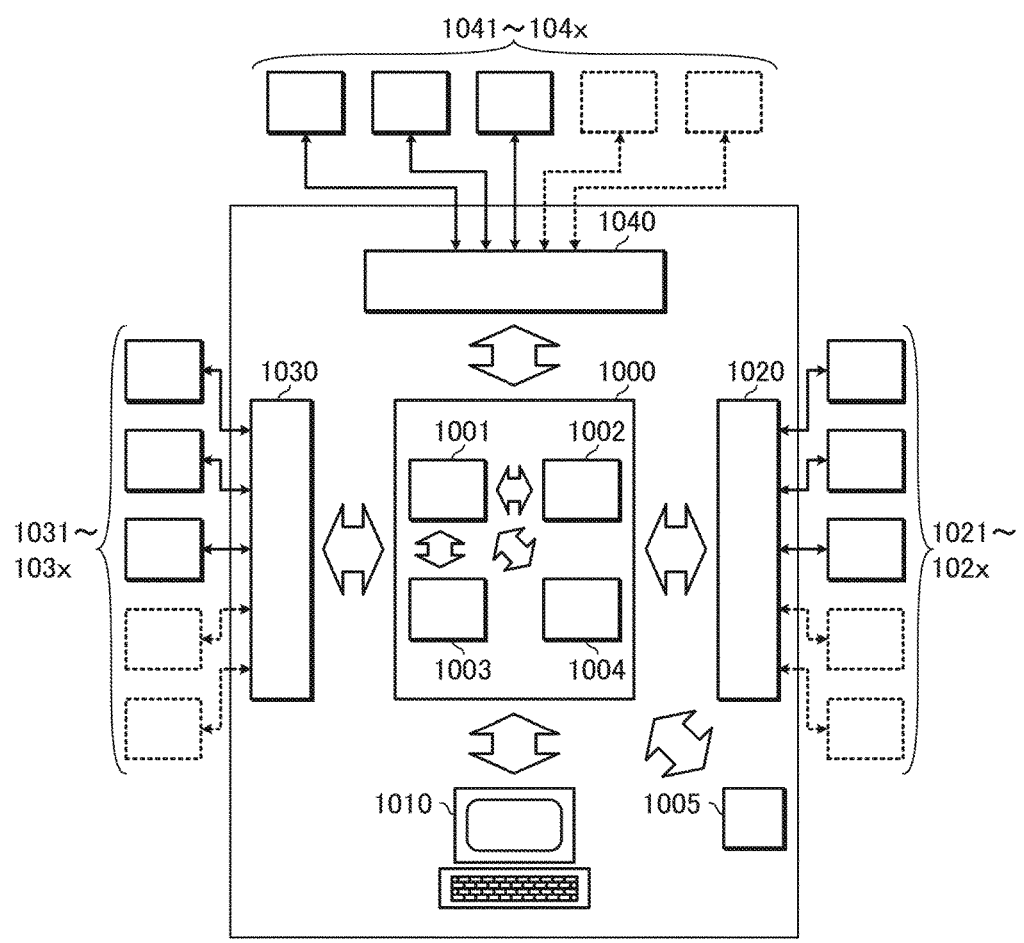
FIG. 43 is a block diagram schematically illustrating a configuration of the controller.

FIG. 43 is a block diagram schematically illustrating a configuration of the controller.

A controller, such as the laser system controller 20 or the beam delivery device controller 59, in the above-mentioned embodiments may be constituted by a general-purpose control device, such as a computer or a programmable controller. For example, the controller may be constituted as described below.
(Configuration)

The controller may include a processor 1000 and other elements connected to the processor 1000. Such elements may include a storage memory 1005, a user interface 1010, a parallel input/output (I/O) controller 1020, a serial I/O controller 1030, and an analog-to-digital (A/D)) and digital-to-analog (D/A) converter 1040. The processor 1000 may include a central processing unit (CPU) 1001 and other elements connected to the CPU 1001 including a memory 1002, a timer 1003, and a graphics processing unit (GPU) 1004.
(Operation)

The processor 1000 may read out programs stored in the storage memory 1005. The processor 1000 may execute the read-out programs, read out data from the storage memory 1005 in accordance with the execution of the programs, or store data in the storage memory 1005.

The parallel I/O controller 1020 may be connected to devices 1021 to 102x communicable through parallel I/O ports. The parallel I/O controller 1020 may control communication using digital signals through the parallel I/O ports that is performed in the process where the processor 1000 executes programs.

The serial I/O controller 1030 may be connected to devices 1031 to 103x communicable through serial I/O ports. The serial I/O controller 1030 may control communication using digital signals through the serial I/O ports that is performed in the process where the processor 1000 executes programs.

The A/D and D/A converter 1040 may be connected to devices 1041 to 104x communicable through analog ports. The A/D and D/A converter 1040 may control communication using analog signals through the analog ports that is performed in the process where the processor 1000 executes programs.

The user interface 1010 may be configured to display progress of executing programs by the processor 1000 to an operator or to receive instructions by the operator to the processor 1000 to stop execution of the programs or to execute interruption processing.

The CPU 1001 of the processor 1000 may perform arithmetic processing of programs. In the process where the CPU 1001 executes programs, the memory 1002 may temporally store programs or temporally store data in the arithmetic process. The timer 1003 may measure time or elapsed time. The timer 1003 may output the time or the elapsed time to the CPU 1001 in accordance with the execution of the programs. When image data is inputted to the processor 1000, the GPU 1004 may process the image data in accordance with the execution of the programs and output the results to the CPU 1001.

The devices 1021 to 102x communicable through the parallel I/O ports, which are connected to the parallel I/O controller 1020, may be the first to eighth laser apparatuses 2a to 2h, the exposure apparatus controller 40, another controller, or the like, and may be used for sending or receiving the oscillation trigger signal or the signal indicating the timing.

The devices 1031 to 103x communicable through the serial I/O ports, which are connected to the serial I/O controller 1030, may be the first to eighth laser apparatuses 2a-2h, the exposure apparatus controller 40, another controller, or the like, and may be used for sending or receiving data.

The devices 1041 to 104x communicable through the analog ports, which are connected to the A/D and D/A converter 1040, may be various sensors, such as the beam parameter measuring device 6, the pulse energy measuring unit 17, or the like.

With the above-mentioned configuration, the controller may be capable of achieving the operation illustrated in each of the embodiments.

The aforementioned descriptions are intended to be taken only as examples, and are not to be seen as limiting in any way. Accordingly, it will be clear to those skilled in the art that variations on the embodiments of the present disclosure may be made without departing from the scope of the appended claims.

The terms used in the present specification and in the entirety of the scope of the appended claims are to be interpreted as not being limiting. For example, wording such as "includes" or "is included" should be interpreted as not being limited to the item that is described as being included. Furthermore, "has" should be interpreted as not being limited to the item that is described as being had. Furthermore, the modifier "a" or "an" as used in the present specification and the scope of the appended claims should be interpreted as meaning "at least one" or "one or more".

The invention claimed is:

1. A laser system comprising:
a plurality of laser apparatuses;
a beam delivery device configured to bundle pulse laser beams emitted from respective laser apparatuses of the plurality of laser apparatuses to emit a bundled laser beam; and
a controller configured to control operated laser apparatuses of the plurality of laser apparatuses such that, at a change in a number representing how many laser apparatuses are operated, a beam parameter of the bundled laser beam emitted from the beam delivery device approaches a beam parameter of the bundled laser beam emitted before the change.

2. The laser system according to claim 1, wherein the controller is configured to control the operated laser apparatuses of the plurality of laser apparatuses such that, at a decrease in the number representing how many laser apparatuses are operated, the beam parameter of the bundled laser beam emitted from the beam delivery device approaches the beam parameter of the bundled laser beam emitted before the decrease by increasing energy of the pulse laser beam emitted from each of the operated laser apparatuses, the beam parameter of the bundled laser beam including energy of the bundled laser beam.

3. The laser system according to claim 1, wherein the controller is configured to control the operated laser apparatuses of the plurality of laser apparatuses such that, at a decrease in the number representing how many laser apparatuses are operated, the beam parameter of the bundled laser beam emitted from the beam delivery device approaches the beam parameter of the bundled laser beam emitted before the decrease by increasing a time interval between the pulse laser beams emitted from the respective operated laser apparatuses, the beam parameter of the bundled laser beam including pulse width of the bundled laser beam.

4. The laser system according to claim 1, wherein the controller is configured to control the operated laser apparatuses of the plurality of laser apparatuses such that, at a decrease in the number representing how many laser apparatuses are operated, the beam parameter of the bundled laser beam emitted from the beam delivery device approaches the beam parameter of the bundled laser beam emitted before the decrease by increasing energy of the pulse laser beam emitted from each of the operated laser apparatuses and increasing a time interval between the pulse laser beams emitted from the respective operated laser apparatuses, the beam parameter of the bundled laser beam including energy of the bundled laser beam and pulse width of the bundled laser beam.

5. The laser system according to claim 4, wherein:
the plurality of laser apparatuses includes first, second, and third laser apparatuses configured to emit first, second, and third pulse laser beams, respectively;
the beam delivery device is configured to bundle the first, second, and third pulse laser beams, to emit the bundled laser beam in which an optical path of the second pulse laser beam is between an optical path of the first pulse laser beam and an optical path of the third pulse laser beam; and
the controller is further configured to control the beam delivery device such that, to suspend operation of the second laser apparatus, at least one of the optical path of the first pulse laser beam emitted from the beam delivery device and the optical path of the third pulse laser beam emitted from the beam delivery device approaches the other one.

6. The laser system according to claim 5, further comprising:
a first mirror configured to reflect the first pulse laser beam emitted in a first direction from the first laser apparatus to a third direction;
a second mirror configured to reflect the second pulse laser beam emitted in a second direction from the second laser apparatus to a direction substantially parallel to the third direction; and
a third mirror configured to reflect the third pulse laser beam emitted in a direction substantially parallel to the second direction from the third laser apparatus to a direction substantially parallel to the third direction, wherein
the controller is configured to control the beam delivery device such that, to suspend operation of the second laser apparatus, the optical path of the third pulse laser beam emitted from the beam delivery device approaches the optical path of the first pulse laser beam emitted from the beam delivery device by moving the third mirror in a direction substantially parallel to the second direction.

7. The laser system according to claim 6, wherein:
the second mirror is provided in vicinity of the optical path of the first pulse laser beam reflected by the first mirror, and
the controller controls the beam delivery device such that, to suspend operation of the second laser apparatus, the second mirror moves away from the optical path of the first pulse laser beam reflected by the first mirror.

8. The laser system according to claim 4, wherein:
the plurality of laser apparatuses includes first and second laser apparatuses configured to emit first and second pulse laser beams in a first and second directions, respectively;
the beam delivery device includes first and second mirrors, the first mirror being configured to reflect the first pulse laser beam to a third direction, the second mirror being provided in vicinity of an optical path of the first pulse laser beam reflected by the first mirror, the second mirror being configured to reflect the second pulse laser beam to a direction substantially parallel to the third direction, the first and second mirrors thus being configured to bundle the first and second pulse laser beams to emit the bundled laser beam; and
the controller is further configured to control the beam delivery device such that, to suspend operation of the second laser apparatus, the second mirror moves away from the optical path of the first pulse laser beam reflected by the first mirror.

9. The laser system according to claim 1, wherein the controller is configured to control the operated laser apparatuses of the plurality of laser apparatuses such that:
when how many laser apparatuses are operated is represented by a first value, energy of the pulse laser beam emitted from each of the operated laser apparatuses has a third value; and
at a change in the number representing how many laser apparatuses are operated from the first value to a second value smaller than the first value, the beam parameter of the bundled laser beam emitted from the beam delivery device approaches the beam parameter of the bundled laser beam emitted before the change by increasing the energy of the pulse laser beam emitted from each of the operated laser apparatuses from the third value to a fourth value higher than the third value, the beam parameter of the bundled laser beam including energy of the bundled laser beam.

10. The laser system according to claim 1, wherein the controller is configured to control the operated laser apparatuses of the plurality of laser apparatuses such that:
when how many laser apparatuses are operated is represented by a first value, a time interval between the pulse laser beams emitted from the respective operated laser apparatuses has a fifth value, and
at a change in the number representing how many laser apparatuses are operated from the first value to a second value smaller than the first value, the beam parameter of the bundled laser beam emitted from the beam delivery device approaches the beam parameter of the bundled laser beam emitted before the change by increasing the a time interval between the pulse laser beams emitted from the respective operated laser apparatuses from the fifth value to a sixth value larger than the fifth value, the beam parameter of the bundled laser beam including pulse width of the bundled laser beam.

11. The laser system according to claim 1, wherein the controller is configured to control the operated laser apparatuses of the plurality of laser apparatuses such that:
when how many laser apparatuses are operated is represented by a first value, energy of the pulse laser beam emitted from each of the operated laser apparatuses has a third value and a time interval between the pulse laser beams emitted from the respective operated laser apparatuses has a fifth value, and
at a change in the number representing how many laser apparatuses are operated from the first value to a second value smaller than the first value, the beam parameter of the bundled laser beam emitted from the beam delivery device approaches the beam parameter of the bundled laser beam emitted before the change by increasing the energy of the pulse laser beam emitted from each of the operated laser apparatuses from the third value to a fourth value higher than the third value and increasing the time interval between the pulse laser beams emitted from the respective operated laser apparatuses from the fifth value to a sixth value larger than the fifth value, the beam parameter of the bundled laser beam including energy of the bundled laser beam and pulse width of the bundled laser beam.

12. The laser system according to claim 11, wherein:
the plurality of laser apparatuses includes first, second, and third laser apparatuses configured to emit first, second, and third pulse laser beams, respectively;
the beam delivery device is configured to bundle the first, second, and third pulse laser beams, to emit the bundled laser beam in which an optical path of the second pulse laser beam is between an optical path of the first pulse laser beam and an optical path of the third pulse laser beam; and
the controller is further configured to control the beam delivery device such that, to suspend operation of the second laser apparatus, at least one of the optical path of the first pulse laser beam emitted from the beam delivery device and the optical path of the third pulse laser beam emitted from the beam delivery device approaches the other one.

13. The laser system according to claim 12, further comprising:

a first mirror configured to reflect the first pulse laser beam emitted in a first direction from the first laser apparatus to a third direction;
a second mirror configured to reflect the second pulse laser beam emitted in a second direction from the second laser apparatus to a direction substantially parallel to the third direction; and
a third mirror configured to reflect the third pulse laser beam emitted in a direction substantially parallel to the second direction from the third laser apparatus to a direction substantially parallel to the third direction, wherein
the controller is configured to control the beam delivery device such that, to suspend operation of the second laser apparatus, the optical path of the third pulse laser beam emitted from the beam delivery device approaches the optical path of the first pulse laser beam emitted from the beam delivery device by moving the third mirror in a direction substantially parallel to the second direction.

14. The laser system according to claim 13, wherein:
the second mirror is provided in vicinity of the optical path of the first pulse laser beam reflected by the first mirror, and
the controller controls the beam delivery device such that, to suspend operation of the second laser apparatus, the second mirror moves away from the optical path of the first pulse laser beam reflected by the first mirror.

15. The laser system according to claim 11, wherein:
the plurality of laser apparatuses includes first and second laser apparatuses configured to emit first and second pulse laser beams in a first and second directions, respectively;
the beam delivery device includes first and second mirrors, the first mirror being configured to reflect the first pulse laser beam to a third direction, the second mirror being provided in vicinity of an optical path of the first pulse laser beam reflected by the first mirror, the second mirror being configured to reflect the second pulse laser beam to a direction substantially parallel to the third direction, the first and second mirrors thus being configured to bundle the first and second pulse laser beams to emit the bundled laser beam; and
the controller is further configured to control the beam delivery device such that, to suspend operation of the second laser apparatus, the second mirror moves away from the optical path of the first pulse laser beam reflected by the first mirror.

16. The laser system according to claim 1, wherein:
the plurality of laser apparatuses includes first, second, and third laser apparatuses configured to emit first, second, and third pulse laser beams, respectively;
the beam delivery device is configured to bundle the first, second, and third pulse laser beams, to emit the bundled laser beam in which an optical path of the second pulse laser beam is between an optical path of the first pulse laser beam and an optical path of the third pulse laser beam; and
the controller is further configured to control the beam delivery device such that, to suspend operation of the second laser apparatus, at least one of the optical path of the first pulse laser beam emitted from the beam delivery device and the optical path of the third pulse laser beam emitted from the beam delivery device approaches the other one.

17. The laser system according to claim 16, further comprising:

a first mirror configured to reflect the first pulse laser beam emitted in a first direction from the first laser apparatus to a third direction;

a second mirror configured to reflect the second pulse laser beam emitted in a second direction from the second laser apparatus to a direction substantially parallel to the third direction; and a third mirror configured to reflect the third pulse laser beam emitted in a direction substantially parallel to the second direction from the third laser apparatus to a direction substantially parallel to the third direction, wherein the controller is configured to control the beam delivery device such that, to suspend operation of the second laser apparatus, the optical path of the third pulse laser beam emitted from the beam delivery device approaches the optical path of the first pulse laser beam emitted from the beam delivery device by moving the third mirror in a direction substantially parallel to the second direction.

18. The laser system according to claim 17, wherein:
the second mirror is provided in vicinity of the optical path of the first pulse laser beam reflected by the first mirror, and
the controller controls the beam delivery device such that, to suspend operation of the second laser apparatus, the second mirror moves away from the optical path of the first pulse laser beam reflected by the first mirror.

19. The laser system according to claim 18, wherein:
the controller controls the beam delivery device such that the second mirror moves in a direction substantially parallel to the second direction away from the optical path of the first pulse laser beam reflected by the first mirror.

20. The laser system according to claim 1, wherein:
the plurality of laser apparatuses includes first and second laser apparatuses configured to emit first and second pulse laser beams in a first and second directions, respectively;

the beam delivery device includes first and second mirrors, the first mirror being configured to reflect the first pulse laser beam to a third direction, the second mirror being provided in vicinity of an optical path of the first pulse laser beam reflected by the first mirror, the second mirror being configured to reflect the second pulse laser beam to a direction substantially parallel to the third direction, the first and second mirrors thus being configured to bundle the first and second pulse laser beams to emit the bundled laser beam; and the controller is further configured to control the beam delivery device such that, to suspend operation of the second laser apparatus, the second mirror moves away from the optical path of the first pulse laser beam reflected by the first mirror.

21. A laser system comprising:

a plurality of laser apparatuses;

a beam delivery device configured to bundle pulse laser beams emitted from respective laser apparatuses of the plurality of laser apparatuses to emit a bundled laser beam; and a controller configured to, at a change in a number representing how many laser apparatuses are operated, control operated laser apparatuses of the plurality of laser apparatuses such that a value of a first beam parameter of the bundled laser beam emitted from the beam delivery device approaches a value of the first beam parameter of the bundled laser beam emitted before the change, and control the beam delivery device such that a value of a second beam parameter of the bundled laser beam emitted from the beam delivery device approaches a value of the second beam parameter of the bundled laser beam emitted before the change.

\* \* \* \* \*